United States Patent
Prosak et al.

(10) Patent No.: US 10,020,151 B2
(45) Date of Patent: *Jul. 10, 2018

(54) SAFETY RELAY CONFIGURATION SYSTEM WITH MULTIPLE TEST PULSE SCHEMES USING GRAPHICAL INTERFACE

(71) Applicant: Rockwell Automation Technologies, Inc., Mayfield Heights, OH (US)

(72) Inventors: Bradley A. Prosak, Bedford, MA (US); Thomas Helpenstein, Grevenbroich (DE); Rudolf Papenbreer, Wuppertal (DE); Dirk Lorenz, Wetter (DE); Oliver Heckel, Frechen (DE)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 590 days.

This patent is subject to a terminal disclaimer.

(21) Appl. No.: 14/563,497

(22) Filed: Dec. 8, 2014

(65) Prior Publication Data

US 2015/0187524 A1  Jul. 2, 2015

Related U.S. Application Data

(60) Provisional application No. 61/922,513, filed on Dec. 31, 2013.

(51) Int. Cl.
*H01H 50/00* (2006.01)
*G01R 31/327* (2006.01)
(Continued)

(52) U.S. Cl.
CPC ......... *H01H 50/00* (2013.01); *G01R 31/3278* (2013.01); *G05B 19/0426* (2013.01);
(Continued)

(58) Field of Classification Search
None
See application file for complete search history.

(56) References Cited

U.S. PATENT DOCUMENTS 3,120,661 A   2/1964   White et al.
6,167,319 A   12/2000  Harris
(Continued)

FOREIGN PATENT DOCUMENTS

CN   1322975      11/2001
CN   101482736    7/2009
(Continued)

OTHER PUBLICATIONS

'LabVIEW', Wikipedia (2017), https://en.wikipedia.org/w/index.php?title=LabVIEW&oldid=806681525.*

(Continued)

*Primary Examiner* — Mohammad Ali
*Assistant Examiner* — Bernard G Lindsay
(74) *Attorney, Agent, or Firm* — Amin, Turocy & Watson, LLP

(57) ABSTRACT

A safety relay configuration system for configuring safety functions to be carried out by a safety relay is provided. The configuration system comprises a number of features that facilitate intuitive and simplified configuration of an industrial safety relay, including but not limited to features that guide the user through the configuration process using an intuitive sequential procedure that provides feedback and prompts based on user interaction, enforce design consistency throughout the configuration project by intelligently limiting user selections, and visually organize configuration and status information in a manner that efficiently utilizes display space and allows the user to quickly evaluate available configuration options.

20 Claims, 60 Drawing Sheets

(51) Int. Cl.
*G05B 19/042* (2006.01)
*G05B 19/05* (2006.01)

(52) U.S. Cl.
CPC .. *G05B 19/056* (2013.01); *G05B 2219/13144* (2013.01); *G05B 2219/23278* (2013.01); *G05B 2219/24038* (2013.01); *G05B 2219/25067* (2013.01)

(56) References Cited

U.S. PATENT DOCUMENTS

| | | |
|---|---|---|
| 7,246,193 B2 | 7/2007 | Rotvold et al. |
| 8,254,599 B2 | 8/2012 | Hamada et al. |
| 8,887,000 B2 | 11/2014 | Teranishi et al. |
| 2003/0061335 A1 | 3/2003 | Thomas et al. |
| 2003/0182037 A1 | 9/2003 | Iwazaki |
| 2003/0182083 A1 | 9/2003 | Schwenke et al. |
| 2004/0199364 A1 | 10/2004 | Law et al. |
| 2004/0218317 A1 | 11/2004 | Kawazu et al. |
| 2005/0063114 A1 | 3/2005 | Suhara |
| 2006/0087773 A1 | 4/2006 | Papenbreer et al. |
| 2006/0158044 A1 | 7/2006 | Koehler et al. |
| 2007/0078658 A1 | 4/2007 | Virji et al. |
| 2007/0100471 A1 | 5/2007 | Kumar et al. |
| 2009/0024230 A1 | 1/2009 | Hioka et al. |
| 2009/0030534 A1 | 1/2009 | Dold et al. |
| 2009/0089701 A1 | 4/2009 | Baier |
| 2009/0144251 A1 | 6/2009 | Dettinger et al. |
| 2009/0222611 A1 | 9/2009 | Becker et al. |
| 2010/0050128 A1 | 2/2010 | Chiang et al. |
| 2010/0205418 A1 | 8/2010 | Kishan |
| 2010/0286936 A1 | 11/2010 | Hauser |
| 2011/0071651 A1 | 3/2011 | Law et al. |
| 2011/0098830 A1* | 4/2011 | Weddingfeld ........... G05B 9/02 700/79 |
| 2011/0230983 A1 | 9/2011 | Koepcke et al. |
| 2012/0030603 A1 | 2/2012 | Bauer et al. |
| 2012/0096438 A1 | 4/2012 | Rossi et al. |
| 2012/0265322 A1 | 10/2012 | Hildebran et al. |
| 2012/0324295 A1 | 12/2012 | Horn et al. |
| 2013/0332864 A1* | 12/2013 | Correll ...................... G06F 8/34 715/763 |
| 2014/0101486 A1* | 4/2014 | Henneberger .... H04L 12/40195 714/33 |
| 2015/0185708 A1 | 7/2015 | Prosak et al. |
| 2015/0185710 A1* | 7/2015 | Prosak .................... G05B 9/02 700/79 |

FOREIGN PATENT DOCUMENTS

| | | |
|---|---|---|
| CN | 101509948 | 8/2009 |
| CN | 101802826 | 8/2010 |
| CN | 102411331 | 4/2012 |
| CN | 102567180 | 7/2012 |
| CN | 103065870 | 4/2013 |
| CN | 103257609 | 8/2013 |
| DE | 102008035176 | 2/2010 |
| EP | 1717653 | 2/2006 |
| EP | 2357542 | 8/2011 |

OTHER PUBLICATIONS

'Functional Testing System Based on LabVIEW for Gas-fueled Automobile Engine ECU' by Feng et al., 2011 3rd International Conference on Advanced Computer Control (ICACC 2011), pp. 357-361, IEEE.*
Office action for CN Application No. 201410853477.4, dated Mar. 2, 2017, 6 pages.
Office Action for CN Application Serial No. 201410855690.9, dated Mar. 3, 2017, 5 pages.
Extended European Search Report for EP Patent Application Serial No. 14200227.8, dated Sep. 17, 2015, 7 pages.
Extended European Search Report for EP Patent Application Serial No. 14200580.0, dated Sep. 17, 2015, 7 pages.
Extended European Search Report for EP Patent Application Serial No. 14200229.4, dated Sep. 17, 2015, 7 pages.
Extended European Search Report for EP Patent Application Serial No. 14200226.0, dated Sep. 17, 2015, 7 pages.
Office Action for U.S. Appl. No. 14/563,587, dated Oct. 23, 2015, 67 pages.
Office Action for CN Application No. 201410853996.0, dated Dec. 29, 2016, 15 pages.
Liu, Zhun-Xiong, "Realization of Power Graphics System Based on SVG." Relay, Nov. 1, 2005, pp. 69-73, 78, vol. 33, No. 21, China Academic Journal Electronic Publishing House, Nanchang, China.
Office Action for U.S. Appl. No. 14/564,377, dated Jan. 27, 2017, 42 pages.
Office Action for U.S. Appl. No. 14/584,509, dated Jun. 2, 2017, 58 pages.
Office Action for U.S. Appl. No. 14/564,377, dated Jun. 22, 2017, 77 pages.
Notice of Intent to Grant for Chinese Application Serial No. 201410855690.9 dated Nov. 1, 2017, 8 pages.
Office Action for Chinese Application Serial No. 201410853873.7 dated Aug. 28, 2017, 18 pages.
Office Action for Chinese Application Serial No. 201410853996.0 dated Nov. 28, 2017, 5 pages.
Office Action for U.S. Appl. No. 14/564,377 dated Jan. 23, 2018, 71 pages.
Final Office Action for U.S. Appl. No. 14/584,509, dated Nov. 13, 2017, 56 pages.
Notice of Allowance for U.S. Appl. No. 14/584,509 dated Mar. 16, 2018, 47 pages.

* cited by examiner

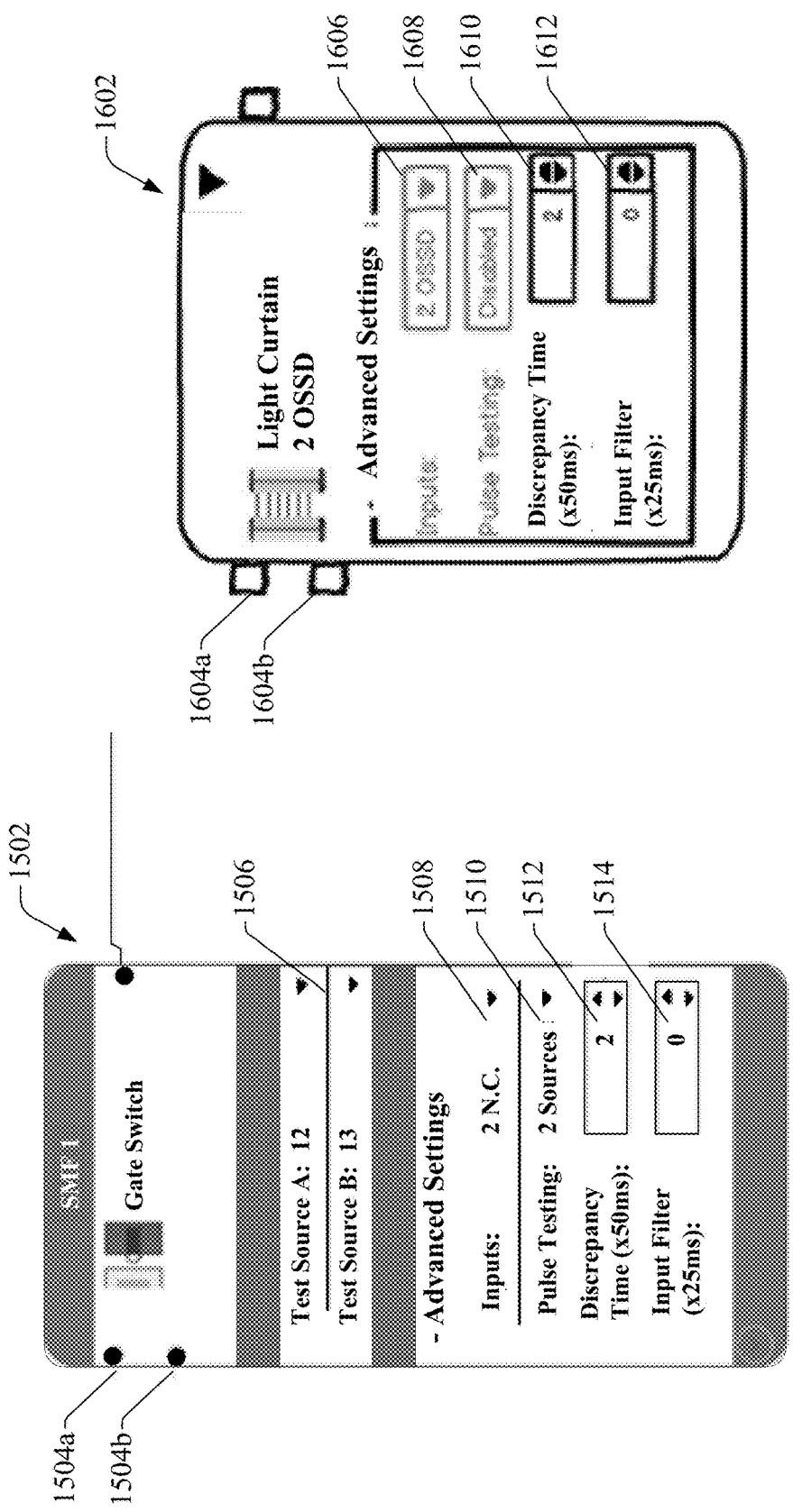

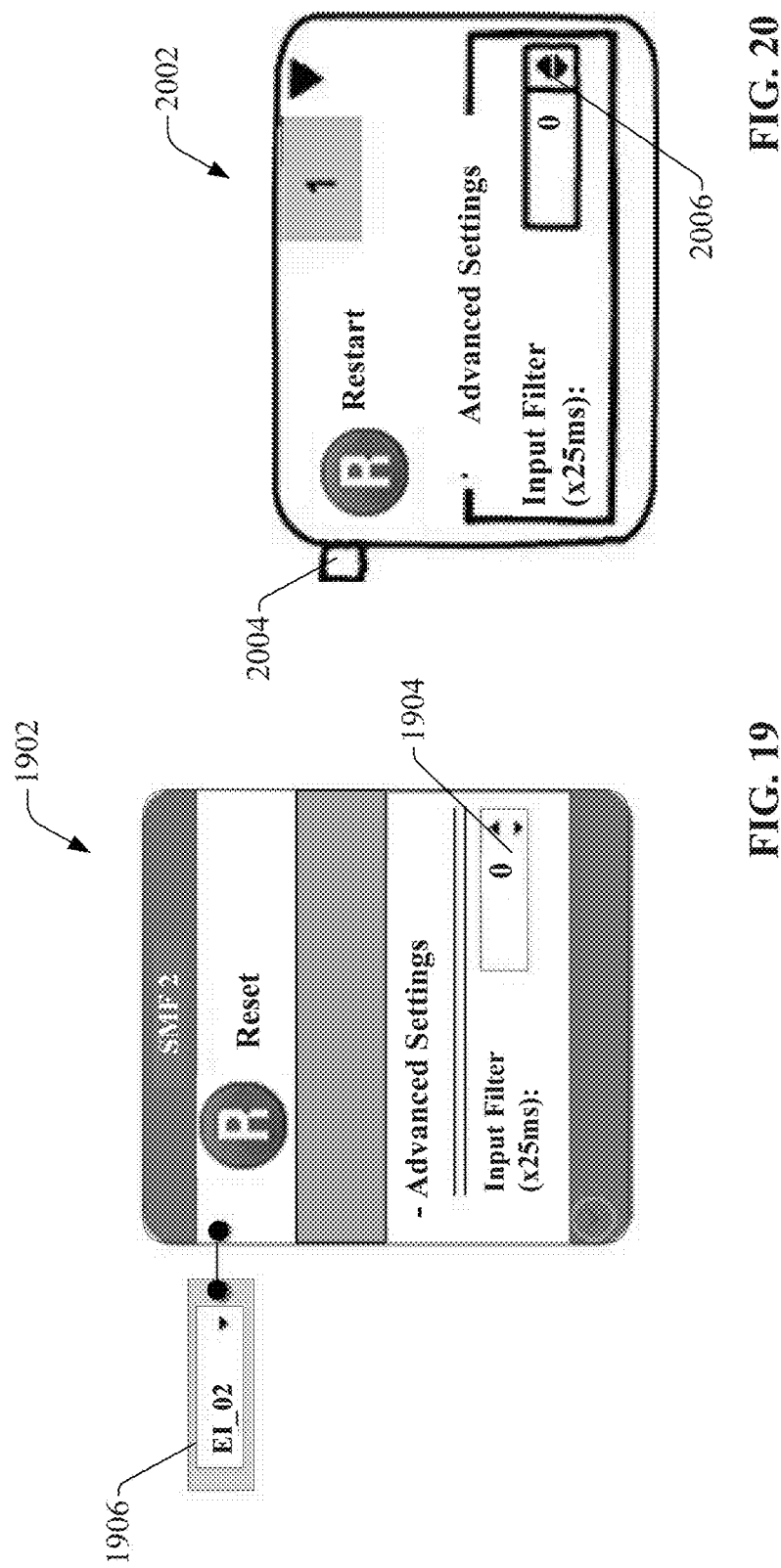

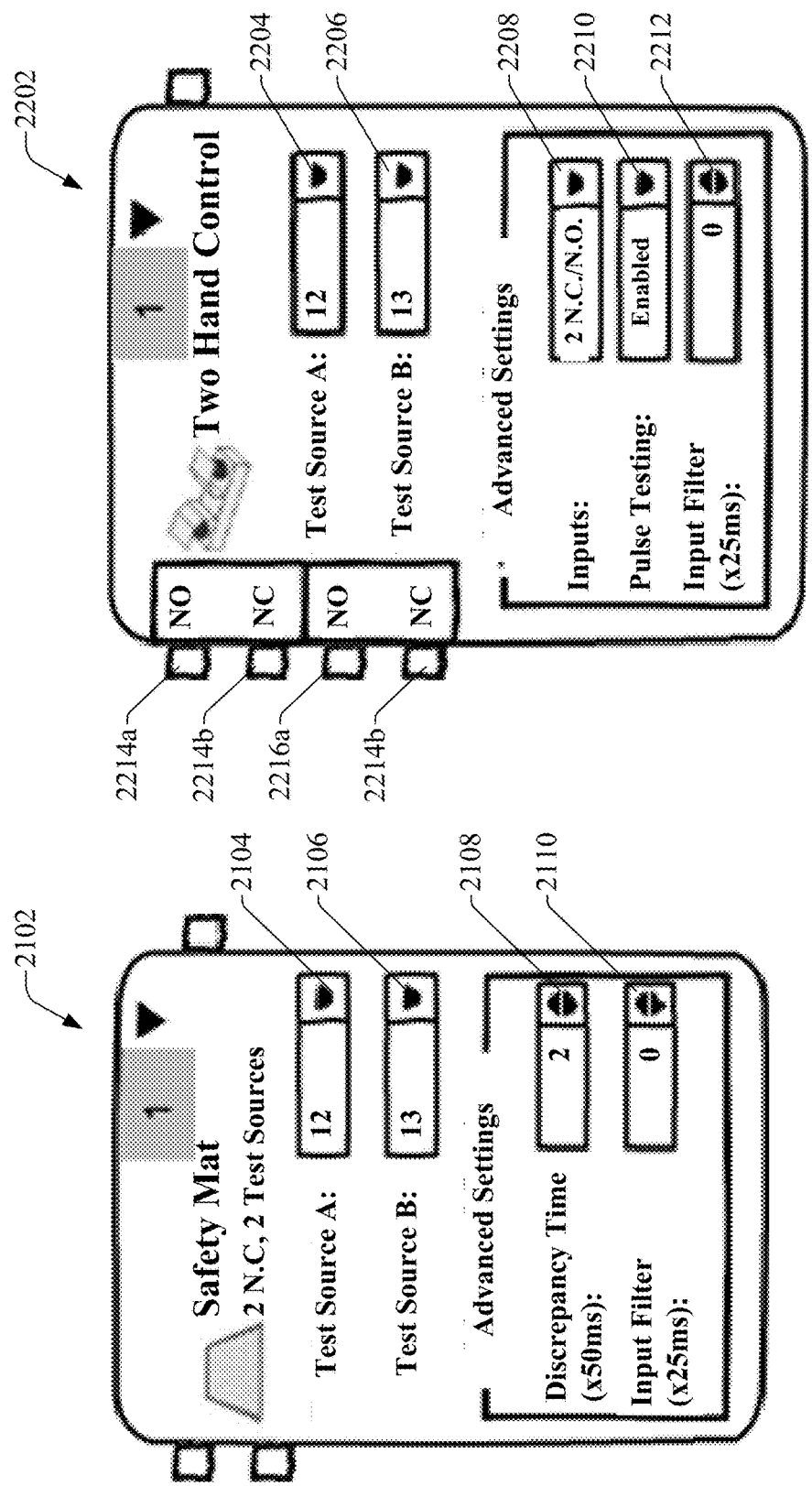

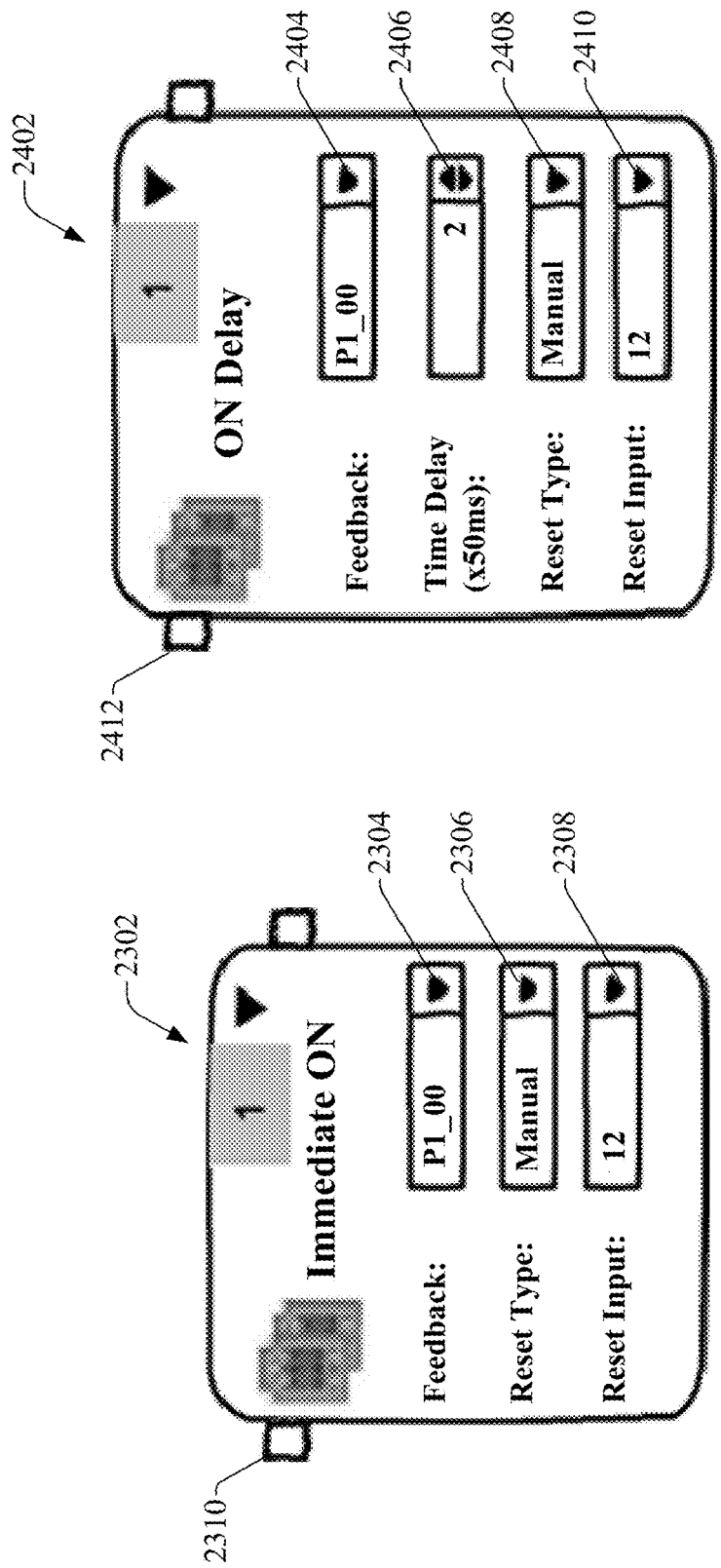

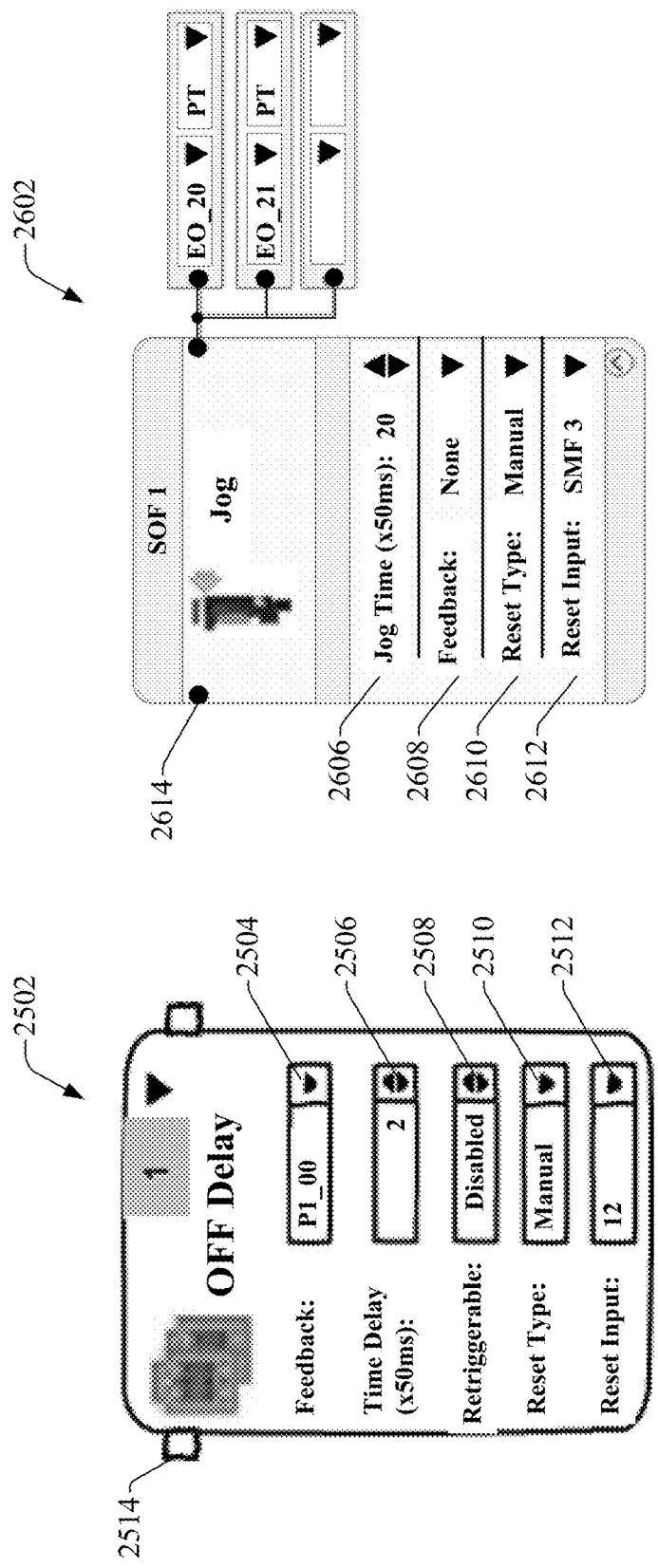

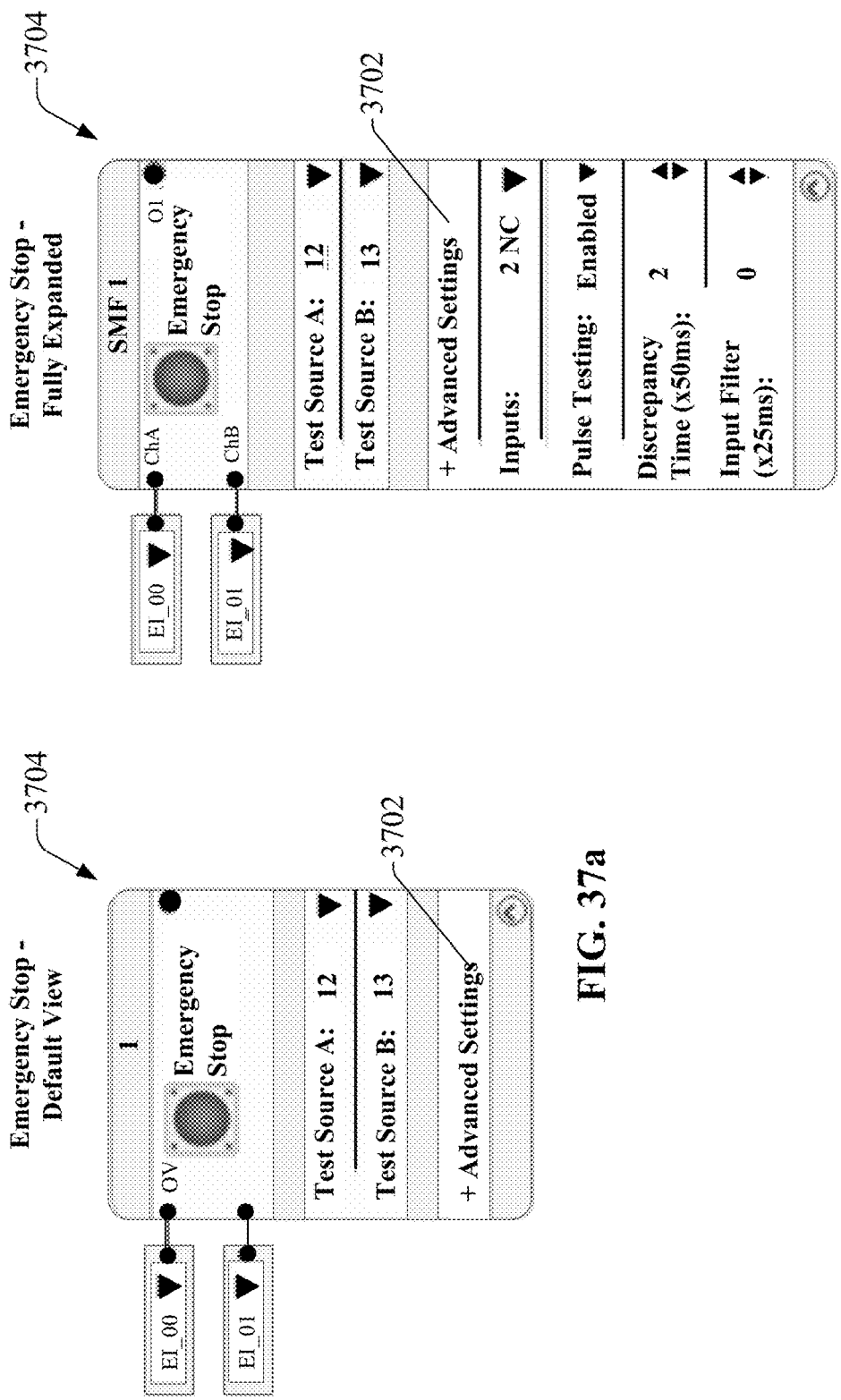

| Safety Relay - Modbus Mapping | | |
|---|---|---|
| Address | Addresses Used | Parameter |
| 000025 | 000025-000040 | Input/Output Data for Plug In 1 |
| 000265 | 000265-000272 | Overall Status |
| 000273 | 000273-000296 | Input/Output data for embedded terminals |
| 000297 | 000297-000304 | Input/Output data for Plug In 2 |
| 000305 | 000305-000328 | State of SMF |
| 000329 | 000329-000344 | State of LLA |
| 000345 | 000345-000360 | State of LLB |
| 000361 | 000361-000376 | State of SOF |
| 000377 | 000377-000392 | Ready-to-start of SOF |
| 000393 | 000393-000416 | Fault bit 0 of SMFs |

- Safety Relay
  - Serial Port
  - USB Port
  - LED Configuration
  - Faults
  - Modbus Mapping
- Plug-In Modules
  - Empty
  - Empty

FIG. 58

| Select | Symbol | Safety Function | Input Device | Logic Device | Output Device | Required Performance Level | Number of Operations Per Year |
|---|---|---|---|---|---|---|---|
| | SF-1 | Door Monitoring | 440K-C21070<br>440K-C21070 | 440R-S12R2 | 100S-C23J14C<br>100S-C23J14C | PLr - e | 8760 |
| | SF-2 | Emergency Stop | 800B-MT | 440R-S12R2 | 100S-C23J14C<br>100S-C23J14C | PLr - e | 8760 |

FIG. 61

SAFETY RELAY CONFIGURATION SYSTEM WITH MULTIPLE TEST PULSE SCHEMES USING GRAPHICAL INTERFACE

CROSS-REFERENCE TO RELATED APPLICATIONS

This application claims priority to U.S. Provisional Application Ser. No. 61/922,513, filed on Dec. 31, 2013, entitled "SAFETY RELAY CONFIGURATION SYSTEM," the entirety of which is incorporated herein by reference.

BACKGROUND

The subject matter disclosed herein relates generally to configuration systems and graphical interfaces for configuration and monitoring of an industrial safety relay

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for configuring an industrial safety relay is provided, comprising a configuration component configured to create a configuration program for a safety relay based on configuration input received via interaction with a safety monitoring function block element, wherein the safety monitoring function block element corresponds to a safety device to be monitored via an input terminal of the safety relay; and a graphical interface component configured to receive the configuration input and to display the safety monitoring function block element; wherein the safety monitoring function block element comprises a graphical parameter setting element that facilitates configuration of a parameter associated with the safety monitoring function block element.

Also, according to one or more embodiments, a non-transitory computer-readable medium is provided having stored thereon instructions that, in response to execution, cause a system to perform operations, the operations comprising displaying a safety monitoring function block element corresponding to a safety device to be monitored via an input terminal of a safety relay device; setting a parameter associated with the safety monitoring function block element based on interaction with a graphical parameter setting element of the safety monitoring function block element; and configuring a configuration program for the safety relay device based on the parameter.

Also, one or more embodiments provide a method for configuring an industrial safety relay, comprising rendering, by a system comprising at least one processor, a safety monitoring function block element corresponding to a safety device to be monitored via an input terminal of a safety relay device; configuring, by the system, a parameter associated with the safety monitoring function block element based on interaction with a graphical parameter setting element of the safety monitoring function block element; and generating, by the system, a configuration program for the safety relay device based on the parameter.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 15 illustrates an example Gate Switch function block.

FIG. 16 illustrates an example Light Curtain function block.

FIG. 19 illustrates an example Reset function block.

FIG. 20 illustrates an example Restart function block.

FIG. 21 illustrates an example Safety Mat function block.

FIG. 22 illustrates an example Two Hand Control function block.

FIG. 23 illustrates an example Immediate ON function block.

FIG. 24 illustrates an example ON Delay function block.

FIG. 25 illustrates an example OFF Delay function block.

FIG. 26 illustrates an example Jog function block.

FIG. 37a illustrates an example Emergency Stop function block in a default presentation.

FIG. 37b illustrates an example Emergency Stop function block with advanced settings exposed.

FIG. 58 illustrates pre-mapped registers of status information.

FIG. 61 illustrates a portion of example safety function documentation.

DETAILED DESCRIPTION

Figure 1:
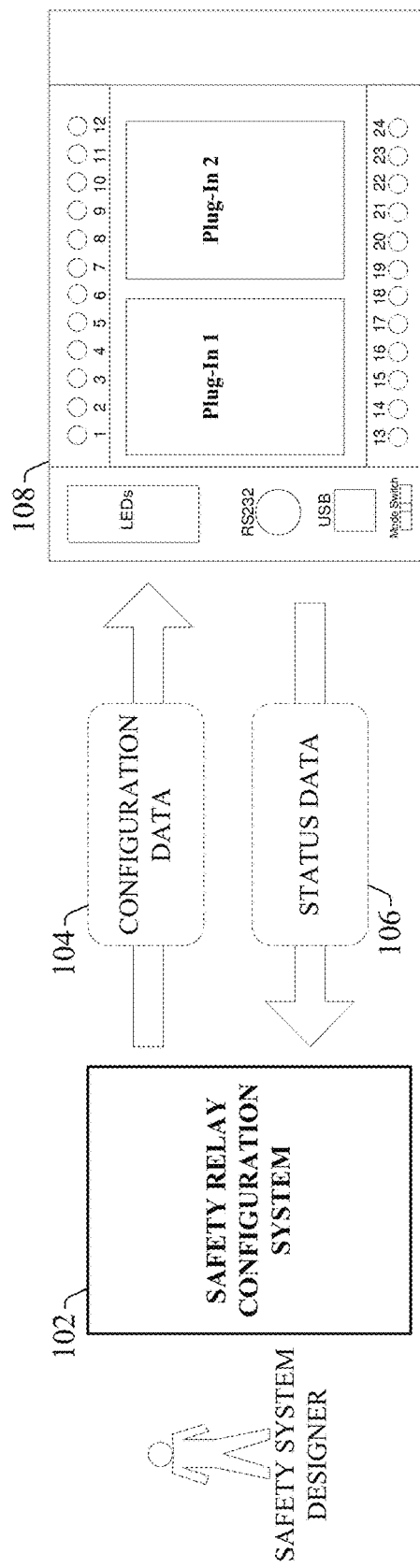
FIG. 1 is a general overview of the relationship between a safety relay configuration system and an industrial safety relay.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial system designers typically program the safety functions to be carried out by an industrial safety relay using a software development platform that is proprietary to the safety relay. The workflow for developing a safety relay program using these development platforms is often complicated, particularly as the number of safety relay terminals to be used for safety monitoring and output signaling grows larger. Moreover, the development interface layout of many safety relay programming platforms often yields a program visualization that is difficult to interpret and troubleshoot.

The safety relay configuration systems, software, and graphical interfaces described herein comprise a number of features that facilitate intuitive and simplified configuration of an industrial safety relay. These include features that guide the user through the configuration process using an intuitive sequential procedure that provides feedback and prompts based on user interaction, enforce design consistency throughout the configuration project by intelligently limiting user selections, visually organize configuration and status information in a manner that efficiently utilizes display space and allows the user to quickly evaluate available configuration options, and provides other benefits to be described in more detail herein.

FIG. 1 is a general overview of the relationship between the safety relay configuration system 102 and an industrial safety relay 108. Safety relay 108 can comprise any suitable industrial safety relay or similar device configured to monitor an industrial safety system and control the ability of an industrial system or machine to start or run based on the monitored statuses of one or more safety devices (e.g., emergency stop buttons, safety mats, light curtains, emergency pull cords, etc.). The safety relay can comprise a number of input terminals for monitoring the status of one or more safety devices, and output terminals that control certain machine states based on the statuses of the safety devices. In an example configuration, power to selected control components of the industrial system or machine can be connected to the machine via the safety relay outputs, and the safety relay 108 can be programmed to close the outputs only when the relevant safety devices are in their respective safe states. To ensure control reliability, the safety relay 108 typically includes a number of integrated self-monitoring features to reduce the possibility of a relay failure and to ensure that the industrial system remains safe in the event of such a relay failure. These integrated safety features can include, for example, redundant circuits, internal monitoring to detect short-circuits between contacts, and other such features.

Safety relay 108 is programmable, allowing the user to configure the function of each input and output terminal and to develop logic that controls the behavior of each relay output based on the states of the safety device inputs. Accordingly, safety relay configuration system 102 is designed to communicate with safety relay 108 and to execute a configuration application that allows the user to configure and program safety relay 108. Safety relay configuration system 102 can communicate with safety relay 108 using any suitable communication means, including communication via a local connection between the configuration system and the safety relay 108 (e.g., universal serial bus, RS232, etc.), or over a networked connection (e.g., Ethernet, Modbus, Common Industrial Protocol, Controlnet, Devicenet, etc.). In one or more embodiments, safety relay configuration system 102 can also communicate with safety relay 108 remotely via the Internet.

Once communication between the safety relay configuration system 102 and safety relay 108 is established, the configuration system can download configuration data 104 to the safety relay based on configuration and programming input provided to the configuration system by the user. For example, the user can develop safety relay logic within the development environment of the configuration application executed by the configuration system 102, and download the developed program to safety relay 108. Additionally, safety relay configuration system 102 can read and display status data 106 from the safety relay 108. The configuration system can render status data 106 on a graphical environment having a similar structure to the development environment used to create the safety relay logic, allowing the user to monitor the statuses of the input devices and relay outputs within the logic environment.

Figure 2:
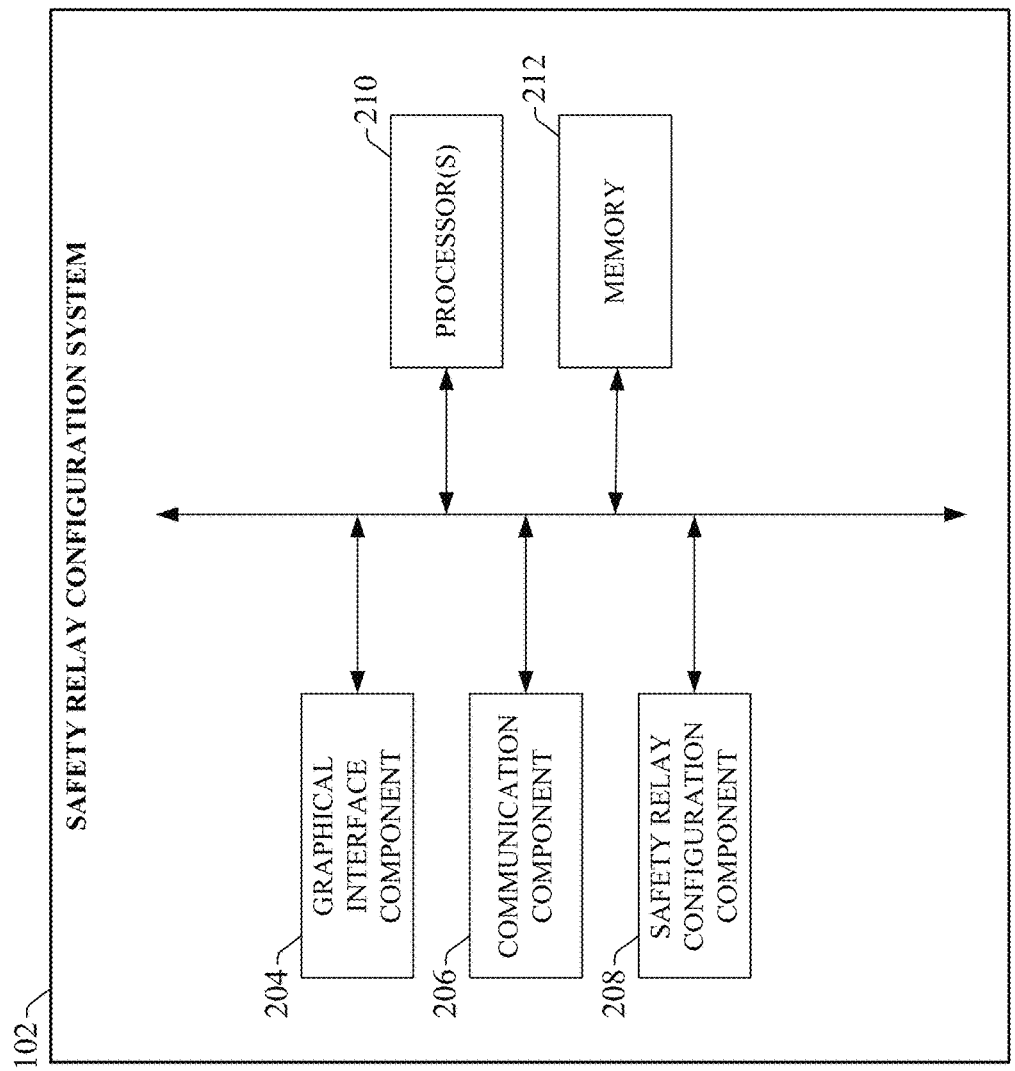
FIG. 2 is a block diagram of an example safety relay configuration system that can facilitate configuration, programming, and monitoring of an industrial safety relay.

FIG. 2 is a block diagram of an example safety relay configuration system that can facilitate configuration, programming, and monitoring of an industrial safety relay. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

One or more embodiments of safety relay configuration system 102 can include a graphical interface component 204, a communication component 206, a safety relay configuration component 208, one or more processors 210, and memory 212. In various embodiments, one or more of the components 204-208, the one or more processors 210, and memory 212 can be electrically and/or communicatively coupled to one another to perform one or more of the functions of the safety relay configuration system 102. In some embodiments, components 204-208 can comprise software instructions stored on memory 212 and executed by processor(s) 210. The safety relay configuration system 102 may also interact with other hardware and/or software components not depicted in FIG. 2. For example, processor(s) 210 may interact with one or more external user interface devices, such as a keyboard, a mouse, a display monitor, a touchscreen, or other such interface devices.

Graphical interface component 204 can be configured to receive user input and to render output to the user in any suitable format (e.g., visual, audio, tactile, etc.). User input can be, for example, safety relay terminal configuration input, safety device selection input, function block selection and configuration input, user responses to prompts provided by the graphical interface component 204, or other such data. Communication component 206 can be configured to communicatively interface with the safety relay and exchange data between the relay and the configuration system. Communication between the configuration system and the safety relay can be via a local communication link such as USB, RS232, or the like, or via a remote connection over a network or the Internet.

Safety relay configuration component 208 can be configured to execute a safety relay configuration application having features and graphical interface characteristics to be described in more detail herein. The one or more processors 210 can perform one or more of the functions described herein with reference to the systems and/or methods disclosed. Memory 212 can be a computer-readable storage medium storing computer-executable instructions and/or information for performing the functions described herein with reference to the systems and/or methods disclosed.

Figure 3:
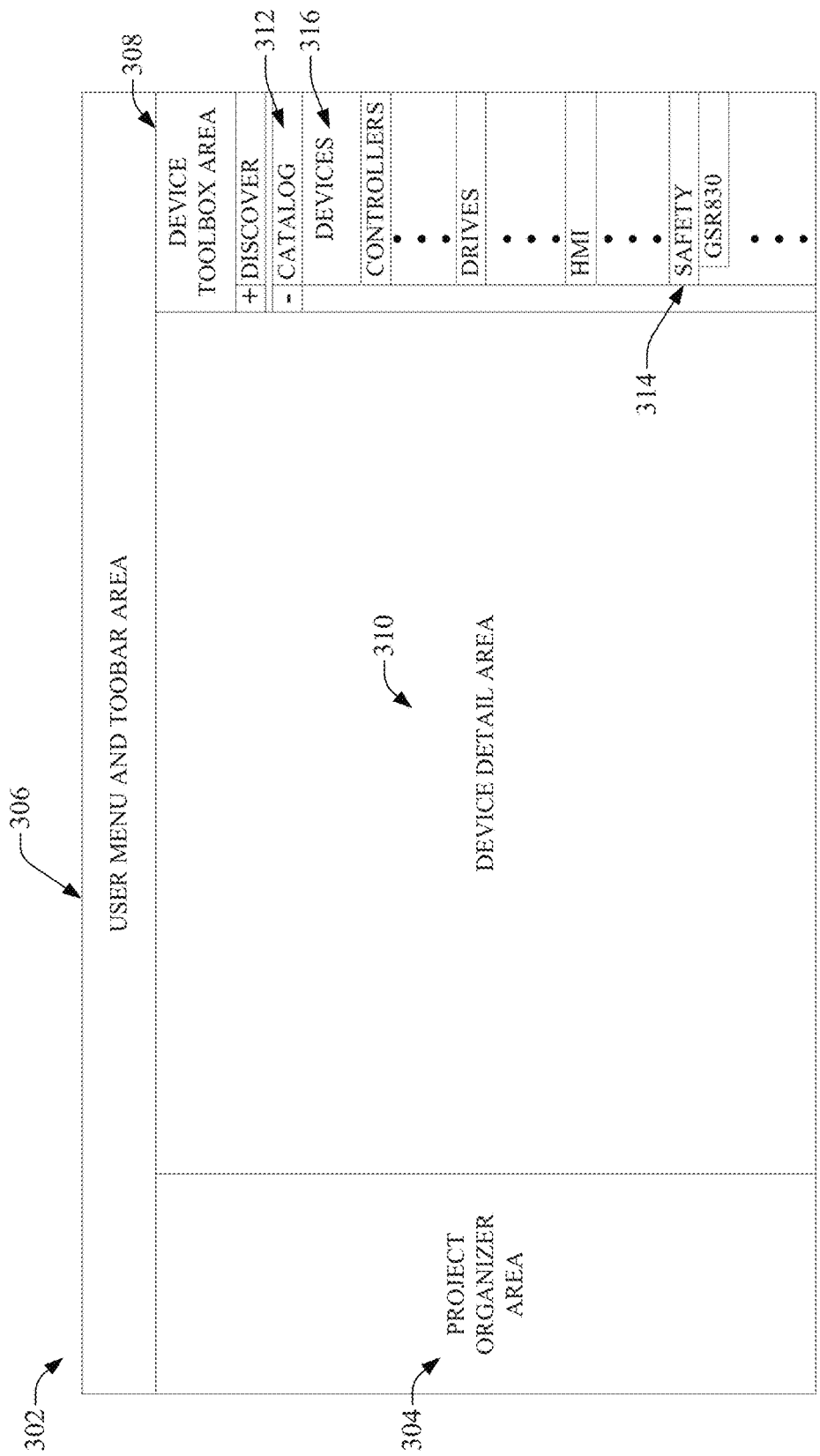
FIG. 3 illustrates an example screen layout for a device configuration screen of a safety relay configuration system.

FIG. 3 is an example, non-limiting screen layout 302 for a device configuration screen of the safety relay configuration system. The example layout 302 includes a device toolbox area 308, a user menu and toolbar area 306, a project organizer area 304, and a device details area 310.

Figure 4:
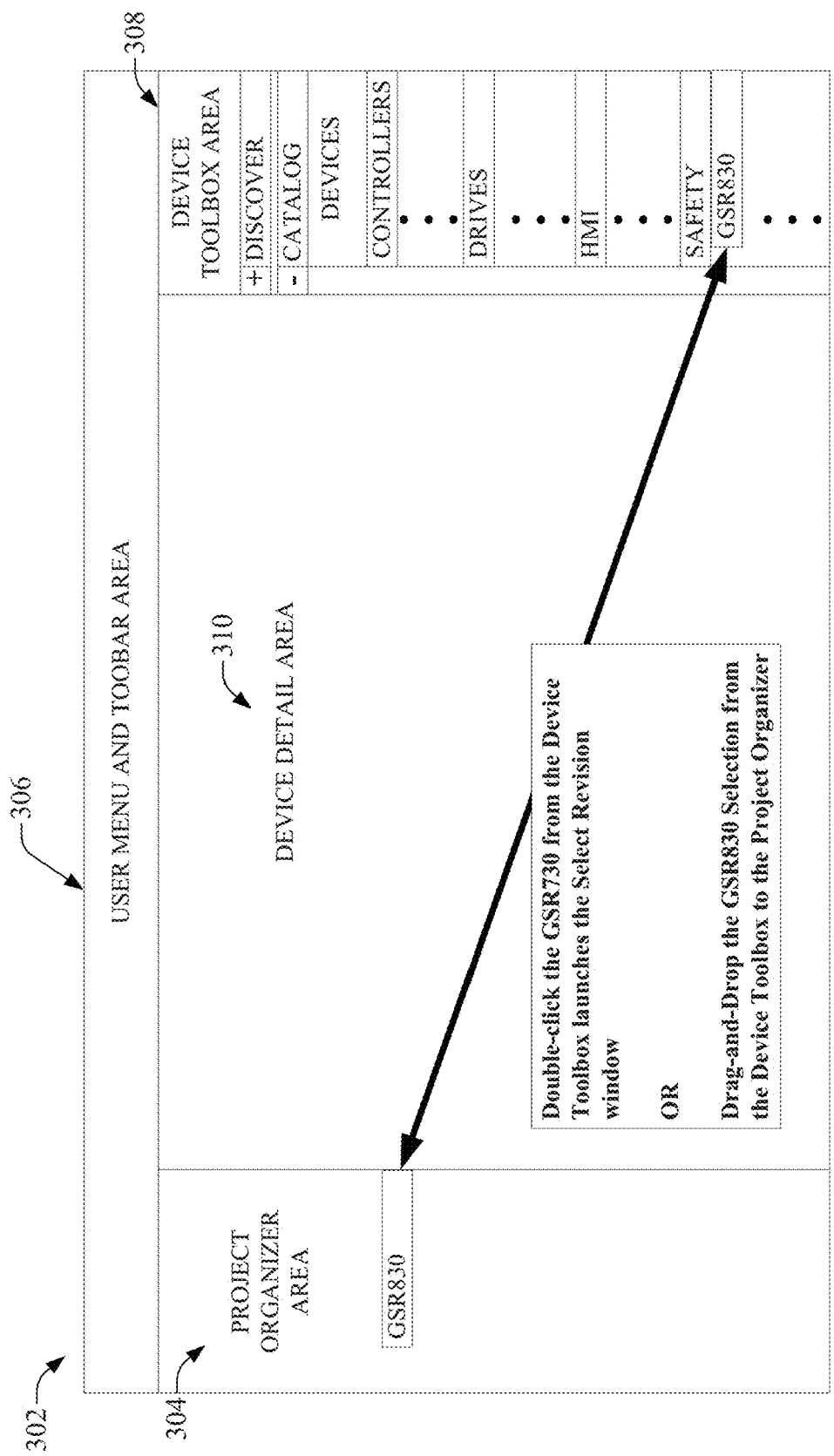
FIG. 4 illustrates selection of a device from a list of available devices for inclusion in a project organizer area of the safety relay configuration system.

The device toolbox area 308 can include a catalog drop-down window 312. When expanded, catalog drop-down window 312 can display a list of available devices 316 for selection by the user for inclusion in the current project. The list of available devices 316 can be organized according to device type, with each device type displayed as an expandable node. For example, selecting the "Safety" node 314 can reveal a list of available safety relays. In some embodiments, hovering a cursor over one of the devices in the list invokes a pop-up window containing additional information about the selected device. A device from the list of available devices 316 can be added to the project organizer area 304 by double-clicking on the selected device in the list, or by dragging the selected device to the project organizer area 304. In either case, selection of a device from the list of available devices 316 causes the selected device to appear in the project organizer area 304, as shown in FIG. 4. Adding a device to the project organizer area 304 makes that device available for creation of a new project.

Figure 5B:
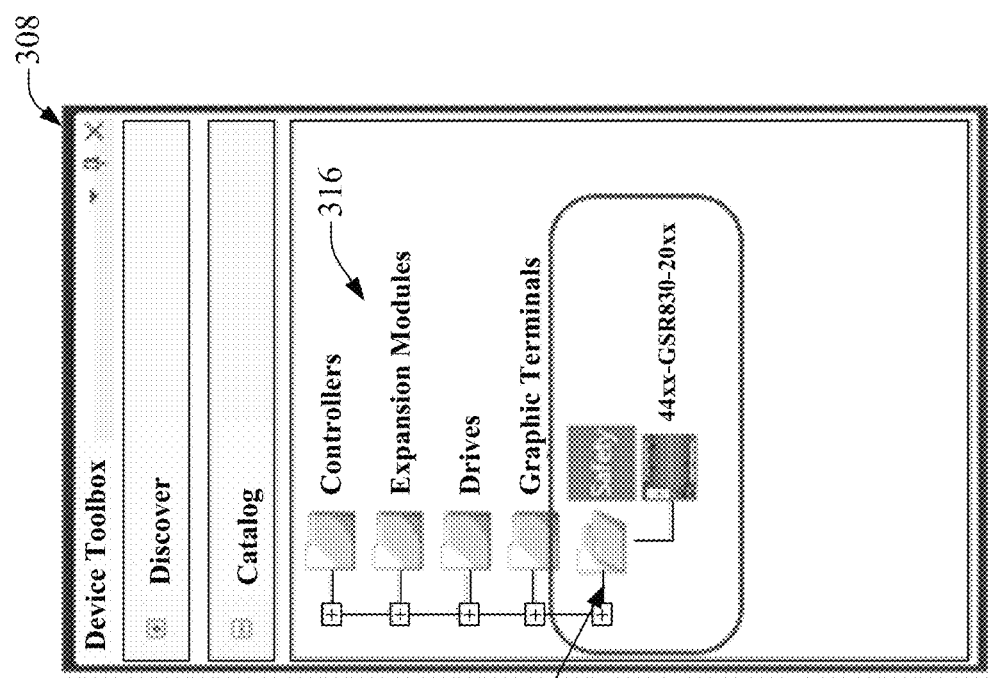
FIG. 5b illustrates the device toolbox area of the safety relay configuration system
Figure 5A:
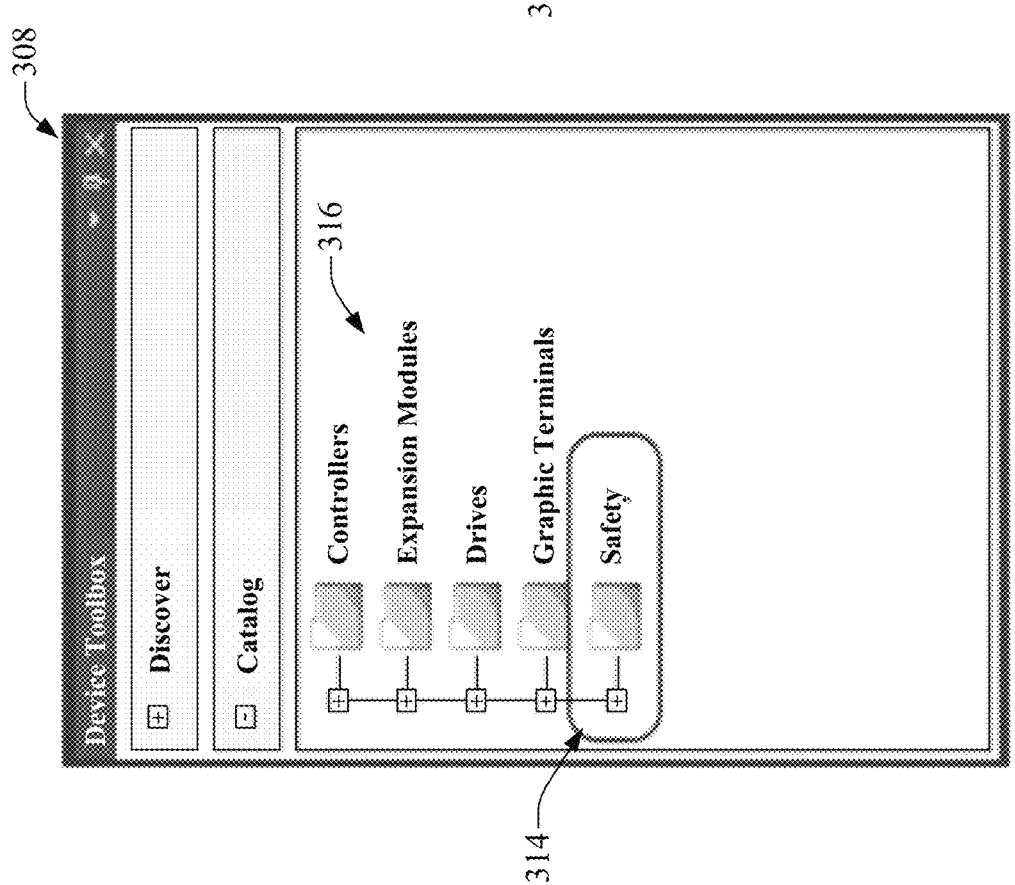
FIG. 5a illustrates the device toolbox area of the safety relay configuration system.

FIGS. 5a and 5b illustrate the device toolbox area 308 in more detail. FIG. 5a depicts the list of available devices with each device category node collapsed. When one of the category nodes is selected, the available devices under the selected category are expanded and displayed, as shown in FIG. 5b.

Figure 6:
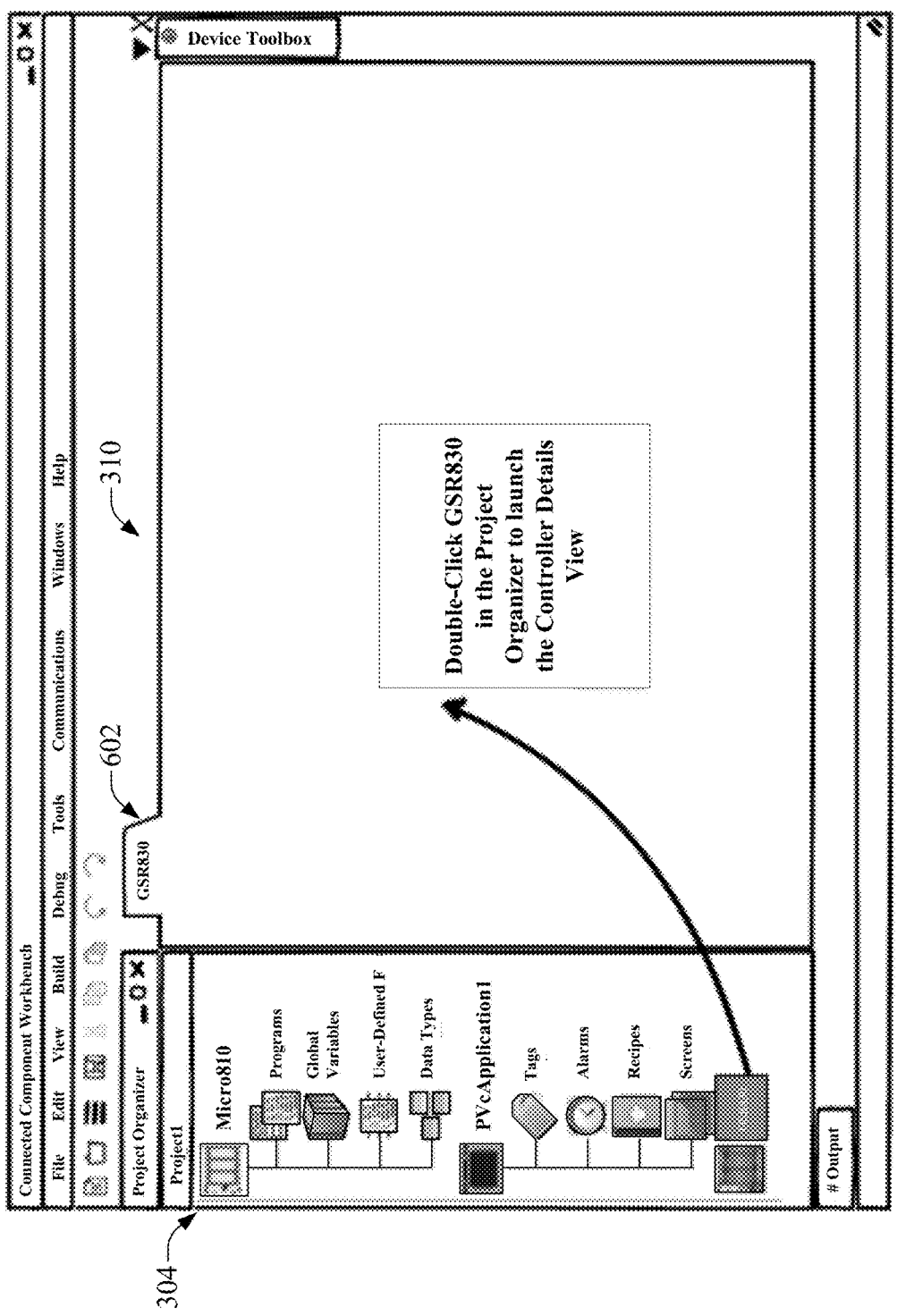
FIG. 6 illustrates creation of a new project for a selected device on the project organizer area.

Turning now to FIG. 6, selection of a safety relay or other device within the project organizer area 304 (e.g., a safety relay or other device previously selected from the device toolbox area 308 for inclusion in the project organizer area 304) creates a new project for the selected device. In the illustrated example, a GSR830 safety relay is to be configured and programmed. Accordingly, a device icon corresponding to this type of safety relay is selected from the project organizer area 304, which launches a "controller details" view within the device details area 310. In the present example, a project tab 602 is displayed at the top of the device details area 310, which corresponds to the new project.

Figure 7:
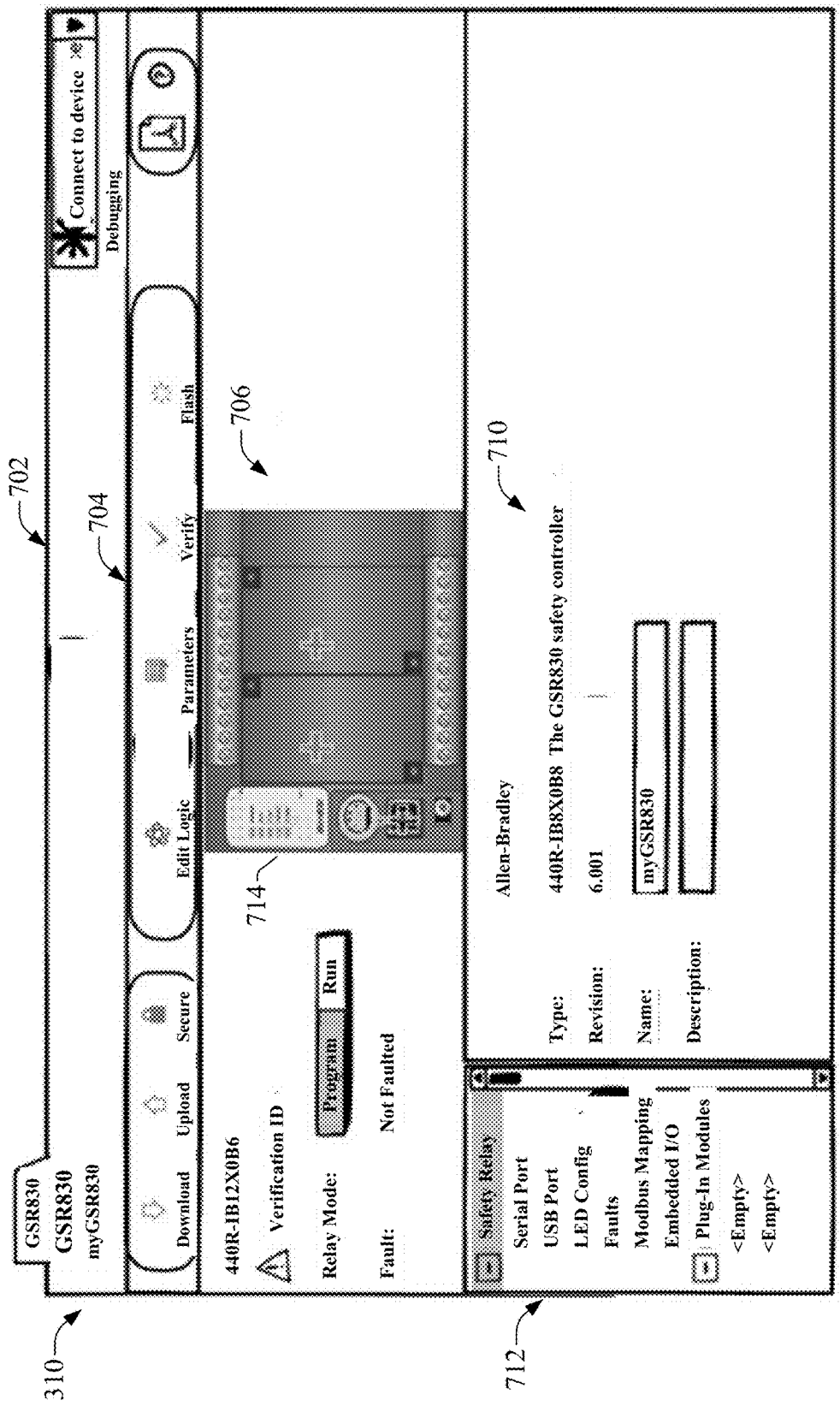
FIG. 7 illustrates the areas of a device details area when a project for a selected safety device is open.

FIG. 7 illustrates the areas of the device details area 310 when a project for a selected safety device is open. Device details area 310 includes a device header 702 containing relevant information about the selected device, including the safety device's identity and connection information. Device toolbar area 704 lists a number of selectable operations and commands. These can include both common operations that pertain to all device types (e.g., upload, download, etc.) and device-specific operations that depend on the type of selected safety device (e.g., safety configure, validate, debug, secure, variables). Device toolbar area 704 can also include flash information, such as a manual for the safety device or on-line help information.

Device graphic view area 706 displays the name of the project and a graphical representation 714 of the selected safety device. If the safety relay configuration system is currently connected to the safety device, the device graphic view area 706 can also display operational status information for the device, such as the current mode of the device (program mode, running, etc.), whether the device is currently faulted, identification of the fault, etc. The user can also switch the mode of the safety relay between program mode and running mode from this area. This area also indicates whether the current project has been verified (e.g., the program has been checked for errors or inconsistencies prior to download), and displays a verification identifier for verified projects.

Figure 8:
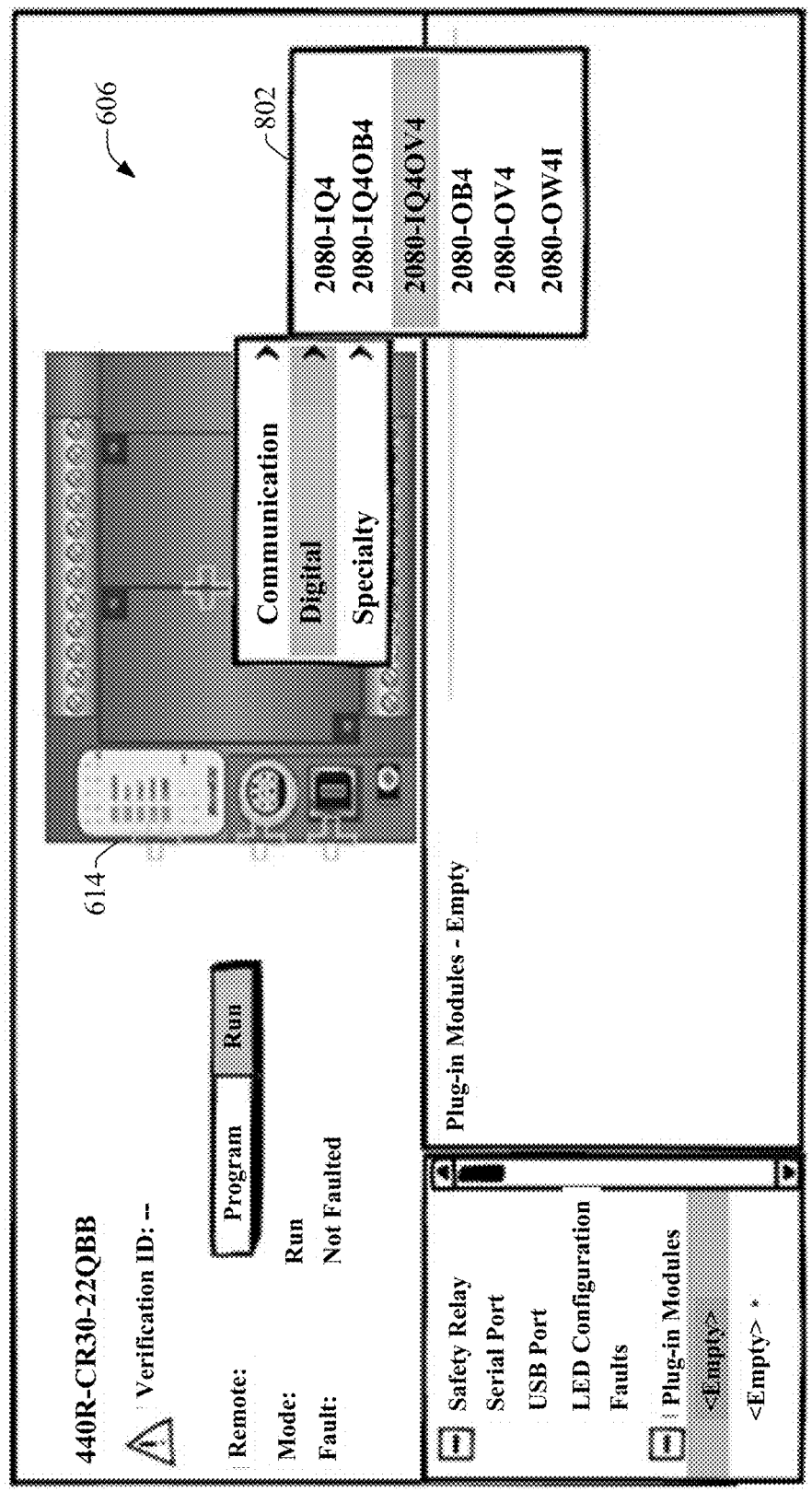
FIG. 8 illustrates configuration of a plug-in module for a safety relay configuration project.
Figure 9:
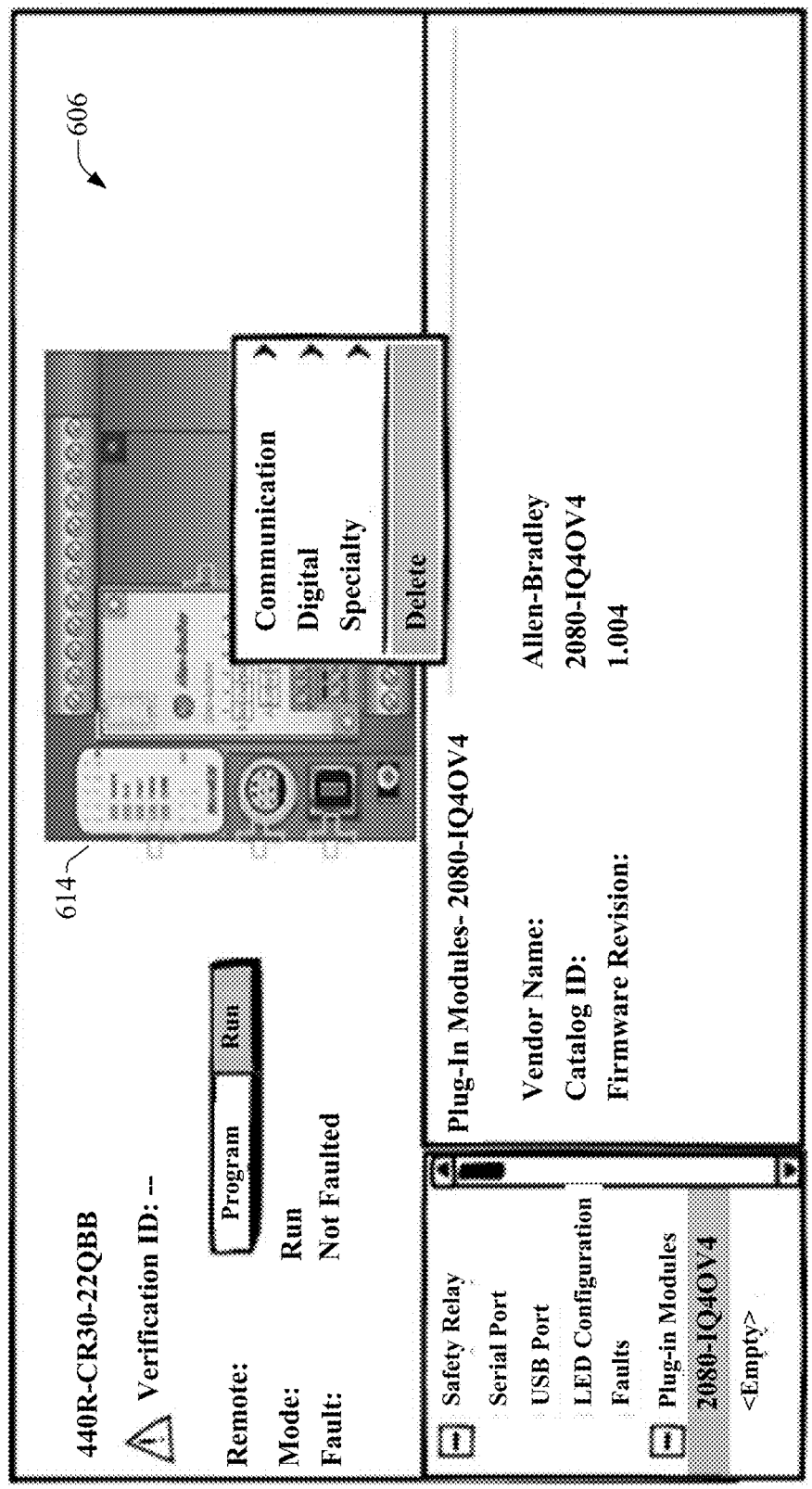
FIG. 9 illustrates a graphical representation of a plug-in module in a project window of the safety relay configuration system.

The user can also add configurations for any plug-in modules installed on the safety relay from the device graphic view area 706. In some embodiments, this can be performed by right-clicking or otherwise selecting an empty slot on the graphical representation of the safety relay, as illustrated in FIG. 8. This invokes a pop-up configuration window 802 that allows the user to select a category of the plug-in module (e.g., communication module, digital I/O module, or specialty module), and to select a particular model of the plug-in module within the selected category. Once selected, a graphical representation of the plug-in module appears on the graphical representation of the safety relay, as illustrated in FIG. 9.

Returning now to FIG. 7, device tree area 712 provides navigation to various configurable aspects of the selected safety device, including but not limited to the communication ports of the safety relay, the devices visual indicators (e.g., LEDs or other indicators), embedded inputs and outputs, and any plug-in modules that are attached to the safety relay (e.g., expansion I/O modules).

Device configuration property pane 610 allows the user to view and edit the current configuration of the selected safety relay. When the user selects an item from the device tree area 712, the device configuration property pane displays detailed configuration information for the selected item.

Figure 10:
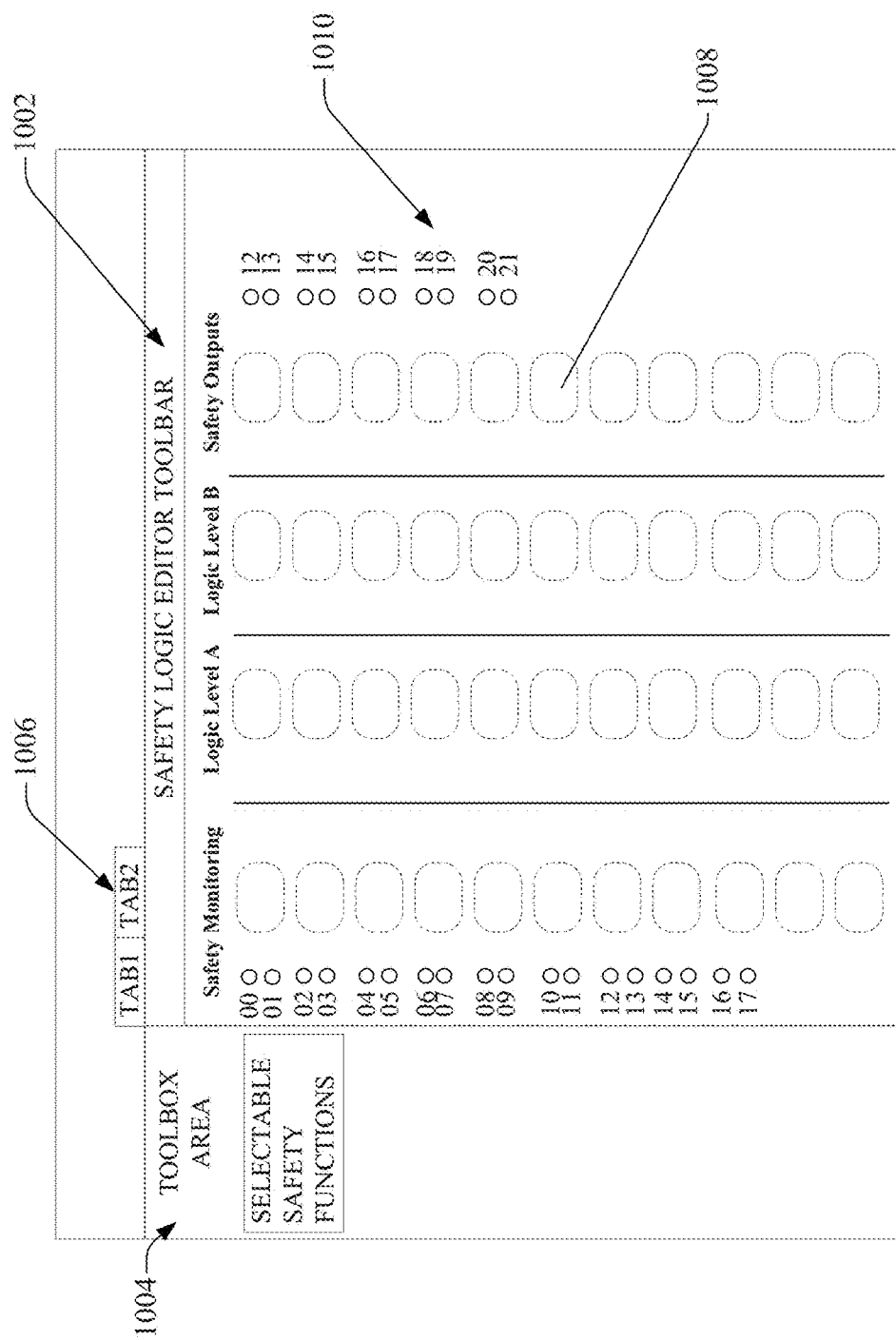
FIG. 10 illustrates a safety logic editor screen of the safety relay configuration system.

Selection of a logic editor button on the device toolbar area 704 launches a safety logic editor, as illustrated in FIG. 10. In some embodiments, the safety logic editor will be opened in a new tab 1006. In the illustrated example, a toolbox area 1004 containing selectable safety functions is located on the left-hand side of the screen, and a safety logic editor toolbar 1002 is located across the top of the window. The safety logic editor pane 1010 allows the user to create, view, and edit safety logic and configuration data for the safety relay associated with the current project. In FIG. 10, the safety logic editor pane 1010 is depicted in its blank state, which is presented to the user when a new project is created. As will be described in more detail herein, the safety relay configuration system allows the used to build safety logic programs for the safety relay by adding function blocks to available memory spaces 1008 on the safety logic editor pane 1010.

As illustrated in FIG. 10, the safety logic editor pane 1010 comprises a grid of four columns—Safety Monitoring, Logic Level A, Logic Level B, and Safety Outputs—with each column comprising a number of available memory spaces 1008. Function blocks can be added to the respective memory spaces 1008 by selecting the function blocks from the toolbox area 1004. Function blocks can be organized within the toolbox area 1004 according to device type, logic function, safety monitoring function, or other suitable categories. The categories can be displayed as nodes within toolbox area 1004, such that selection of a node expands the selections available within the selected category.

The Safety Monitoring column of the safety logic editor pane 1010 will typically contain function blocks corresponding to safety input devices to be monitored by the safety relay (e.g., gate switches, light curtains, safety mats, emergency stop buttons, pull cords, etc.). The Logic Level A and B columns are used to contain logical operations that act on the safety inputs in a manner determined by the user in order to control how the safety inputs control that states of the safety outputs. The Safety Output column will typically contain function blocks corresponding to safety outputs of the safety relay. As will be described in more detail herein, the safety relay configuration system allows each function block to be configured directly on the function block graphic, and allows the user to draw connection lines between function block inputs and outputs in order to build a complete safety relay program that can be downloaded to and executed on the safety relay.

Figure 11:
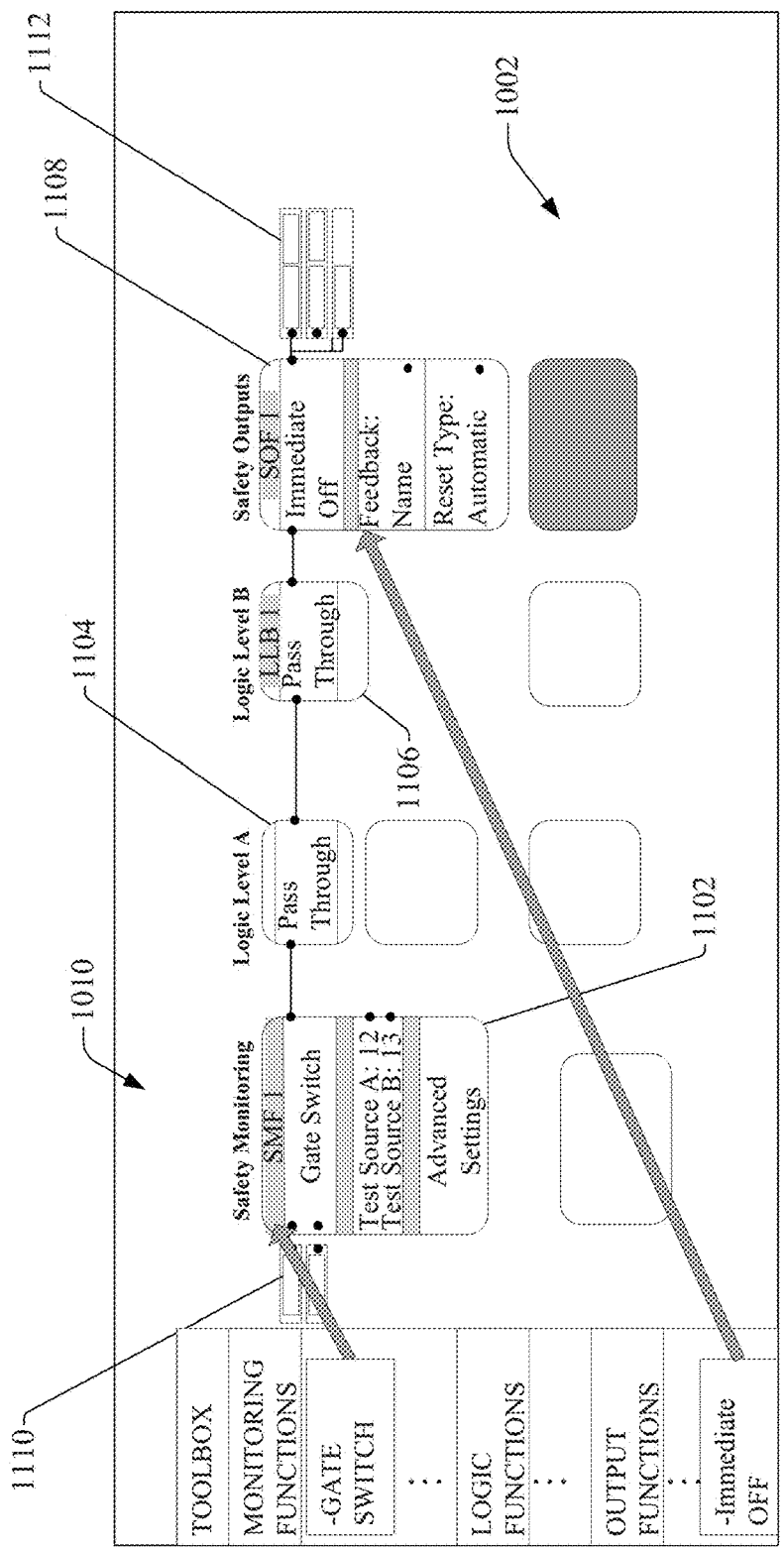
FIG. 11 illustrates creation of an example safety relay logic program.

An example workflow is now described with reference to FIG. 11 in order to provide a general overview of the process for building safety relay programs according to one or more embodiments. In this example, a gate switch is to be monitored by the safety relay, and the user is to develop logic for controlling a safety relay output based on the monitored status of the gate switch. Accordingly, a Gate Switch function block 1102 selected from the Safety Monitoring Functions tree of the toolbox area and dragged to an available memory space of the safety monitoring column of the safety logic editor pane 1010. As will be described in more detail herein, the safety relay configuration system automatically assigns to available (unused) input terminal addresses 1110 to the Gate Switch function block 1102 when the function block is added to the program. If desired, these input terminal addresses can be changed if the user wishes to assign different input terminals to the Gate Switch function block 1102. Other configuration settings for the Gate Switch function block 1102 can be set through interaction with the Gate Switch function block 1102, as will be described in more detail herein.

Next, the user selects a Safety Output function block 1108 from the Safety Output Functions tree of the toolbox area and drags this function block to an available memory space of the Safety Outputs column of the safety logic editor pane 1010. Similar to the Gate Switch function block 1102, the safety relay configuration system will automatically assign two available (unused) safety relay output terminal addresses 1112 to the Safety Output function block 1108. These output addresses can be changed by the user if desired through interaction with the function block on the editor pane. Other configuration settings for the Safety Output function block 1108 can be set through interaction with the function block. For example, the Reset Type for the Safety Output function block 1108 can be changed from Manual to Automatic by selecting the appropriate setting from a drop-down box on the function block.

In this example, no logical operators are to be performed on the gate switch status, but instead the safety output is to be directly controlled by the status of the gate switch. Accordingly, the user can directly connect the output of the Gate Switch function block 1102 to the input of the Safety Output function block 1108. This can be performed, for example, by clicking on the input of the Safety Output function block 1108 (which is colored blue to indicate that no connection has yet been made), then clicking on the output of the Gate Switch function block 1102 (similarly colored blue when no connection is yet made). In response to these selections, the safety relay configuration system automatically creates two Pass Through blocks between the Gate Switch and Safety Output function blocks in the Logic Level A and B columns, respectively, and draws a connection line between the two function blocks through the two Pass Through blocks. The Pass Through blocks perform no logical functions, but merely pass status information, unchanged, from their inputs to their outputs.

Once the logic program is completed, the user can compile and download the program to the safety relay by selecting appropriate controls on the device toolbar area 704.

Figure 12:
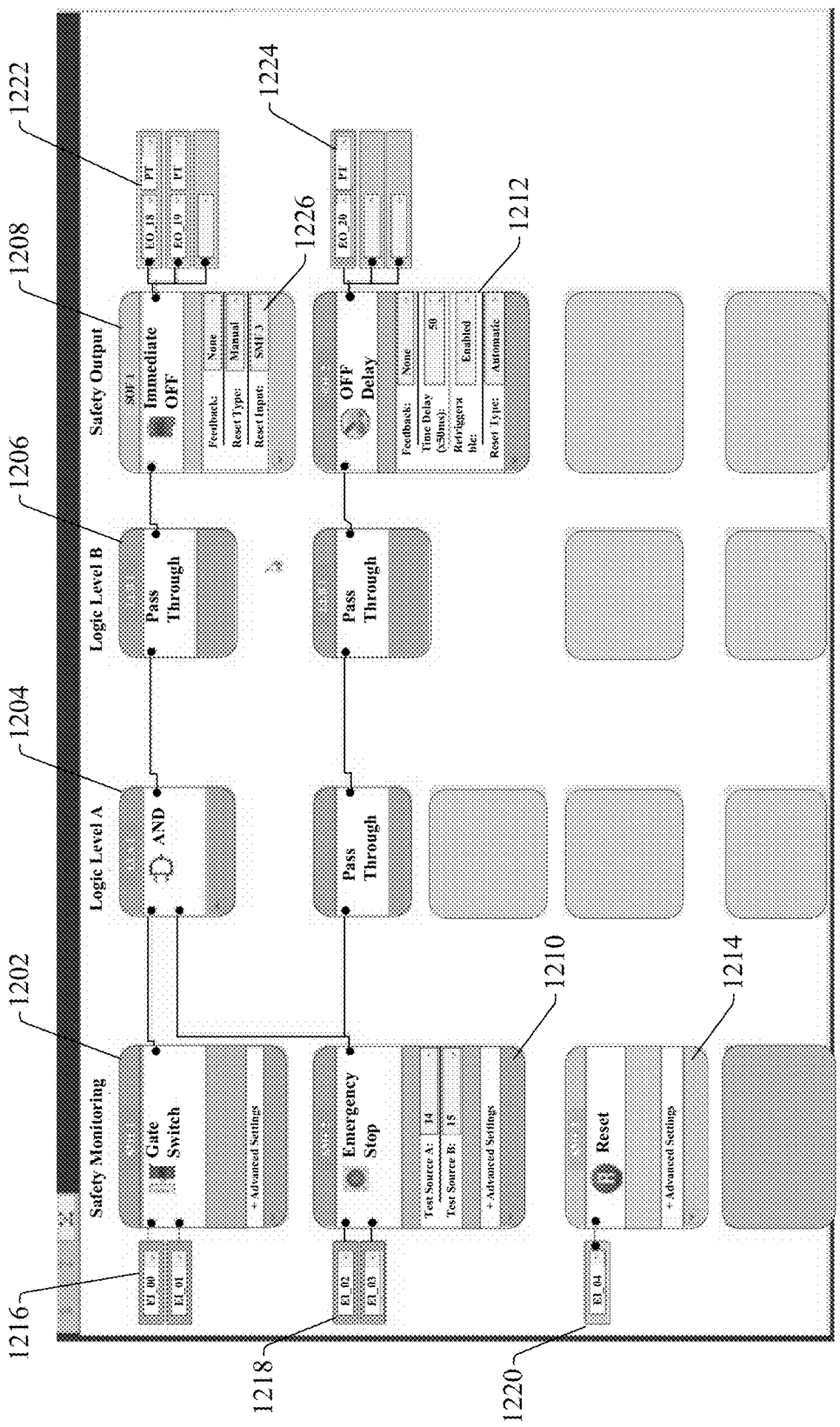
FIG. 12 illustrates an example safety relay logic program.

FIG. 12 illustrates another example logic program according to one or more embodiments. In this example, the safety monitoring column contains three safety monitoring blocks corresponding to three safety input devices—a Gate Switch function block 1202, an Emergency Stop function block 1210, and a Reset function block 1214. Each of the safety monitoring function blocks have been assigned to selected input terminals of the safety relay using address windows 1216, 1218, and 1220. The outputs of Gate Switch function block 1202 and Emergency Stop function block 1210 have been connected to respective two inputs of an AND function block 1204 in the Logic Level A column. The AND function block generates a high signal on its output when the outputs of the Gate Switch function block 1202 and the Emergency Stop function block 1210 are both ON. The output of the AND function block 1204 is connected to the input of an Immediate OFF function block 1208 in the Safety Output column, via a Pass Through function block 1206. The Safety Output column controls two output terminals of the safety relay—designated in address window 1222—based on the output of the AND function block and the configuration settings specified by the user on the function block 1208.

The output of the Emergency Stop function block 1210 is also connected to an OFF Delay function block 1212 in the Safety Output column (via two Pass Through function blocks). By this configuration, the OFF Delay function block 1212 controls the output terminal designated in the address window 1224 based on the output of the Emergency Stop function block 1210.

Reset function block 1214 has been designated an available input terminal address in address window 1220, and has been linked to the Immediate OFF function block 1208 by reference using the Reset Input window 1226 on the Immediate OFF function block 1208. In this way, the Reset function block 1214, controlled by input address specified in 1220, is configured to reset the Immediate OFF function block 1208.

In addition to development, the safety logic layout depicted in FIG. 12 can also be used to monitor the safety relay logic during runtime after the logic has been downloaded to the relay. During runtime monitoring, live status information corresponding to the respective safety monitoring devices and outputs can be overlaid over their respective function blocks. Additionally, the function blocks can include color animation that changes the color of the function blocks based on their respective current statuses.

FIGS. 13-22 depict a number of example safety monitoring function blocks (SMFs) that are available in one or more embodiments of the safety relay configuration system. It is to be appreciated that various embodiments of the safety relay configuration system may include all described safety monitoring function blocks, or only a subset of the function blocks described herein. Additional function blocks not described herein may also be included in one or more embodiments without deviating from the scope of this disclosure.

Figures 13, 14:
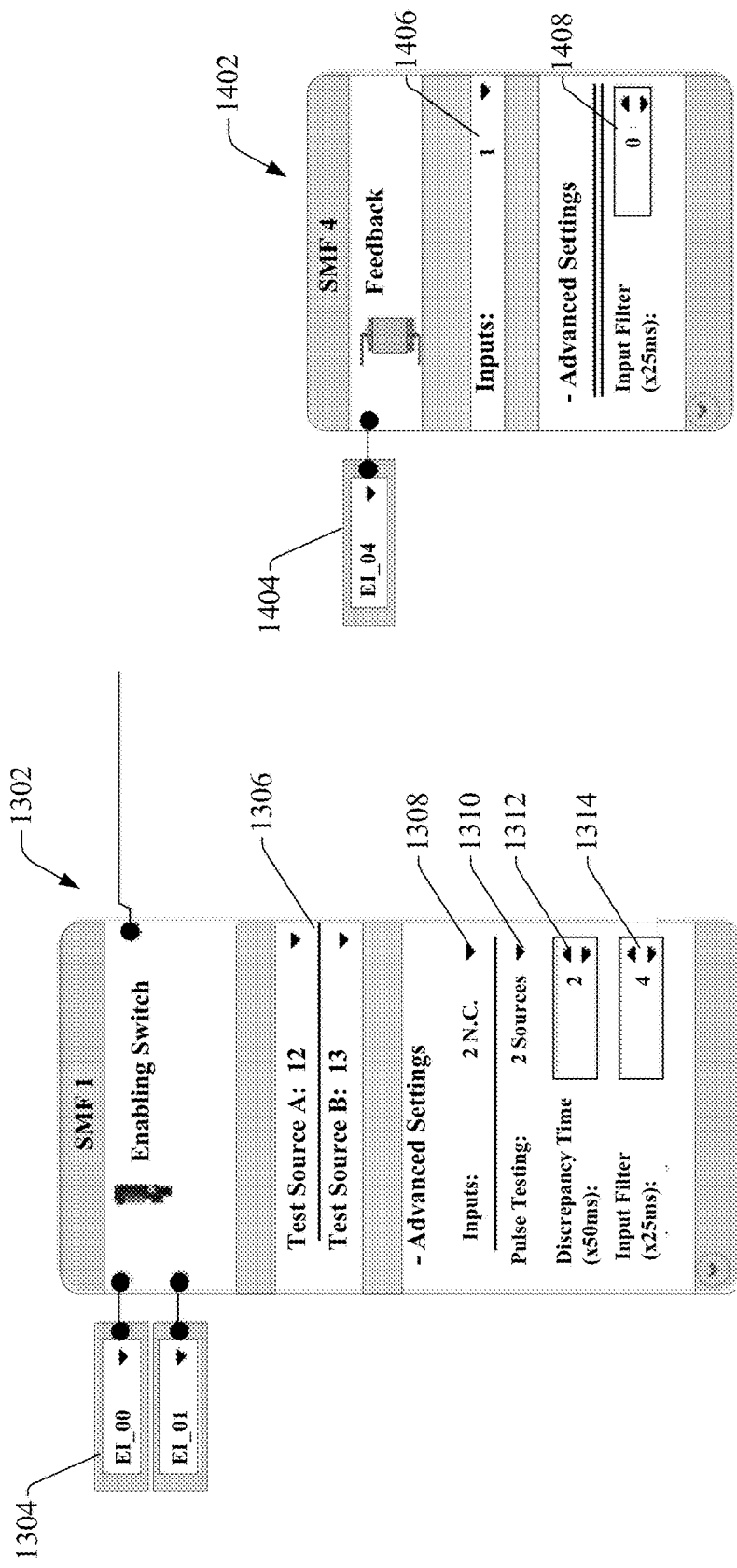
FIG. 13 illustrates an example Enabling Switch function block.
FIG. 14 illustrates an example Feedback function block.

FIG. 13 illustrates an example Enabling Switch function block 1302, which monitors the states of two input channels (designated in address window 1304) and turns on its output when both inputs are in the active states. The Enabling Switch function block 1302 turns the output off when either one or both of the input channels returns to the Safe state. Both input channels for the Enabling Switch instruction are normally open. This means zeros on both channels represent the Safe state, and ones on both channels represent the Active state. The Enabling Switch function block 1302 generates a fault if the input channels are in an inconsistent state (e.g., one Safe and one Active) for more than the specified discrepancy time, set in the discrepancy time window 1312.

Test Source windows 1306 assign the test sources that are to source the 24V test pulses for channels A and B, respectively. These test pulses are used to detect shorts to 24V and channel-to-channel shorts to other inputs, as will be described in more detail herein.

The Inputs window 1308 toggles the function block 1302 between dual normally closed (NC), dual output signal switching device (OSSD), and single inputs. The Pulse Testing window 1310 defines whether Test Pulsing is enabled on the input channels. If the Pulse Testing window 1310 is enabled, the Test Source windows 1306 will be made available for editing.

When an input filter time is specified in the input filter time window 1314, for the specified length of time, an input channel is allowed to go to the Safe state while the other channel is in the Active state without the output of the function block 1302 going to its Safe state. However, the output will transition to the Safe state when both input channels are in the Safe state at the same time.

FIG. 14 illustrates an example Feedback function block 1402. The input of the Feedback function block 1402 is constantly monitored to ensure it reflects the state of its associated Safety Output function. When the associated Safety Output function transitions, the Feedback function block monitors the input to determine whether the input has transitioned within a configured Feedback Reaction time. The Feedback function block 1402 may include multiple inputs for monitoring respective multiple Safety Output functions. The number of inputs can be set using the Inputs window 1406. The value set in the Input Filter window 1408 determines the On/Off delay for the input signal. Setting the input filter can reduce the influence of chattering and external noise.

FIG. 15 illustrates an example Gate Switch function block 1502, which includes inputs—1504a and 1504b—for respective two channels from the gate switch device. Test Source windows 1506 assign the test source that is to source the 24V test pulses for channels A and B, respectively, similar to previous examples. Gate Switch function block 1502 also includes an Inputs window 1508, a Pulse Testing window 1510, a Discrepancy Time window 1512, and an Input Filter window 1514, which perform similar functions to the corresponding windows of previously described function blocks.

FIG. 16 illustrates an example Light Curtain function block 1602, which includes two inputs—1604a and 1604b—corresponding to respective two channels from a light curtain. Light curtain function block 1602 also includes an Inputs window 1606, a Pulse Testing window 1608, a Discrepancy Time window 1610, and an Input Filter window 1612, which perform similar functions to the corresponding windows of previously described function blocks. The Light Curtain function block 1602 is depicted with pulse testing disabled, which causes the Test Source windows (e.g., Test Source windows 1506 of FIG. 15) to be invisible.

Figure 17:
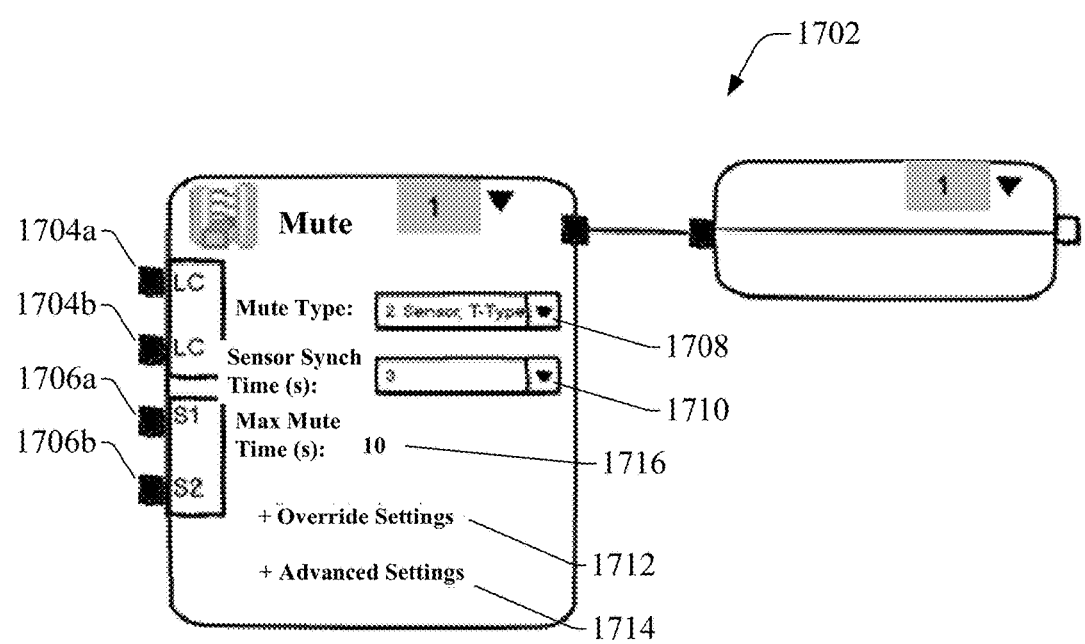
FIG. 17 illustrates an example Muting function block.

FIG. 17 illustrates an example Muting function block 1702. The Muting function block 1702 occupies one row when added to the safety editor project, and controls muting of a light curtain corresponding to a defined Light Curtain function block. Light curtain inputs 1704*a* and 1704*b* correspond to the two channel inputs of the light curtain. Muting sensor inputs 1706*a* and 1706*b* correspond to the muting sensor inputs from the light curtain. For 2-sensor configurations, Sensor 1 (S1) must be the first sensor to be blocked and the last to be cleared in the muting sequence, while Sensor 2 (S2) must be the second sensor to be blocked and the first to be cleared in the muting sequence. Additional sensor inputs can be enabled by switching the Mute Type window 1708 from 2-sensor type to 4-sensor type (Mute Type window 1708 can also allow selection between 2-sensor T-type and 2-sensor L-type). For such 4-sensor configurations, when material is moving in the forward direction, S1 must be the first sensor to be blocked and cleared, S2 must be the second sensor to be blocked and cleared, S3 (not shown) must be the third sensor to be blocked and cleared, and S4 (not shown) must be the fourth sensor blocked and cleared. When material is moving in the reverse direction, S1 must be the fourth sensor to be blocked and cleared, S2 must be the third sensor to be blocked and cleared, S3 must be the second sensor to be blocked and cleared, and S4 must be the first sensor to be blocked and cleared.

The Sensor Synch Time window 1710 configures the maximum amount of time allowed between clearing or blocking of the muting sensor inputs before generating a fault. The Max Mute Time window 1716 specifies the maximum amount of time during which the Muting function block 1702 lets the protective function of the light curtain be disabled before generating a fault.

Figure 18:
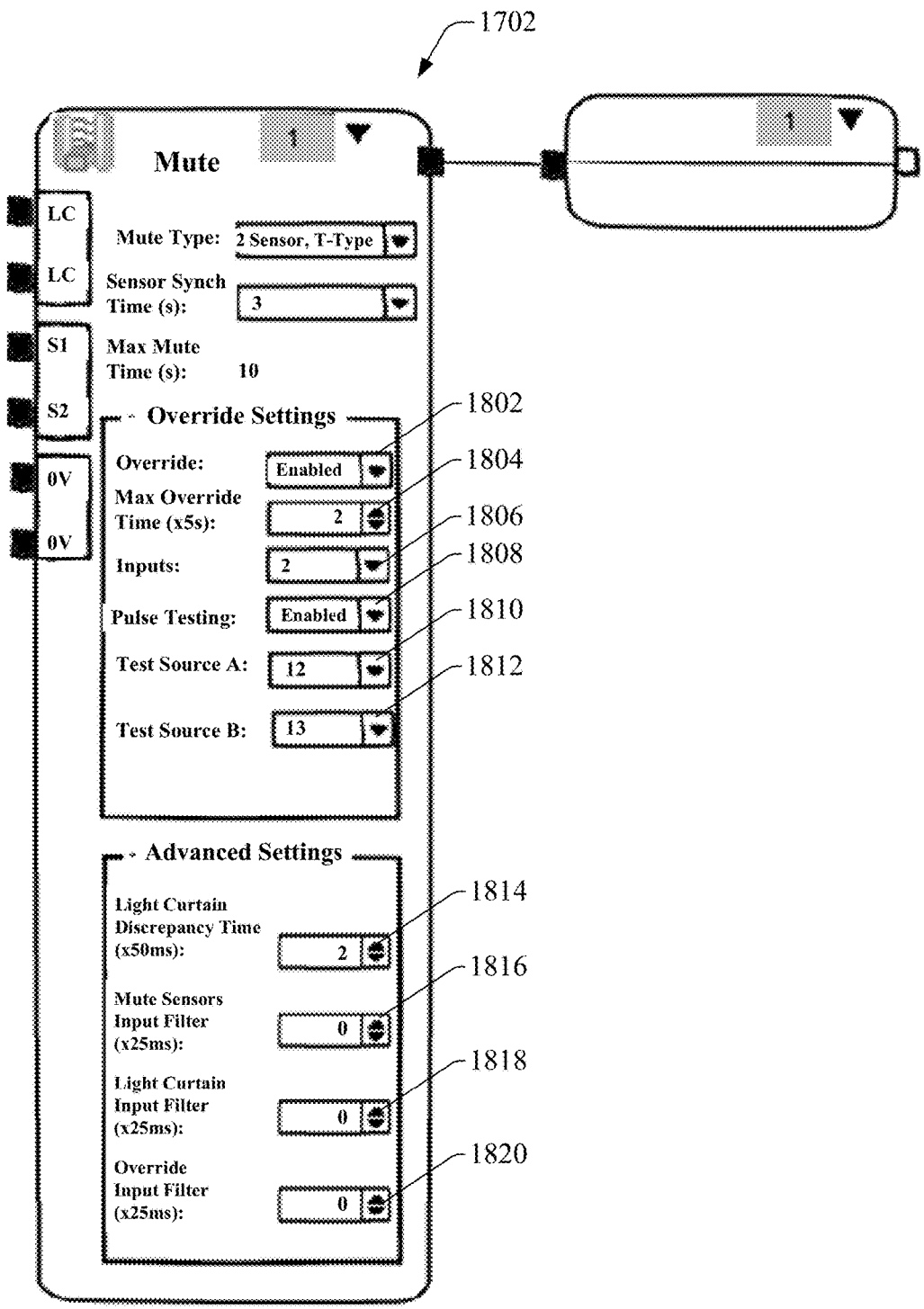
FIG. 18 illustrates an example Muting function block with Override Settings and Advance Settings expanded.

Additional settings can be viewed by selecting either the Override Settings drop-down 1712 or the Advanced Settings drop-down 1714. FIG. 18 illustrates Muting function block 1702 with the Override Settings and Advance Settings expanded.

Override Settings include an Override window 1802 that, when enabled, allows a temporary bypass of the muting instruction's function. The Max Override Time window 1804 specifies the amount of time the instruction lets the override feature energize the output of the instruction. The Inputs window 1806 defines the number of input channels for the Override switch. The Pulse Testing window 1808 defines whether the inputs for the Override switch are to be pulse tested. The Test Source A window 1810 and Test Source B window 1812 assign a test source for sourcing the 24V pulse testing for each channel of the override switch.

The Advanced Settings can include a Light Curtain Discrepancy Time window 1814 that sets the amount of time that the light curtain or the override switch inputs are allowed to be in an inconsistent state before an instruction fault is generated.

When an input filter time is specified in the Muting Sensors Input Filter window 1816, an input channel of the muting sensor is allowed to go to the Safe state for the specified length of time while the other channel is in the Active state without the output of the instruction going to its Safe state. However, the output will go to the Safe state when both input channels are in the safe state at the same time. Light Curtain Input Filter window 1818 and Override Input Filter window 1820 are similar settings for the light curtain input channels and override input channels, respectively.

FIG. 19 illustrates an example Reset function block 1902, which monitors a reset signal on the terminal specified in the address window 1906, and energizes its output on the falling edge of the monitored signal. The Reset function block 1902 is used in safety functions requiring a manual intervention to turn the safety system on. The Input Filter window 1904 sets the On/Off delay for the input signal, which can help reduce the influence of chattering and external noise.

FIG. 20 illustrates an example Restart function block 2002. The Restart function block 2002 typically works in conjunction with an AND or OR logic lock in Logic Level A or Logic Level B. When all inputs are satisfied, exercising the Restart function block's input 2004 will cause the restart function to be effective. The Input Filter window 2006 sets the On/Off delay for the input signal.

FIG. 21 illustrates an example Safety Mat function block 2102. The output of Safety Mat function block 2102 indicates whether the corresponding safety mat is occupied. The two inputs correspond to the two channels, respectively, of the safety mat. The Test Source A window 2104 and Test Source B window 2106 designate the test sources that provide the 24V test pulses for the Safety Mat for detection of shorts to 24V and channel-to-channel shorts to other inputs on the safety relay. Discrepancy Time window 2108 designates the time that the instruction uses to determine the difference between a short circuit and a pressure on the safety mat.

When an input filter time is entered in the input filter window 2110, an input channel is allowed to go to the Safe state for the designated length of time while the other channel is in the Active state without the output of the function block 2102 going to its Safe state. The output will go to the safe state, however, when both input channels are in the safe state at the same time.

FIG. 22 illustrates an example Two Hand Control function block 2202, which is used in conjunction with two-handed actuation controls. In particular, FIG. 22 illustrates the Two Hand Control function block 2202 when 2 N.C./N.O. is selected in the Input window 2208. In this mode, the Two Hand Control function block 2202 has two pairs of inputs 2214 and 2216, with each pair comprising a normally open input (2214*a* and 2216*a*) and a normally closed input (2214*b* and 2216*b*). Alternatively, if the Input window 2208 is set to 2 N.O. mode, only one pair of normally open inputs will be shown on the function block.

In 2 N.C./N.O mode, input 2214*a* corresponds to the normally open contact for the right button of the two-handed control, input 2214*b* corresponds to the normally closed contact for the right button, input 2216*a* corresponds to the normally open contact for the left button, and input 2216*b* corresponds to the normally-closed contact for the left button. In 2 N.O. mode, only two inputs will be available on the function block, corresponding to the normally open contacts for the right and left buttons, respectively.

Test Source A window 2204 and Test Source B window 2206 assign the test sources that are to provide the 24V pulses for input channels A and B, respectively, for detection of shorts to 24V or channel-to-channel shorts to other inputs on the safety relay.

The Pulse Testing window 2210 sets whether test pulsing is enabled on the input channels. The Test Source A and B windows will only appear on the function block 2202 if the Pulse Testing window is set to "Enabled."

When an input filter time is specified in the Input Filter window 2212, an input channel of the function block is allowed to go to the Safe state for the specified length of time while the other channel is in the Active state without the output of the function block 2202 going to its Safe state. The output of the function block will go to the Safe state when both input channels are in the Safe state at the same time.

FIGS. 23-27 depict a number of example safety output function blocks (SOFs) that are available in one or more embodiments of the safety relay configuration system. It is to be appreciated that various embodiments of the safety relay configuration system may include all described safety output function blocks, or only a subset of the function blocks described herein. Additional function blocks not described herein may also be included in one or more embodiments without deviating from the scope of this disclosure FIG. 23 illustrates an example Immediate ON function block 2302, which can monitor a single logical input 2310 and activate one or more field outputs when the following conditions are met: (1) When the Reset Type window 2306 is set to Manual Reset, the logical input 2310 is in the Active State and the Reset Input is transitioned from a zero to a one and back to zero within a defined time (e.g., 250 ms), or (2) When the Reset Type window is set to Automatic Reset, the logical input 2310 is in the Active state.

The Immediate ON function block 2302 also monitors a feedback channel for the field outputs (which can be specified in Feedback window 2304) and generates a fault if the channels do not indicate the desired state of the associated outputs within a defined time (e.g., 150 ms). The feedback will typically be measured from a device either directly or indirectly controlled by the output of the instruction.

The Monitored Input window 2308 is only visible of the Reset Type window 2306 is set to "Manual," and sets the output of the function block Active after the monitored logical input signal transition from the Safe state to the Active state, and the Reset input transitions from a zero to a one and back to a zero within a defined time (e.g., 250 ms).

FIG. 24 illustrates an example ON Delay function block 2402, which monitors a single logical input 2412 and activates one or more field outputs after a specified time delay when the following conditions are met: (1) If the Reset Type window 2408 is set to Manual, the logical input 2412 is in the Active state, the Reset input is transitioned from a zero to a one and back to a zero within a defined time (e.g., 250 ms), or (2) if the Reset Type window 2408 is set to Automatic, the logical input 2412 is in the Active state.

The ON Delay function block 2402 also monitors a feedback channel for the field outputs (defined in the Feedback window 2404) and generates a fault if the channels do not indicate the desired state of the associated outputs within a defined time (e.g., 150 ms). The feedback is typically from a device either directly or indirectly controlled by the output of the function block 2402.

The Time Delay window 2406 specifies how long to delay activating the output of the function block 2402 after the logical input signal transitions from the Safe state to the Active state and, if Manual reset is enabled, the reset input transitions from a zero to a one and back to a zero.

The Reset Input window 2410 is visible only if Manual reset is enabled, and sets the output Active after the monitored logical input signal transitions to the Active state, and the Reset input transitions from a zero to a one and back to a zero within a defined time (e.g., 250 ms).

FIG. 25 illustrates an example OFF Delay function block 2502, which monitors a single logical input 2514 and activates one or more field outputs after a specified time delay and when the following conditions are met: (1) If the Reset Type window 2510 is set to Manual, the logical input 2514 is in the Active state, the Reset input is transitioned from a zero to a one and back to zero within a defined time (e.g., 250 ms), or (b) If the Reset Type window 2510 is set to Automatic, the logical input 2514 is in the Active state.

The OFF Delay function block 2502 also monitors a feedback channel for the field outputs (specified by the Feedback window 2504) and generates a fault if the channels do not indicate the desired stat of the associated outputs within a defined time (e.g., 150 ms). The feedback is typically from a device that is either directly or indirectly controlled by the output of the function block 2502.

The Time Delay window 2506 sets how long to delay transitioning the output of the function block 2502 after the logical input signal transitions form the Active state to the Safe state.

When the Retriggerable window 2508 is set to Enabled, the Time Delay to transition the output of the function block 2502 will be cancelled should the logical input signal transition from the Safe state back to the Active state, and the output will remain in the Active state. If this window is set to Disabled, once the time delay has begun timing, it cannot be reset.

The Reset Input window 2512 sets the monitored reset input. This window is only visible if the Reset Type is set to Manual.

FIG. 26 illustrates an example Jog function block 2602. When the Reset Type window 2610 is set to Manual, the output of the Jog function block 2602 is activated when the logical input 2614 is in the Active state and the reset input is transitioned from a zero to a one and back to zero within a defined time (e.g., 250 ms). When the Reset Type window 2610 is set to Automatic, the output is set when the logical input 2614 is in the Active state. The output of the Jog function block 2602 will remain active until the jog time of the function block is expired.

The Jog Time window 2606 sets the time for which the output of the Jog function block will stay in the Active state after the logical input 2614 transitions from the Active state to the Safe state and, in the case of Manual reset, the reset input transitions from a zero to a one and back to zero.

The Feedback window 2608 specifies the feedback from a device either directly or indirectly controlled by the output of the Jog function block 2602.

The Reset Input window 2612 sets the monitored reset input, and is only visible when the Reset Type is set to Manual. In Manual reset mode, the output is set Active after the monitored logical input 2614 transitions from the Safe state to the Active state, and the Reset input transitions from a zero to a one and back to a zero within a defined time (e.g., 250 ms).

Figure 27A:
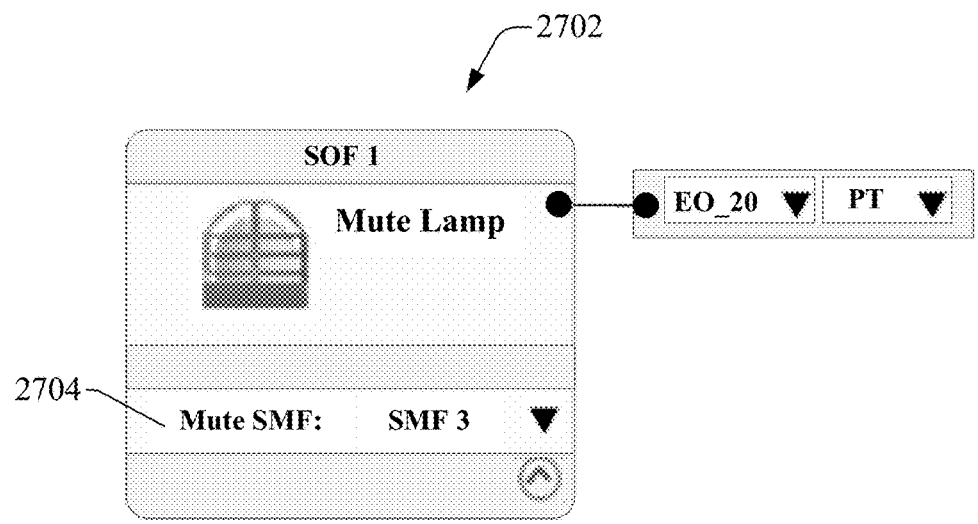
FIG. 27a illustrates an example Mute function block.
Figure 27B:
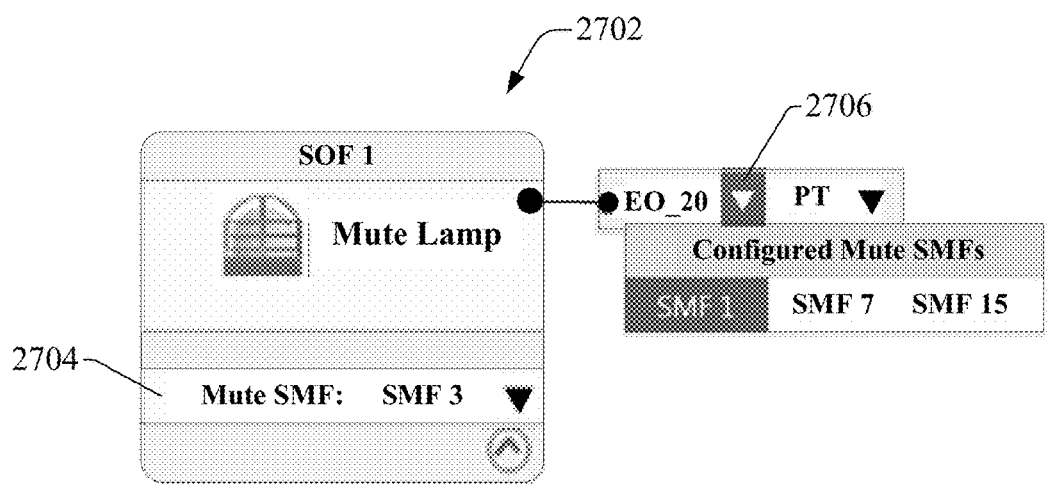
FIG. 27b illustrates an example Mute function block with the output address drop-down selected.

FIGS. 27a and 27b illustrate an example Mute function block 2702, which is configured to monitor a Mute safety monitoring function block specified by Mute SMF window 2704. When the protective function of the light curtain is disabled (muted) for the corresponding Mute safety monitoring function specified by Mute SFM window 2704, the output of the Mute function block 2702 will be enabled. As illustrated in FIG. 27b, when the output address drop-down 2706 is selected, only SMFs that are configured as mute functions will be displayed for user selection.

The graphical interface for the safety relay configuration system includes a number of features intended to provide an intuitive development environment and simplify the relay configuration workflow. These features include, but are not limited to, guiding the user through the process of creating an error-free and internally consistent relay configuration application by limiting user choices at certain selection steps, providing wizards that explain configuration steps and minimize tool training time, arranging function blocks on the development window in a linear, organized fashion, and other such aspects. Various graphical interface features for the safety relay configuration system are now described in connection with FIGS. 28-63. Although these features are discussed individually in the following description, it is to be appreciated that some embodiments of the present disclosure may include only one of the described features, a combination of two or more of the described features, or all of the described features without departing from the scope of this disclosure.

Figure 28:
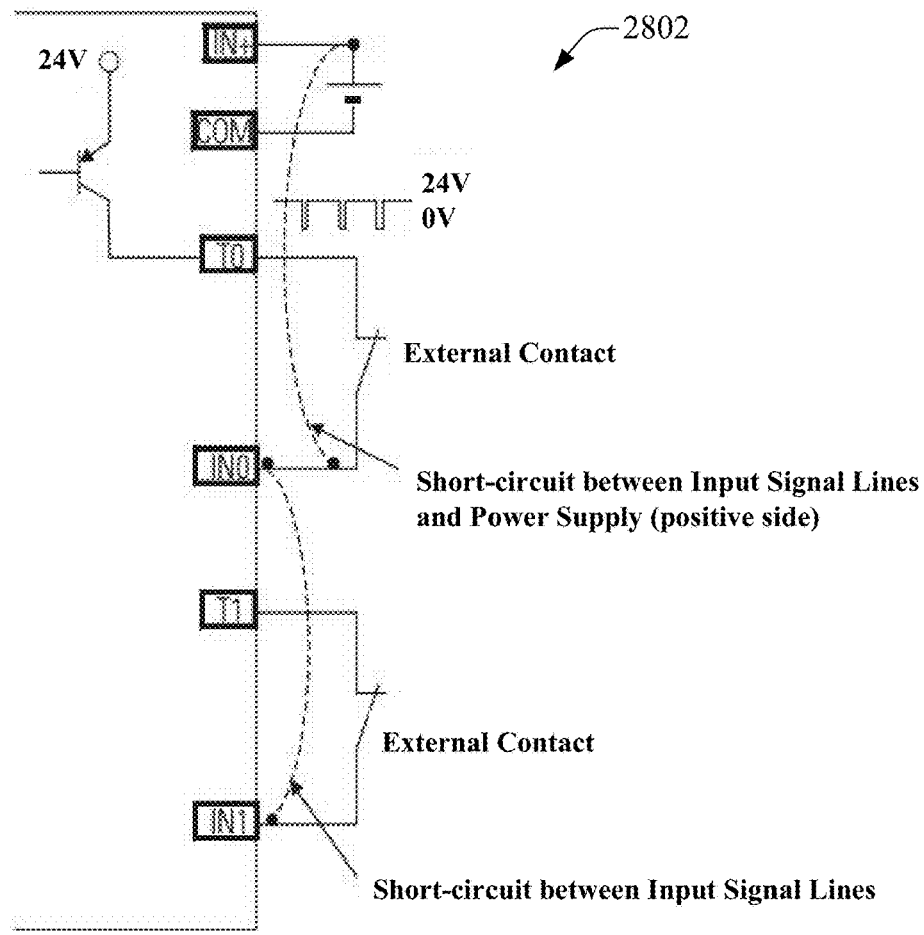
FIG. 28 illustrates switching of test pulses to input terminals of a safety relay.

As noted above, some safety relays are designed to generate test outputs that can be used in combination with a safety input to detect short-circuits or cross-channel faults. As illustrated in FIG. 28, when an external input contact of a safety relay 2802 is closed on an electro-mechanical safety device, a 24V test pulse is output from the test output terminal to facilitate diagnosis of field wiring and input circuitry. Using this function, short-circuits between input terminals and 24V power, or between input signal lines and open circuits, can be detected. In the illustrated example, test source output terminal T0 provides a test pulse to input terminal IN0 to facilitate detection of a short-circuit between input terminal IN0 and 24V power source terminal IN+. Likewise, test source output terminal T1 provides 24V test pulses to input terminal IN1 to facilitate detection of a short-circuit between input terminals IN1 and IN0.

Figure 29:
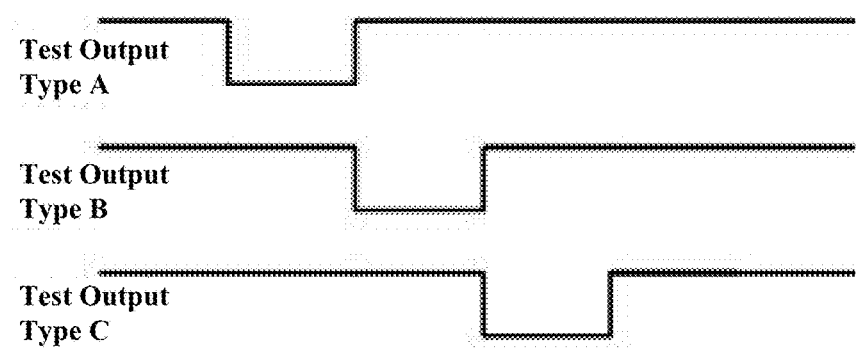
FIG. 29 illustrates three example test pulse schemes supported by the safety relay configuration system.

In order to support dual-channel and triple-channel electro-mechanical safety devices, the safety relay 2802 can support up to three unique pulsing schemes to ensure that a cross fault between any two (or three) channels can be detected. In some embodiments, these three unique pulsing schemes can comprise respective 24V pulse trains that are out of synch with one another, as illustrated in FIG. 29. In this way, the safety relay can identify which of the three pulse schemes—Type A, Type B, or Type C—is being seen by a particular input terminal, and confirm that the terminal is receiving the expected test pulse. The safety relay can also determine whether application of a test pulse on a first input terminal causes the same test pulse to be detected on a different input terminal, indicating a short between the two terminals.

Figure 30A:
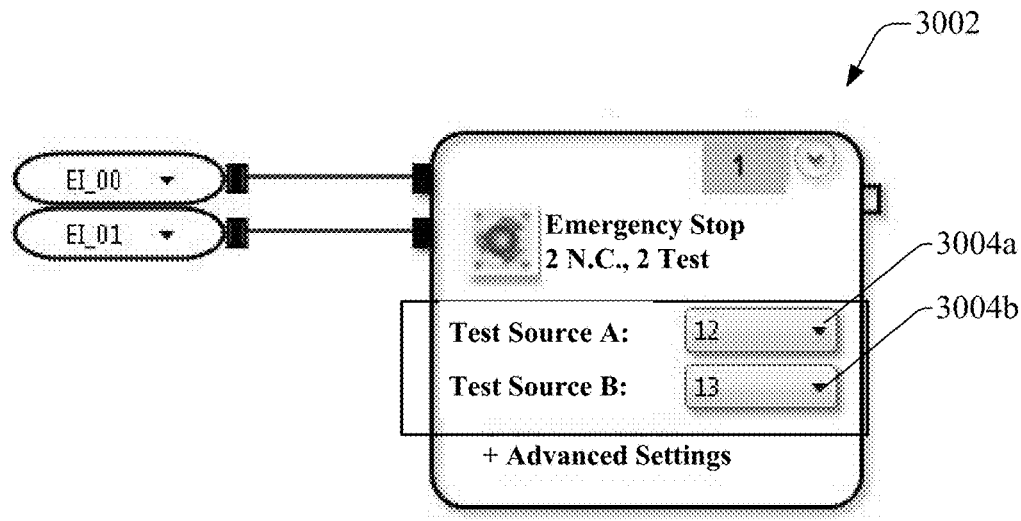
FIG. 30a illustrates an example safety monitoring function block for a dual-channel safety device.
Figure 30B:
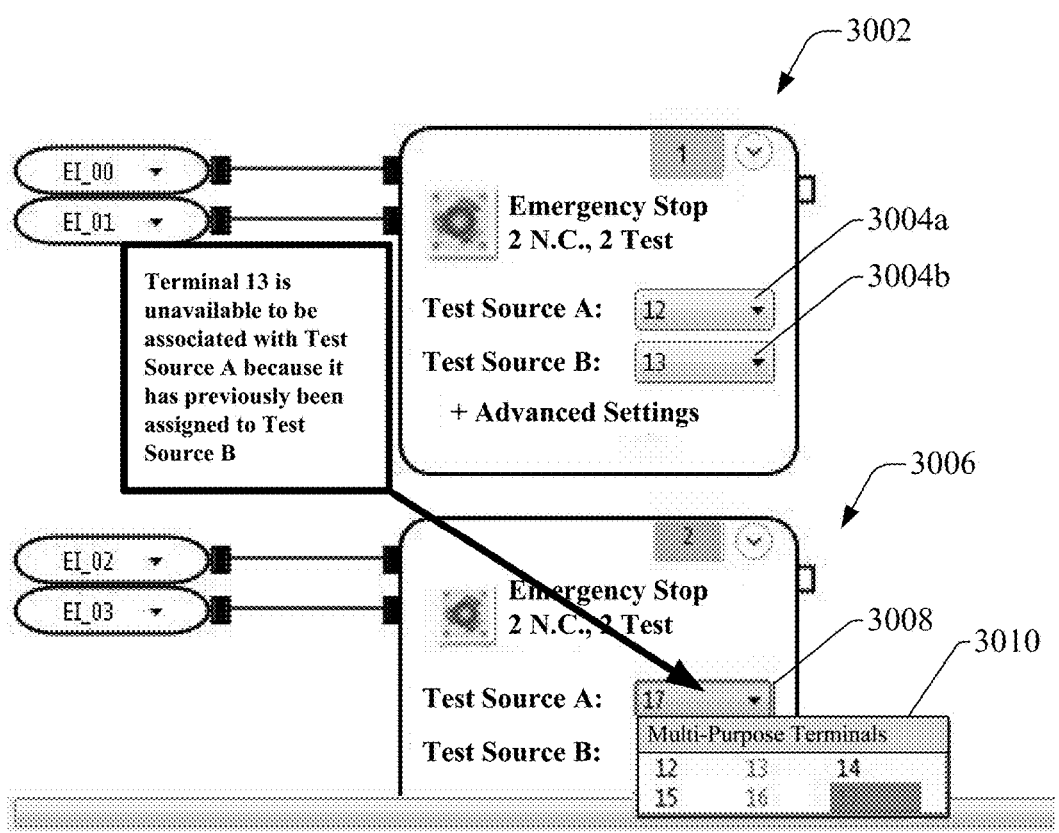
FIG. 30b illustrates restriction of available terminals that can be assigned to a test pulse parameter of a function block.
Figure 30C:
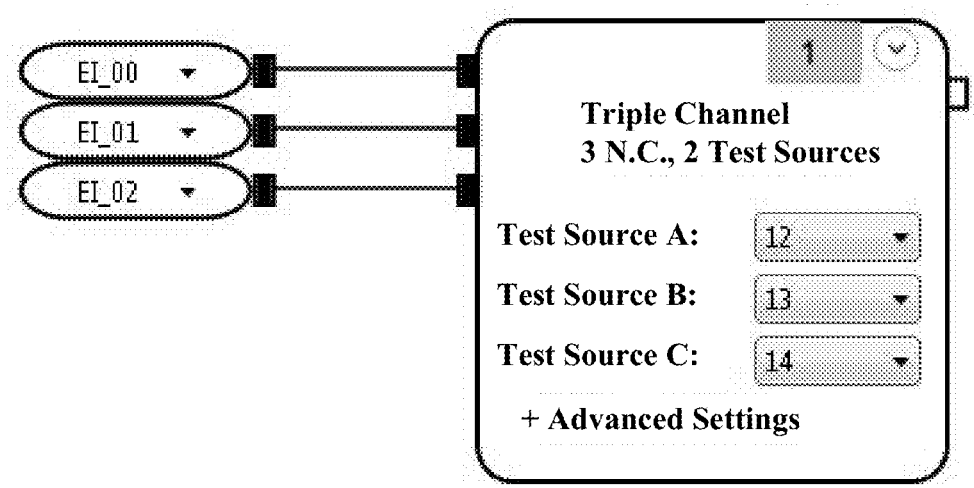
FIG. 30c illustrates an example safety monitoring function block for a three-channel safety device.

One or more embodiments of the safety relay configuration system can intelligently manage the test output pulse test type to ensure that every electro-mechanical safety device in the system has a unique pulsing scheme for each of the safety device's channels. This feature is illustrated in FIGS. 30*a* and 30*b*. FIG. 30*a* illustrates an example safety monitoring function block 3002 for a dual-channel safety device. Function block 3002 includes two Test Source windows Test Source A 3004*a* and Test Source B 3004*b*— which allow the user to select the two test sources (unique test pulsing schemes) to be assigned to the respective two channels of the device. All safety monitoring functions for dual-channel safety devices will include these two Test Source windows (function blocks for three-channel devices will include three such Test Source assignment windows, as illustrated in FIG. 30*c*). The terminal assigned to Test Source A (terminal 12 in FIG. 30*a*) takes on the test output Type A pulsing scheme, while the terminal assigned to Test Source B (terminal 13 in FIG. 30*a*) takes on the test output Type B pulse scheme.

Once a pulsing scheme has been assigned to a terminal on a safety monitoring function block, that terminal can only be used on test sources that have the same Type label throughout the rest of the project. That is, since terminal 12 has been assigned to Test Source A on function block 3002, terminal 12 can henceforth only be used for other Test Source A assignments, since a given terminal cannot be assigned to two different pulse schemes. Since assignment of two different pulse schemes to the same terminal would result in a program error, the safety relay configuration system can prevent the user from inadvertently assigning two different pulse schemes to a terminal by intelligently limiting the available terminal selections on other function blocks in the project. For example, as shown in FIG. 30*b*, when the user selects the Test Source A window 3008 on a different function block 3006, a drop-down selection menu 3010 is displayed. Selection menu 3010 displays available multipurpose terminals, allowing the user to select a terminal to be assigned to Test Source A. However, terminal 13 is made unavailable for selection (grayed out) on selection menu 3010, and thus cannot be assigned to Test Source A, since terminal 13 has already been assigned to Test Source B on function block 3002. Only unassigned terminals or terminals that have previously been assigned to Test Source A are made available on selection menu 3010. In this way, the safety relay configuration system forces the user to remain consistent with previous test source assignments, preventing assignment of two different sources to the same terminal.

Figure 31:
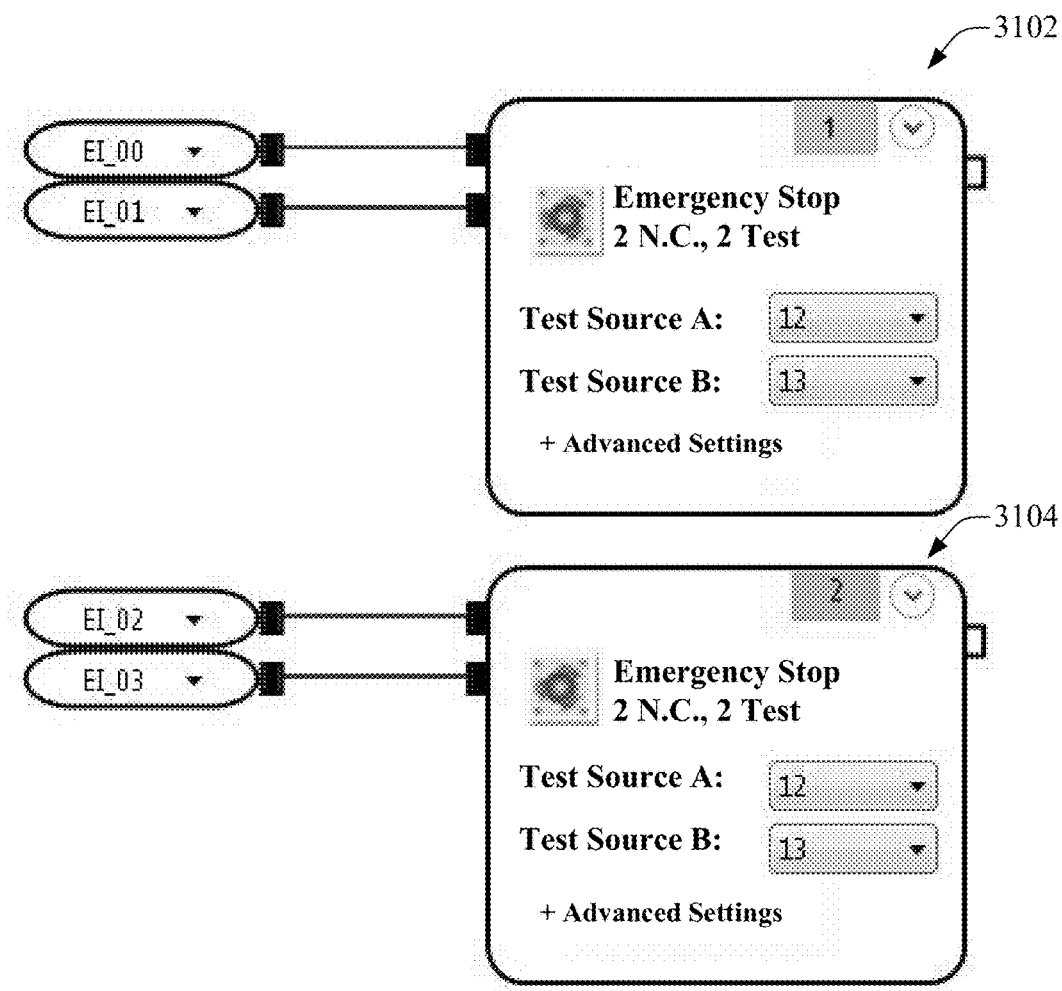
FIG. 31 illustrates automatic assignment of appropriate test source terminals to a safety monitoring function block.

In a related aspect, one or more embodiments of the safety relay configuration system can automatically assign appropriate test source terminals to a safety monitoring function block when the function block is added to the project in the editing environment. For example, as illustrated in FIG. 31, terminals 12 and 13 have been assigned to Test Source A and B, respectively of safety monitoring function block 3102. These terminals may have been selected by the user, or may have been automatically assigned by the configuration system when function block 3102 was added based on the availability and suitability of terminals 12 and 13. Since terminals 12 and 13 have been assigned to function block 3102, each additional function block designed to monitor a dual-channel electro-mechanical safety device—e.g., function block 3104—will automatically have terminals 12 and 13 assigned to their Test Source A and Test Source B windows when the function block 3104 is added to the project.

Figure 32:
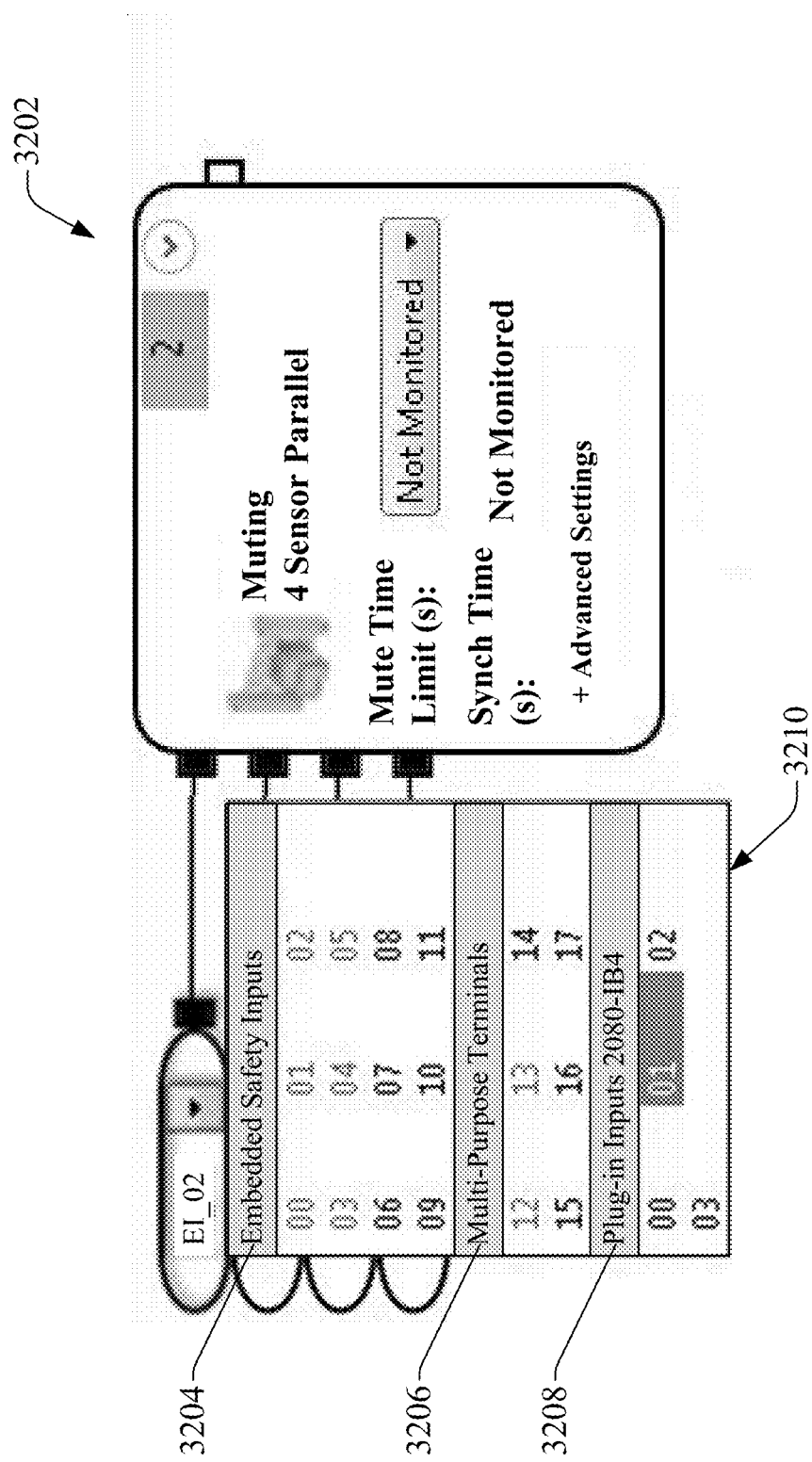
FIG. 32 illustrates a three-column combo box supported by the safety relay configuration system.

In another aspect, one or more embodiments of the safety relay configuration system support organized multi-column combo boxes (or terminal selection graphic window) that organizes the set of available terminals into three or more columns, as illustrated in FIG. 32. Conventional combo boxes typically have only a single column drop-down that limits the number of options that can be displayed on the screen. By contrast, the safety relay configuration system disclosed herein can utilize a three-column terminal selection window graphic with organization section bands for differentiating between groups of options in the combo box. The terminal selection window graphic segregates the set of available terminals according to two or more terminal categories to yield respective two or more terminal groups, and the two or more terminal groups comprise respective title bars displaying respective names of the two or more terminal categories. The two or more terminal categories can comprise at least one of embedded safety inputs, multipurpose terminals, expansion module inputs, networked inputs, or other suitable categories. In example illustrated in FIG. 32, a user has selected an input of a safety monitoring function block, so that an input terminal of the safety relay can be assigned to the selected function block input. Selection of the input causes a combo box 3210 to be displayed, which allowed the user to select an input terminal to be assigned to the function block input. Combo box 3210 contains three separate groups of terminals corresponding to different categories of terminals, which are suitably labeled using organization section bands 3204, 3206, and 3208. The organizational section bands also serve to separate the terminal groups. The terminals are organized into three columns to allow more terminals to be displayed than would be possible with a single-column. In the illustrated example, the first group of terminals (labeled with organization section band 3204) comprises embedded safety inputs, which are integrated safety input terminals of the safety relay. The second group of terminals (labeled with organization section band 3206) comprise multi-purpose terminals, which are integrated terminals of the safety relay which can be flexibly configured as needed. The third group of terminals (labeled with organization section band 3208) comprise plug-in inputs, which are input terminals off a plug-in expansion module that was added to the safety relay.

Figure 33:
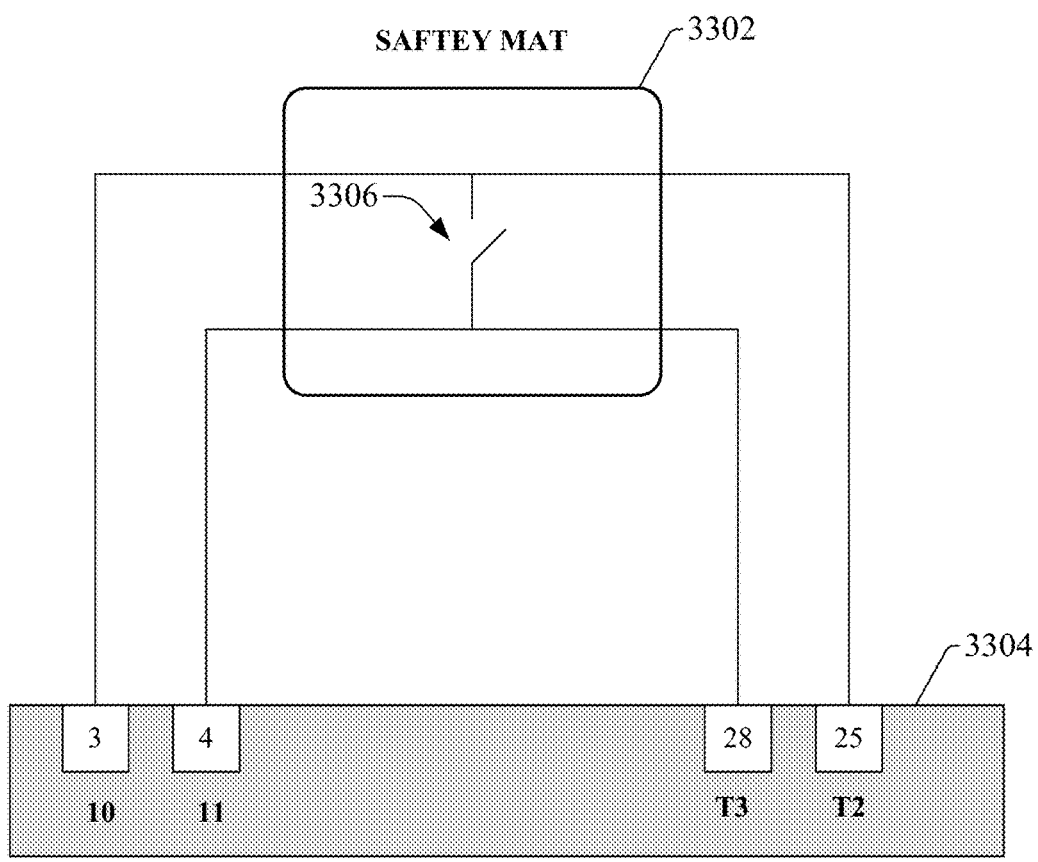
FIG. 33 illustrates a simplified electrical schematic for a safety mat.

Also, one or more embodiments of the safety relay configuration system can support intelligent test source assignments for safety mat monitoring function blocks. FIG. 33 illustrates a simplified electrical schematic for a safety mat 3302. Safety mats typically consist of two conductive plates held apart by non-conductive separators. Each conductive plate—channel A and channel B of the safety mat—are alternately sourced by test sources of safety relay 3304. Test source T2 and Test Source T3 of safety relay 3304 are routed through channels A and B of safety mat 3302, and then to safety inputs I0 and I1 of safety relay 3304. The act of stepping on safety mat 3302 compresses the separators between the two plates, allowing the plates to make contact and creating a cross between the two channels (represented by switch 3306). The safety mat monitoring function block of the safety relay configuration system configures the safety relay to monitor for the cross between the channels to determine that the mat is occupied.

Figure 34:
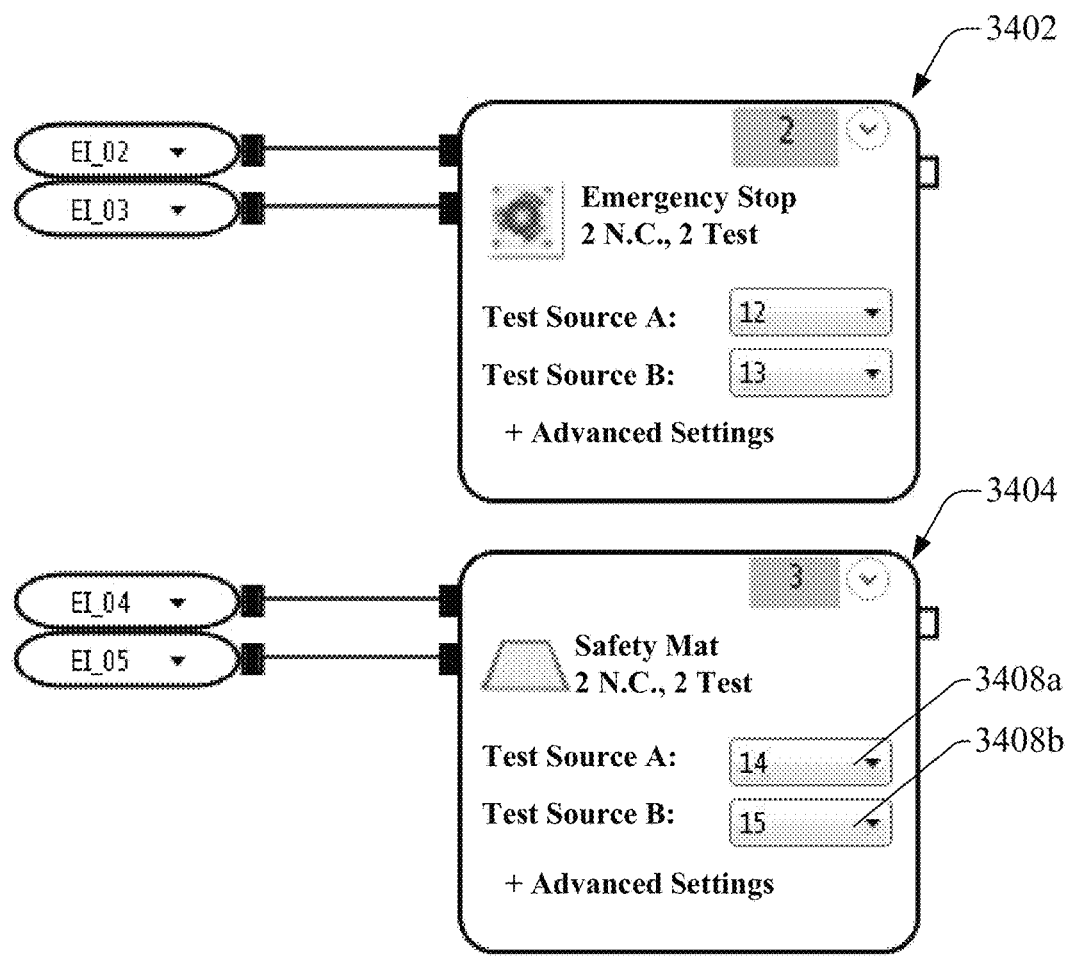
FIG. 34 illustrates automatic assignment of unused test sources to a safety mat function block.

This configuration requires a unique pair of test sources to test the two channels, otherwise nuisance faults (cross channel faults) would be injected on other electro-mechanical safety devices that utilize these test sources when the safety mat is occupied. Accordingly, one or more embodiments of the safety relay configuration system can ensure that a unique pair of test sources are used with a safety mat monitoring function block (note that on other types of electro-mechanical safety devices it would be more efficient to re-use test sources). As illustrated in FIG. 34, when a safety mat function block 3404 is added to the project, the editing environment determines unused test sources and automatically assigns these unused test sources as the test sources for the safety mat function block 3404. In the illustrated example, since previously-added function block 3402 has been assigned terminals 12 and 13 for its Test Source A and Test Source B, respectively, the safety relay configuration system automatically assigns the next two available test source terminals—14 and 15—to Test Source A and Test Source B, respectively, of safety mat function block 3404. This ensures that the safety mat function block 3404 is assigned a unique pair of test source terminals, thereby preventing cross channel faults.

Figure 35:
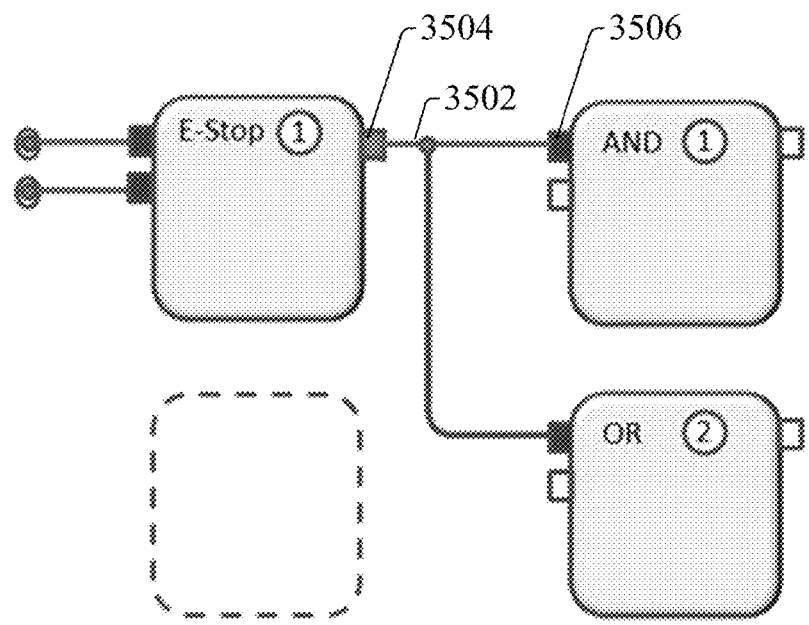
FIG. 35 illustrates connection of function block inputs and outputs using signal flow lines.
Figure 36:
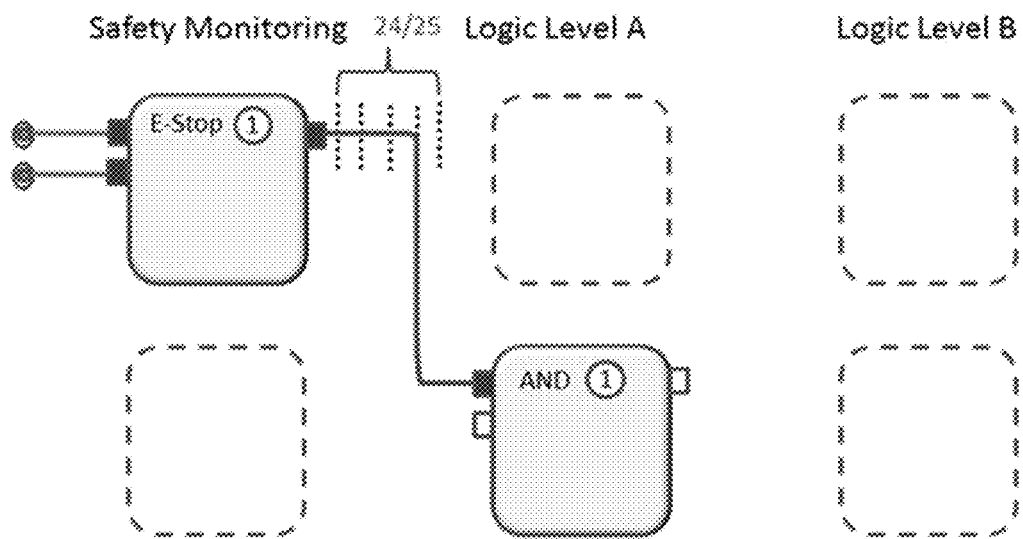
FIG. 36 illustrates an editing environment that maintains a fixed horizontal distance between function blocks.

In another aspect, the safety relay configuration system can provide a function block editing environment that supports signal flow line routing rules that yield easily followed signal flow lines for fixed horizontal distanced function blocks. As illustrated in FIG. 35, a signal flow line 3502 is typically used to logically tie the output 3504 of one function block to an input 3506 of another function block. In one or more embodiments, the editing environment of the safety relay configuration system can enforce a fixed horizontal distance between function blocks, resulting in columns of function blocks, as illustrated in FIG. 36. When the X,Y coordinate locations of function blocks are restricted in this fashion, a line drawing rule set can be designed that results in aesthetically consistent, easily followed flow lines throughout the project. For example, the system can enforce a line drawing rule specifying that a first instance of a line break (that is, a 90 degree bend in order to connect to an input on a different horizontal level) within a column must break 90 degrees from horizontal $24/25$ths of the horizontal distance between two columns, while a second instance of a line break in the column must break 90 degrees from the horizontal $23/25$ths of the horizontal distance between the two columns Such rules will maintain that no wiring connection from two separate output pins will share the same vertical line location on the graphical interface.

In a related aspect, the various organization elements and their spacing on the function block editing environment can have respective fixed widths, allowing a full, completed safety relay configuration to be printable without compression.

Also, as illustrated in FIGS. 37a and 37b, the function blocks of the safety relay configuration system's editing environment can be expanded and collapsed to facilitate viewing or hiding of safety parameters associated with the function blocks. FIG. 37a illustrates an example Emergency Stop function block 3704 in its default presentation. In this default view, only a selected subset of parameters are visible (e.g., the Test Source settings), and the advanced settings hidden. Selecting the Advanced Settings label 3702 on the function block 3704 expands the function block to reveal additional safety parameters that can be configured for the function block, as illustrated in FIG. 37b. These aspects can facilitate printing the configuration in a manner that captures all safety-related parameters. Moreover, these aspects allow the user to configure each function block via settings located directly on the function block (rather than on a separate window), and to hide less critical parameters while monitoring of the safety function during runtime.

Figure 38A:
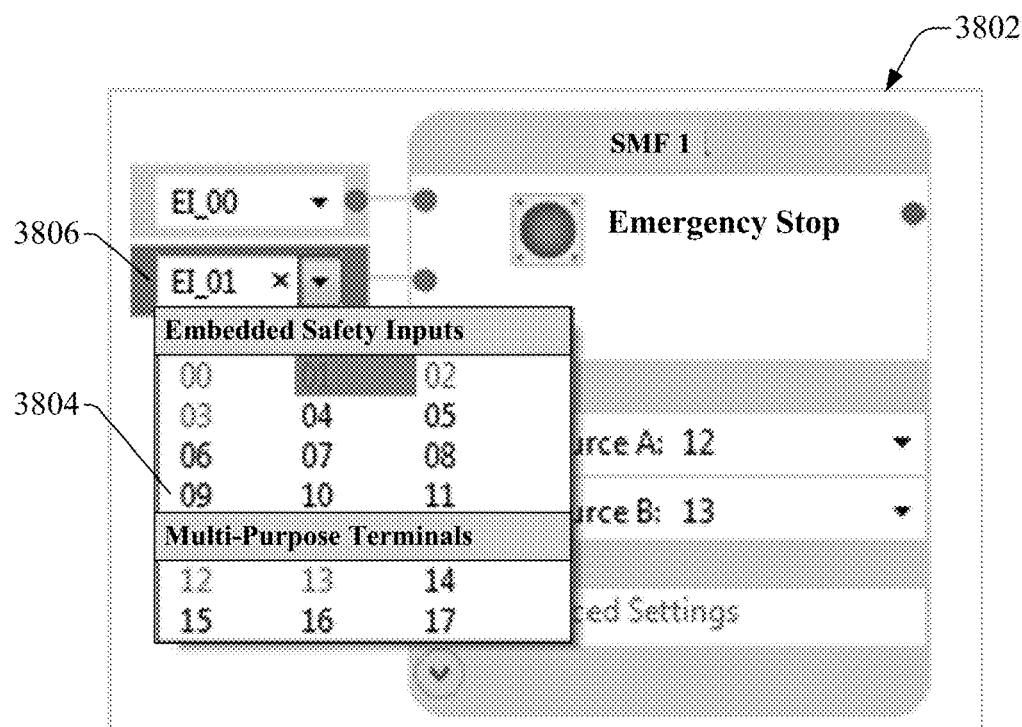
FIG. 38a illustrates prevention of assignment of standard-rated input terminals to safety-rated function blocks.
Figure 38B:
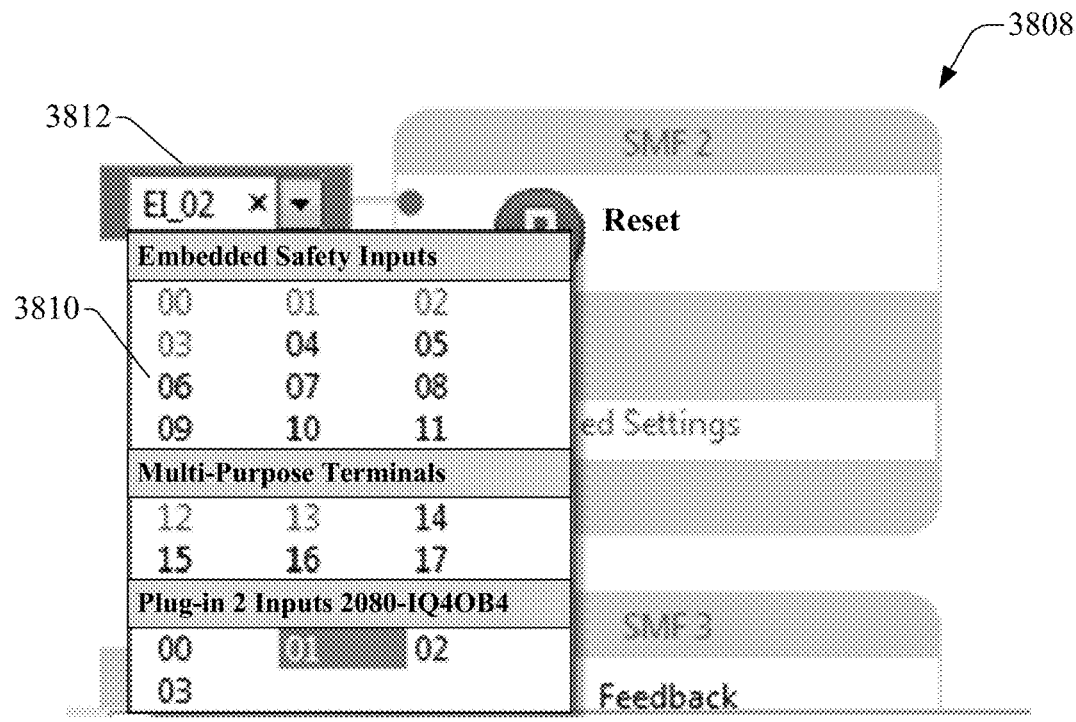
FIG. 38b illustrates limitation of standard-rated input terminals only to assignment of non-safety-rated function blocks.
Figure 39:
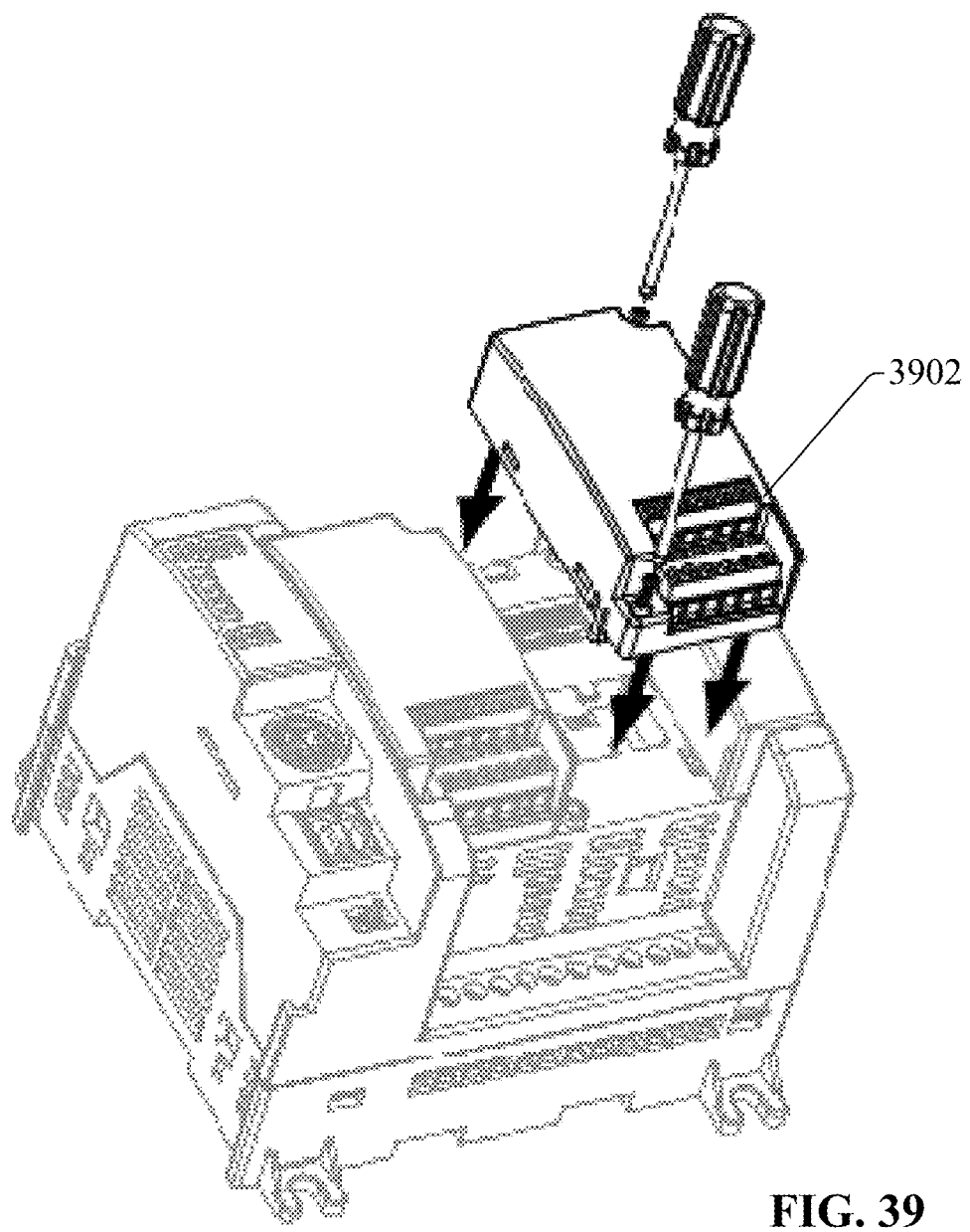
FIG. 39 illustrates an example plug-in expansion module for a safety relay.

FIGS. 38a and 38b illustrate another aspect of the graphical editing environment according to one or more embodiments. According to this aspect, the editing environment restricts presentation of standard-rated input terminals only to non-safety-rated function blocks. In the present example, a safety-rated Emergency Stop function block 3802 is to be added to a project for a safety relay that includes a non-safety-rated digital I/O plug-in (an expansion module that plugs into the safety relay to add non-safety-rated I/O terminals to the relay, such as digital I/O plug-in 3902 illustrated in FIG. 39). Clicking on an input terminal assignment window 3806 for the safety-rated function block causes a terminal assignment combo box 3804 to be displayed. However, non-safety-rated terminals of the digital I/O plug-in are not displayed as a valid selection in combo box 3804 for assignment to the input of the safety-rated Emergency Stop function block 3802, even though such non-safety-rated terminals are available. Instead, only embedded safety inputs and multi-purpose terminals (which are safety-rated) are displayed on combo box 3804 and presented to the user for selection.

However, for function blocks for which a safety-rated terminal is not required, such as Reset function block 3808 in FIG. 38*b*, the available non-safety-rated plug-in terminals are presented in combo box 3810 for selection by the user and assignment to input 3812 (in addition to the safety-rated terminals, which may also be assigned to the non-safety-rated function block 3808). By presenting non-safety-rated terminals for selection and assignment only to non-safety-rated function blocks, the configuration system drives the user to apply standard (non-safety-rated) input signals only to function blocks for which there is no requirement for a safety-rated signal.

Figure 40:
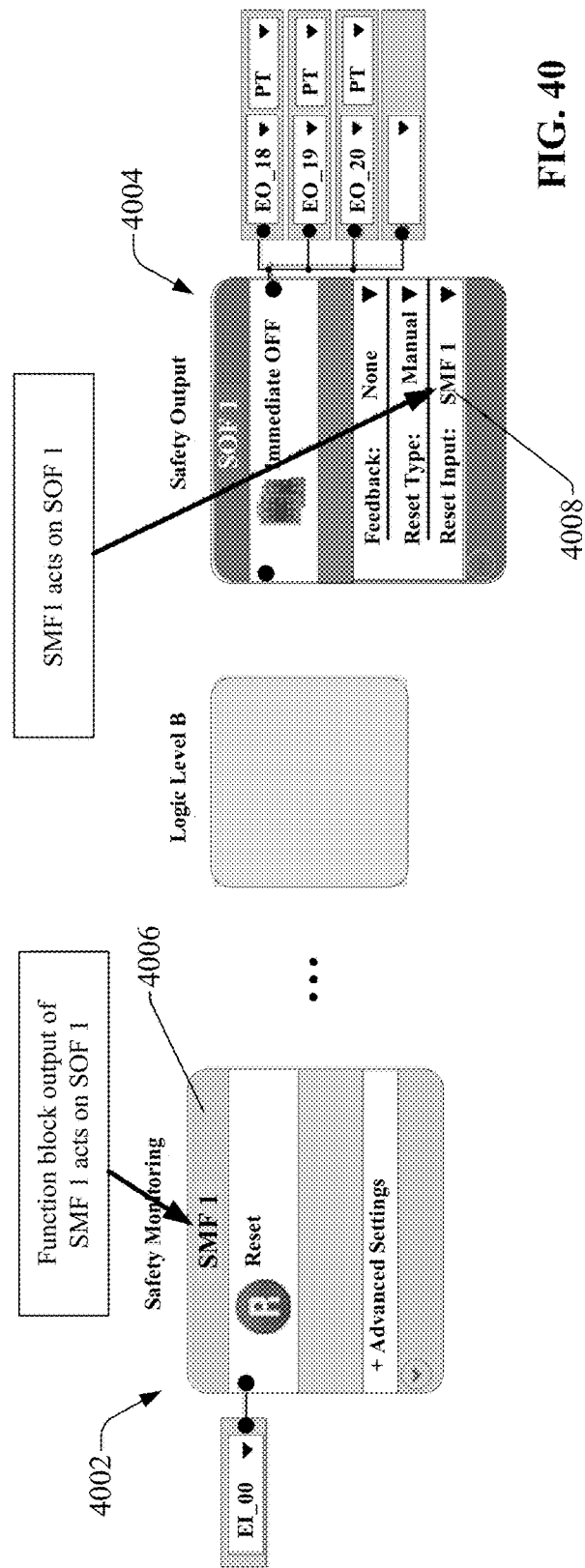
FIG. 40 illustrates function block referencing.

One or more embodiments of the safety relay configuration system can also reduce the number of signal flow lines on a project by supporting function block references between function blocks. This aspect allows a first function block whose output is acting on another function block located multiple columns adjacent to the first function block to make an association by a combo box selection rather than by creating a signal flow wire that spans multiple columns FIG. 40 illustrates an example of this type of function block referencing. In this example, safety output function block 4004 is linked to the Reset function block 4002 by selecting the name of function block 4002 ("SMF 1," found in the name bar 4006 of Reset function block 4002) in the Reset Input window 4008 of safety output function block 4004. This name-based referencing mitigates the need to create a signal flow line between the Reset function block 4002 and the safety output function block 4004.

Figure 41:
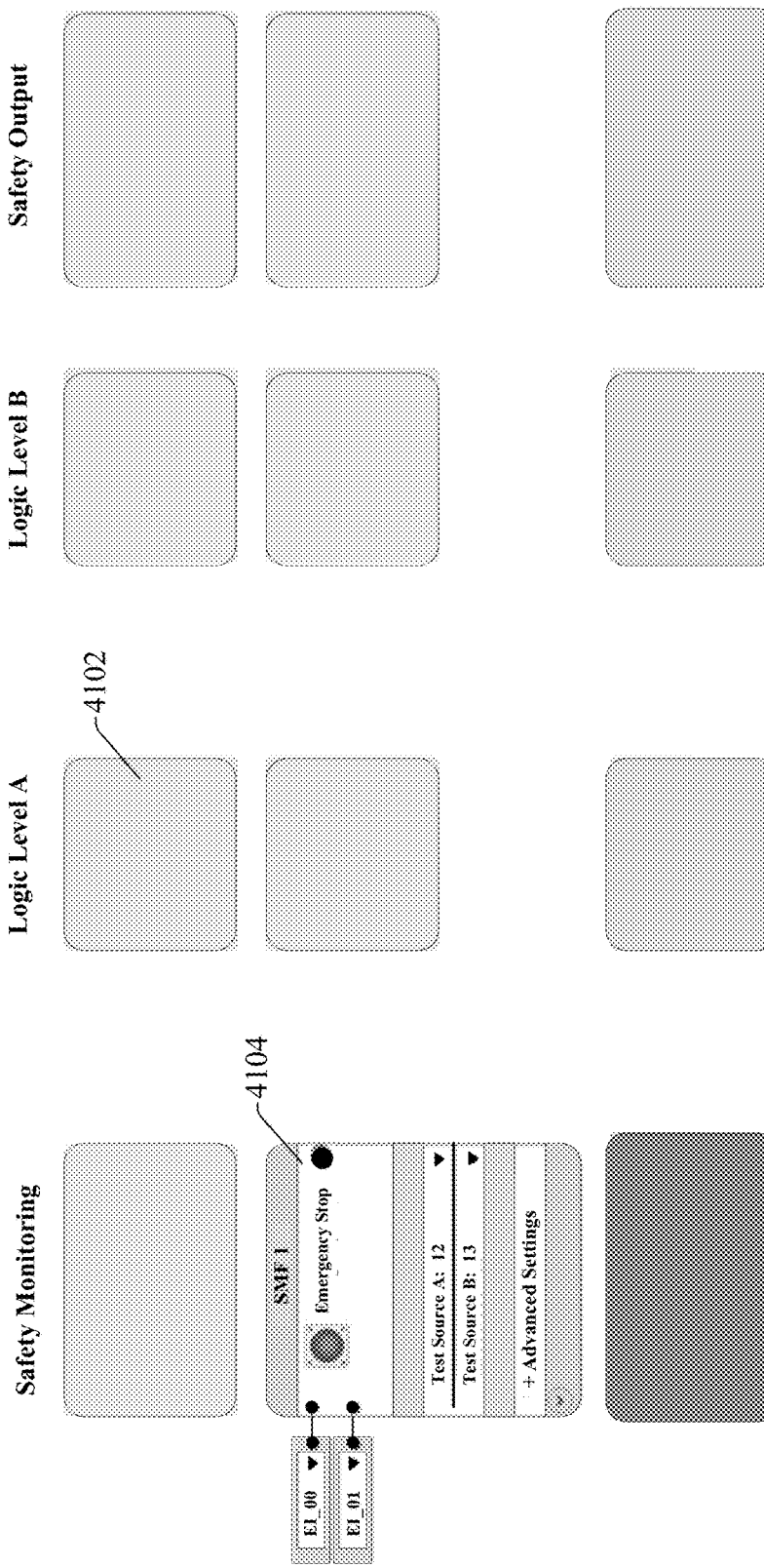
FIG. 41 illustrates a development environment in which available memory is represented by function block targets.

One or more embodiments of the safety monitoring configuration system can also provide a real-time graphical representation of an amount of memory consumed in the function block editor against a total available memory. As illustrated in FIG. 41, this can be achieved using a memory map in which available memory is represented as individual blank function block targets 4102. When a function block (e.g., function block 4104) is assigned to a blank function target, either by dragging-and-dropping the function block 4104 to the target or through other assignment means, the blank target disappears and the selected function block is displayed in its place. The label in the name bar of the function block (SMF 2) corresponds to the memory location of the function block. The number of available blank function block targets 4102 is analogous to the amount of remaining memory space available for addition of more function blocks. When all blank function block targets 4102 have received a function block assignments, no more function blocks can be added to the project intuitively convey an amount of available memory remaining for addition of function blocks to a project.

Figure 42:
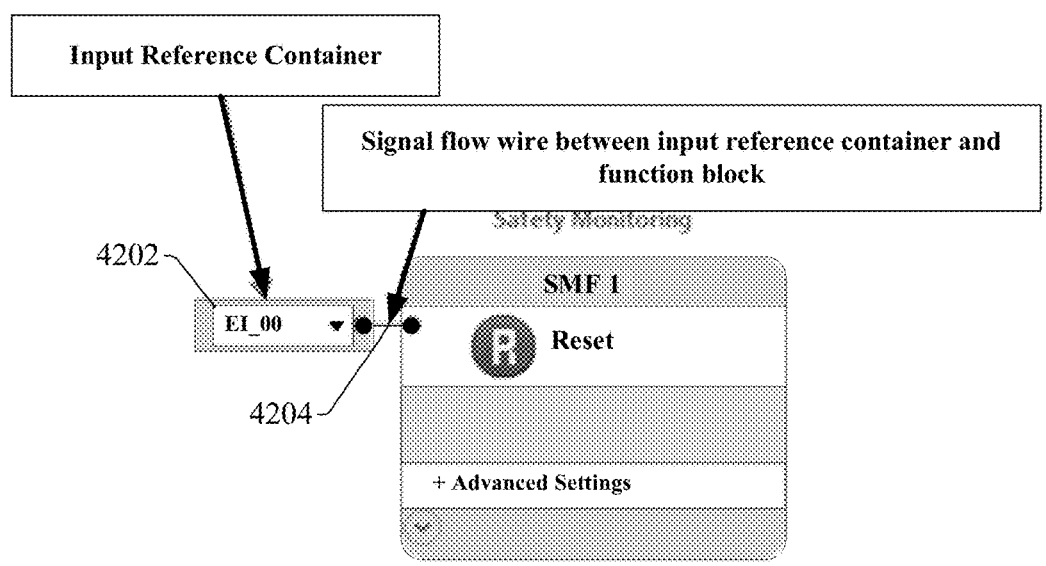
FIG. 42 illustrates automatic creation of an input reference container and a signal flow line when a safety monitoring function block is added to a safety relay configuration project.

In one or more embodiments, when a safety monitoring function block is added to a project, as illustrated in FIG. 42, an input reference container 4202 and a signal flow line 4204 between the input reference container 4202 and the function block can be automatically created. Automatically adding the input reference container and signal flow line in this manner can reduce the number of steps required to be taken by the user when adding and configuring a function block.

Figure 43:
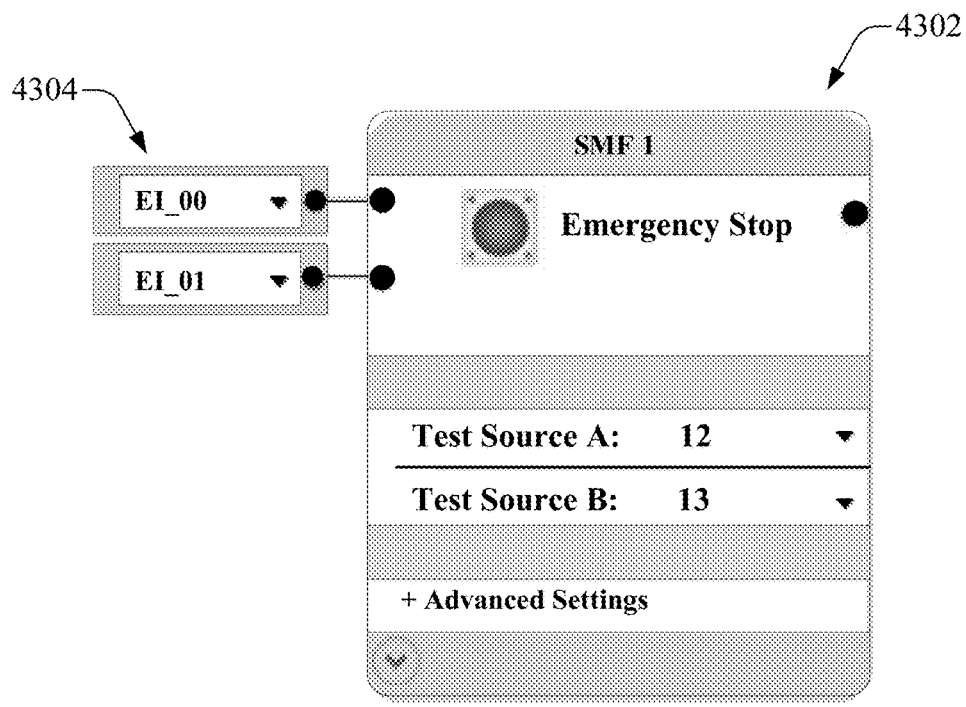
FIG. 43 illustrates automatic creation of multiple input reference containers and signal flow lines when a safety monitoring function block is added to a safety relay configuration project.
Figure 44:
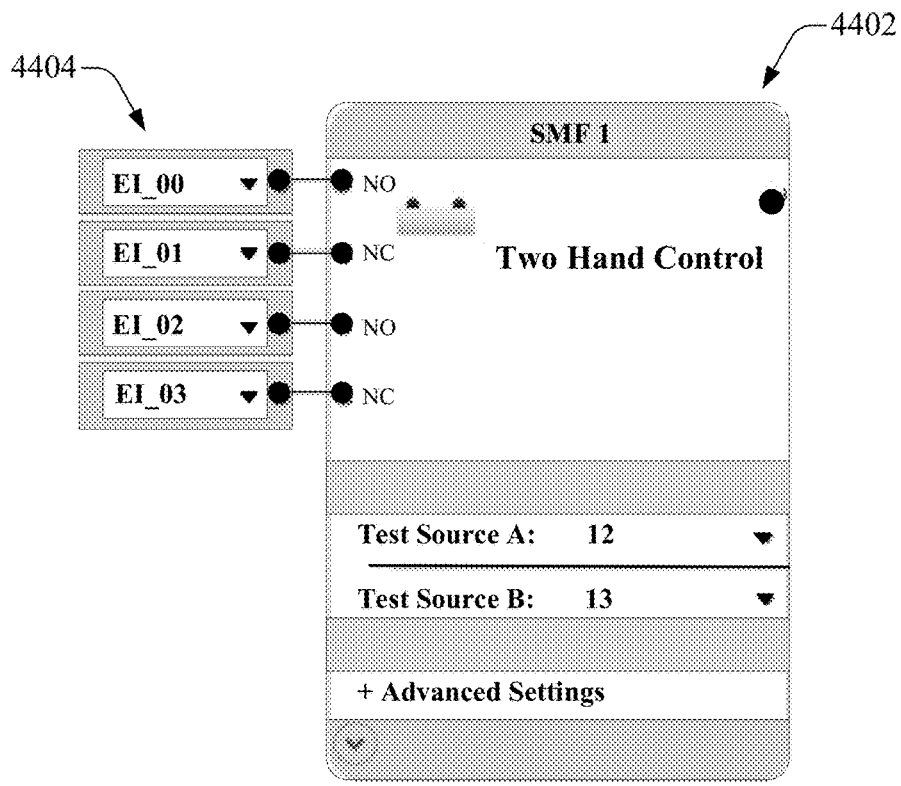
FIG. 44 illustrates automatic creation of multiple input reference containers and signal flow lines when a safety monitoring function block is added to a safety relay configuration project.

As illustrated in FIGS. 43 and 44, the number of input reference containers and associated signal lines that are automatically added to a function block is dependent on the number of inputs required by the function block. For example, safety monitoring function block 4302 in FIG. 43 is a two-channel device requiring two input assignments. Accordingly, to input reference containers 4304 and associated signal flow lines are automatically added to the function block. Similarly, safety input function block 4402 requires four inputs (two N.O. and two N.C. inputs), and so the development environment automatically adds four input reference containers 4404 and associated signal flow lines to when function block 4402 is added to the project. In addition, one or more embodiments of the safety relay configuration system can automatically assign available input terminals to the input reference containers when the function block is added.

Figure 45:
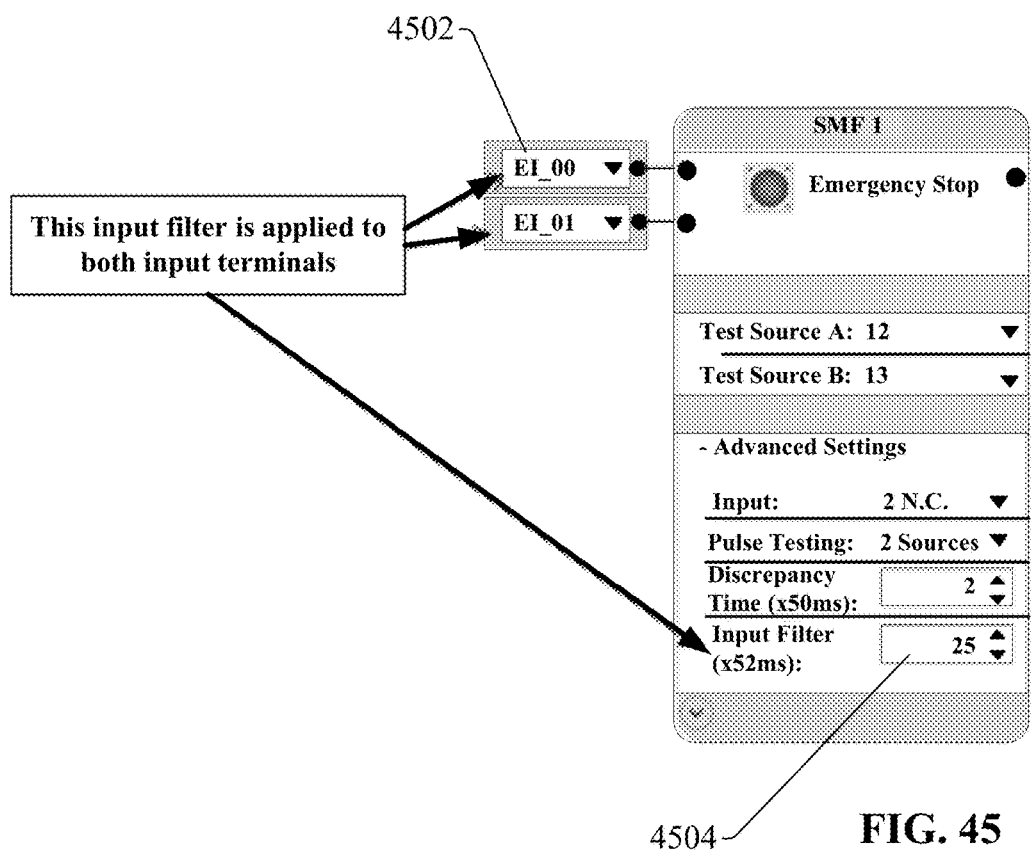
FIG. 45 illustrates setting of an input terminal's hardware configuration via a parameter setting on an associated function block.

In another aspect, certain function blocks supported by the safety monitor configuration system can include hardware configuration parameters for input terminals associated therewith. That is, once an input is assigned to a function block, as illustrated in FIG. 45, the input's hardware configurations can be set via parameter settings on the function block. This can be beneficial for safety relay configurations, since dual-channel safety monitoring functions require two input terminals (e.g., input terminals 4502) with identical filter times. By including an input filter parameter 4504 on the function block itself, the system enforces application of the same input filter for both terminals.

Figure 46A:
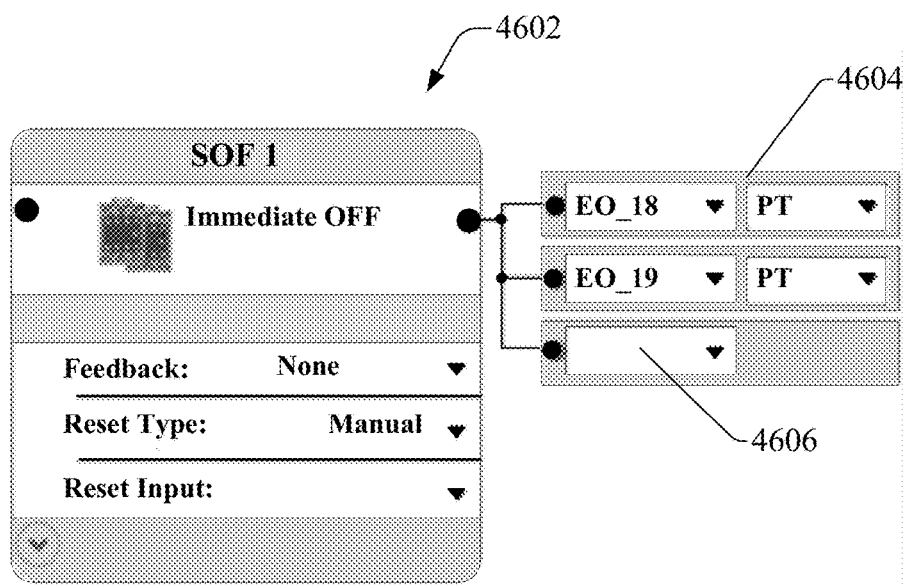
FIG. 46a illustrates automatic creation of output reference containers and associated signal lines when a safety output function block is added to a safety relay configuration project.
Figure 46B:
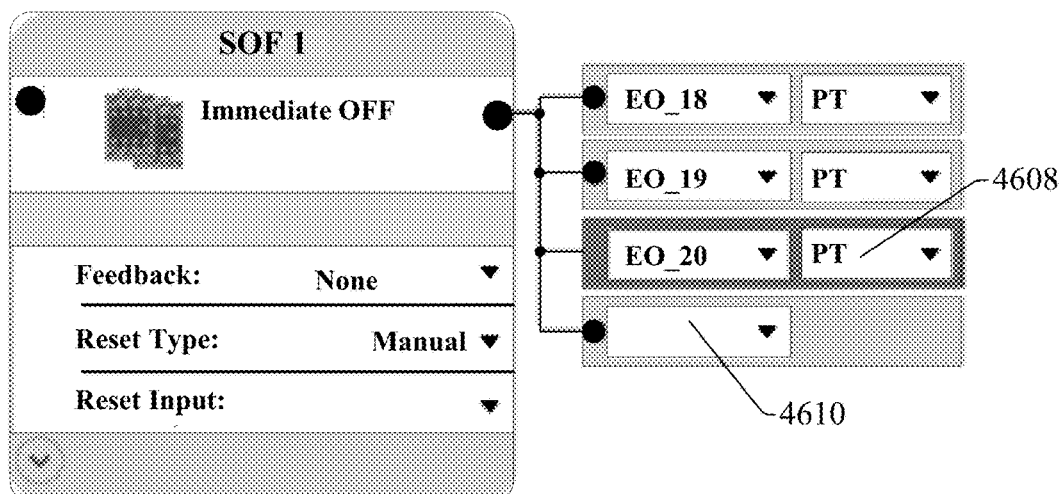
FIG. 46b illustrates automatic creation of a blank output reference container and associated signal line when a terminal is selected for an output of a safety output function block.

Similar to the input reference containers, the safety relay configuration system can also automatically create output reference containers and signal flow lines between the output reference containers and the function block when the function block is added to the project. As illustrated in FIG. 46*a*, output reference containers 4604 and associated signal lines are automatically created when function block 4602 is added to the project. In addition, a blank output reference container 4606 and associated signal flow line is added, allowing the user to associate an additional output terminal to the output of safety output function block 4602 if desired. If left blank, this blank output reference container 4606 has no impact on the safety logic. If a terminal selection is made for the blank output reference container 4606, an additional output reference container 4608 is added, as shown in FIG. 46*b*, and a new blank output reference container 4610 is added.

Figure 47:
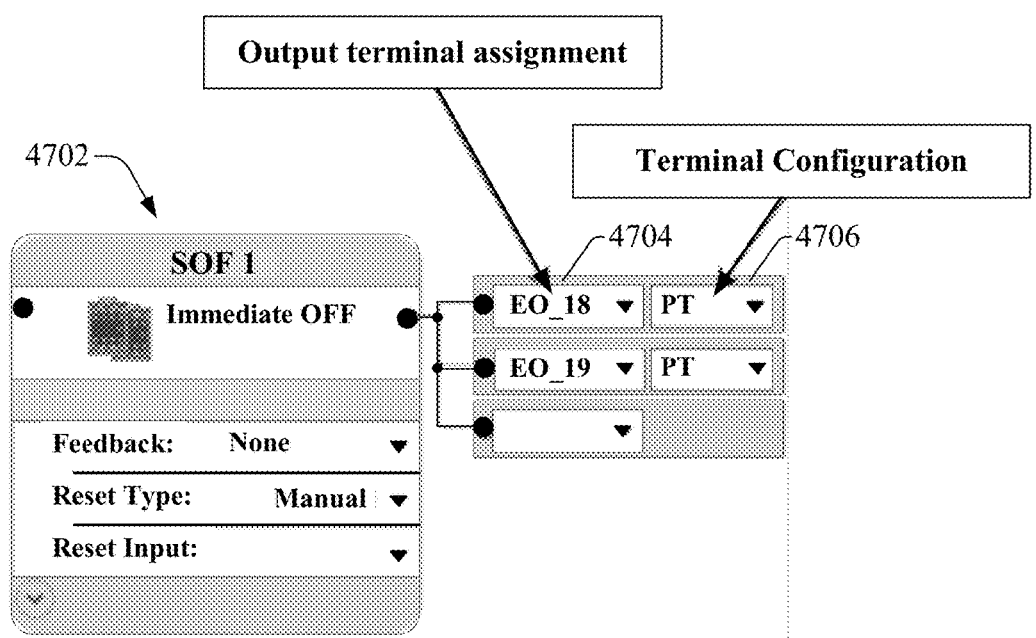
FIG. 47 illustrates a function block with controls that enable configuration of hardware-related behaviors for an assigned terminal.

As illustrated in FIG. 47, function blocks supported by the configuration system editing environment can include controls that enable not only assignment of an output terminal to an output of a safety output function block 4702, but also configuration of hardware-related behaviors for the assigned terminal. For example, combo box 4706 allows the user to enable or disable pulse testing for the output terminal assigned in output address container 4704. Combo box 4706 for configuration of the terminal's hardware characteristics can be dynamically updated to display only valid hardware configurations for the particular terminal selected in output address container 4704.

Figure 48:
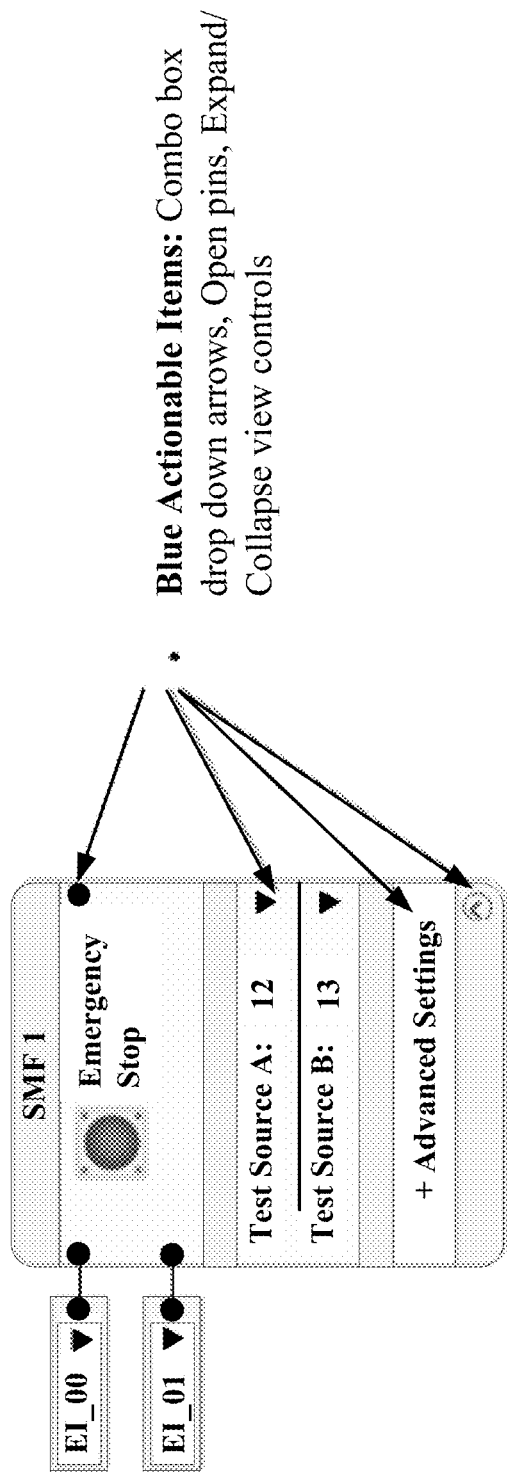
FIG. 48 illustrates actionable items on a function lock differentiated by color.

As illustrated in FIG. 48, actionable items on a function block within the logic editor can be differentiated with a distinguishable color to inform the user that the items can be selected or edited.

Figure 49:
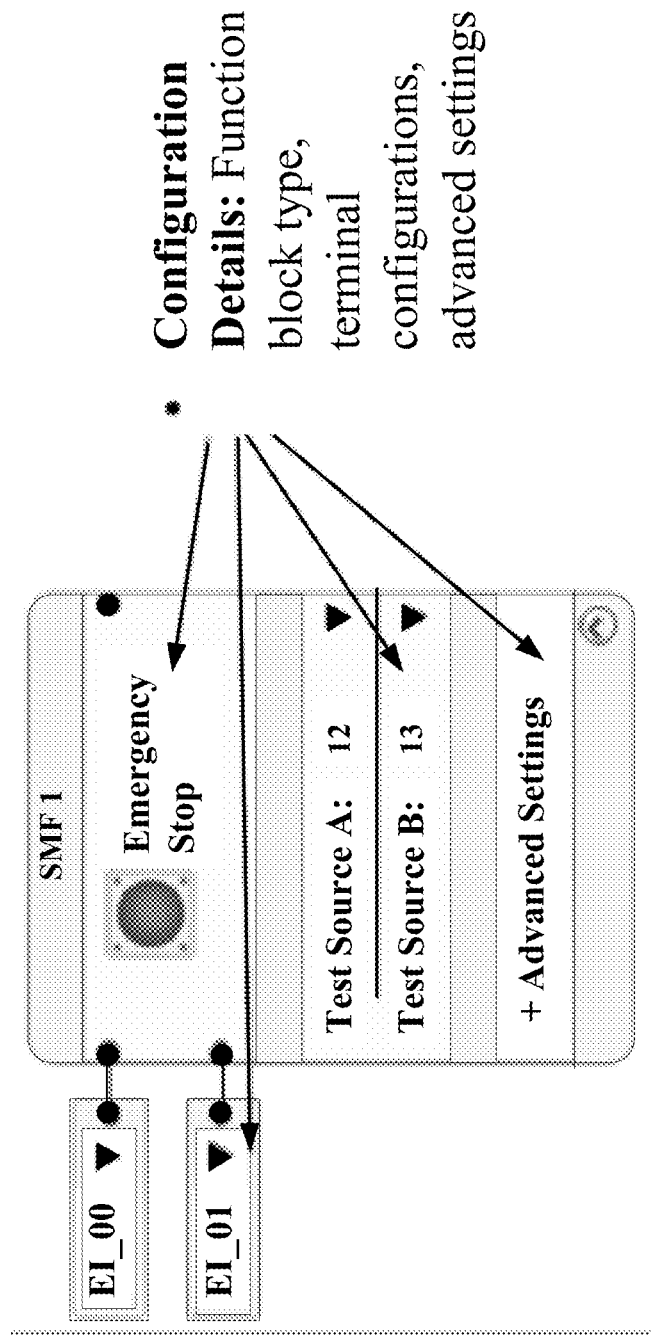
FIG. 49 illustrates organization of configuration parameters on a function block using segregated regions.
Figure 50:
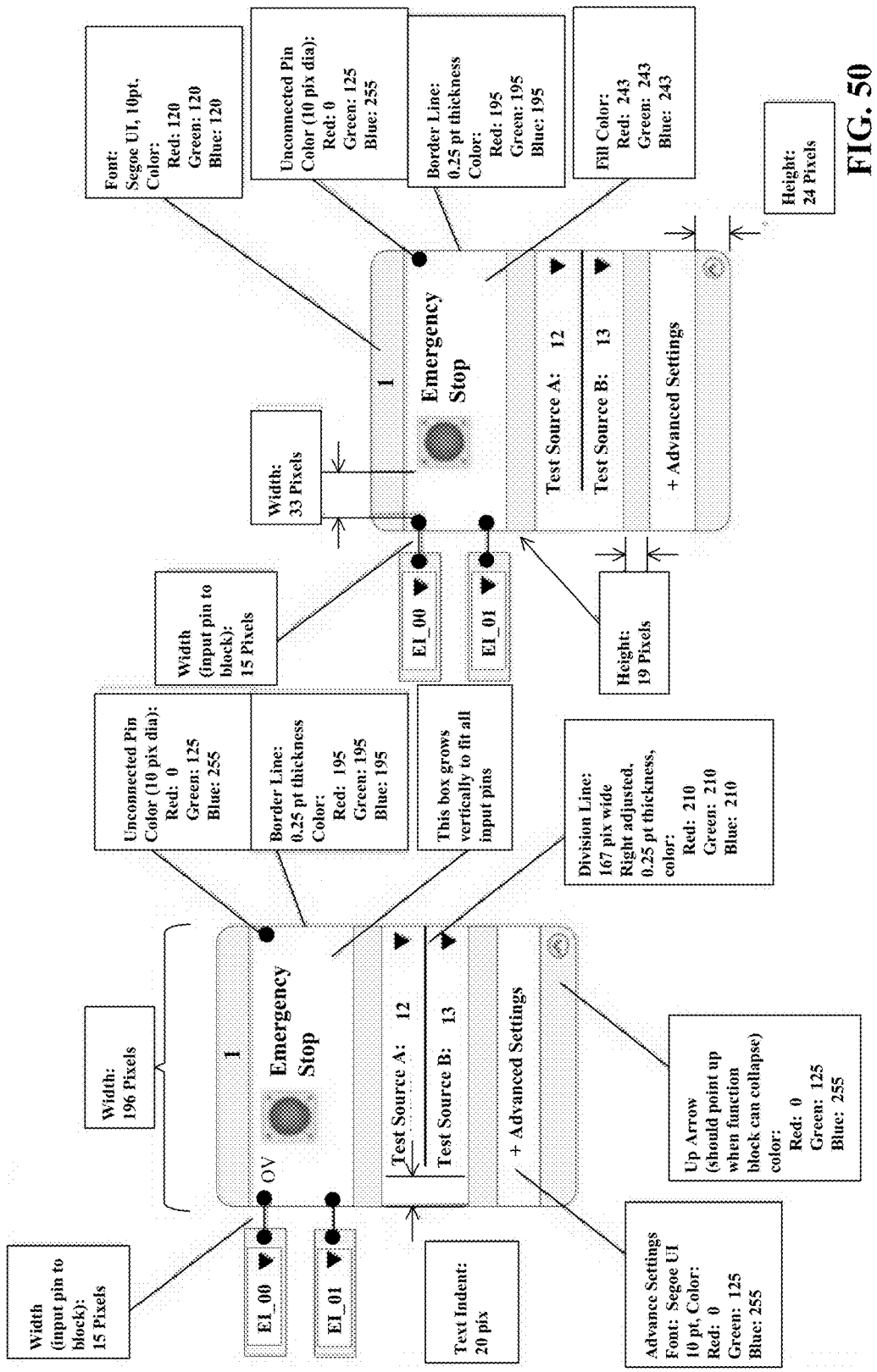
FIG. 50 illustrates an example function block color and dimensional design.

As illustrated in FIG. 49, the function blocks supported by the editing environment can be organized such that configuration parameters reside in white-banded regions that span the width of the function block, with grey bars separating selected configurable areas. FIG. 50 is an example, non-limiting function block color and dimensional design. It is to be appreciated, however, that the function block design is not limited to the particular colors and dimensions depicted in FIG. 50, and that alterations to this design are within the scope of one or more embodiments of this disclosure.

Figure 51A:
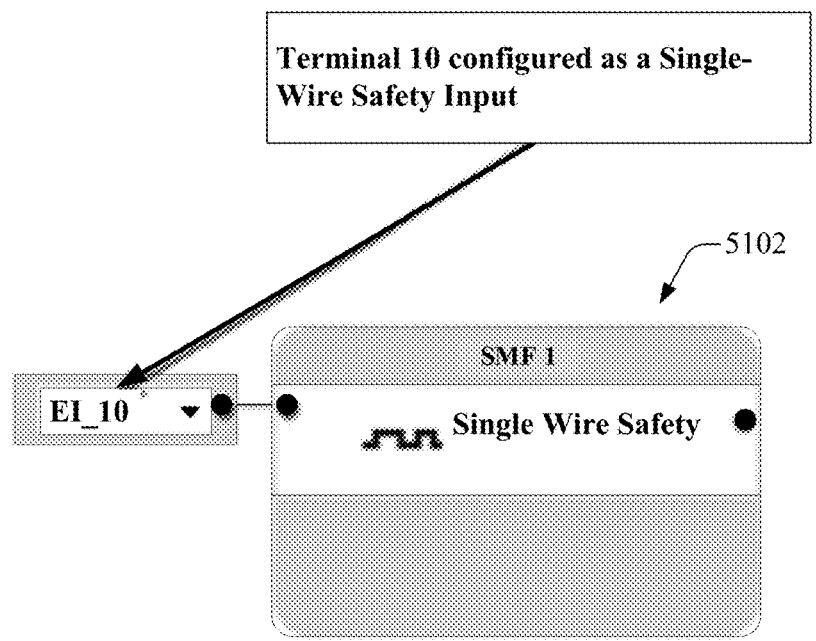
FIG. 51a illustrates automatic configuration of a multi-purpose terminal as a single-wire safety input.
Figure 51B:
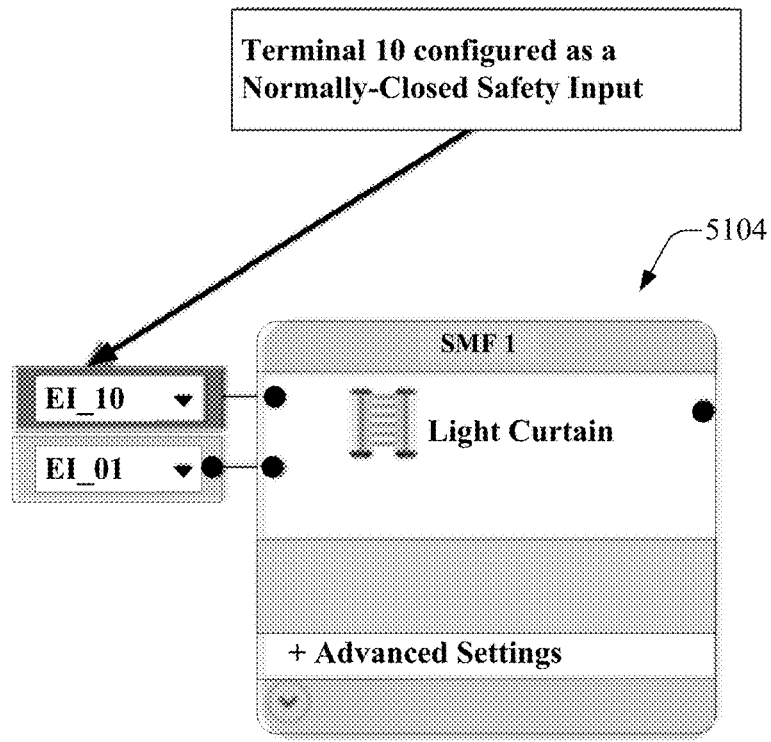
FIG. 51b illustrates configuration of a multi-purpose terminal as a normally-closed safety input.

Also, one or more embodiments of the safety relay configuration system can support multi-purpose terminals capable of acting as either a safety-rated input or a single-wire safety input based on the type of safety monitoring function to which the terminal is assigned. For example, as illustrated in FIG. 51a, since terminal EI_10 is assigned to the input of a Single-Wire Safety function block 5002, the terminal is configured as a single-wire safety input. If terminal EI_10 is alternatively assigned to the input of a Light Curtain function block 5104, as illustrated in FIG. 51b, the terminal is configured as a normally-closed safety input.

Figure 52A:
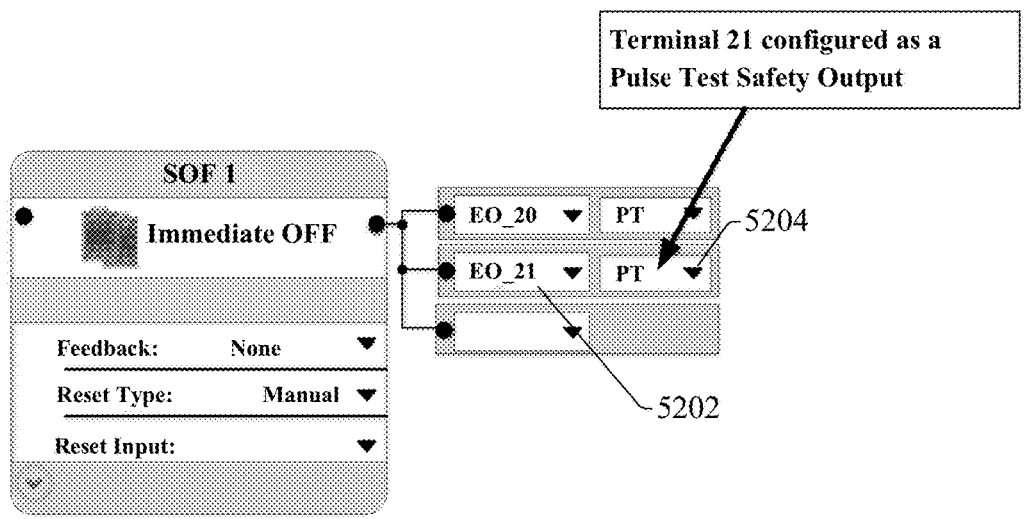
FIG. 52a illustrates configuration of a multi-purpose output terminal as a pulse test safety output.
Figure 52B:
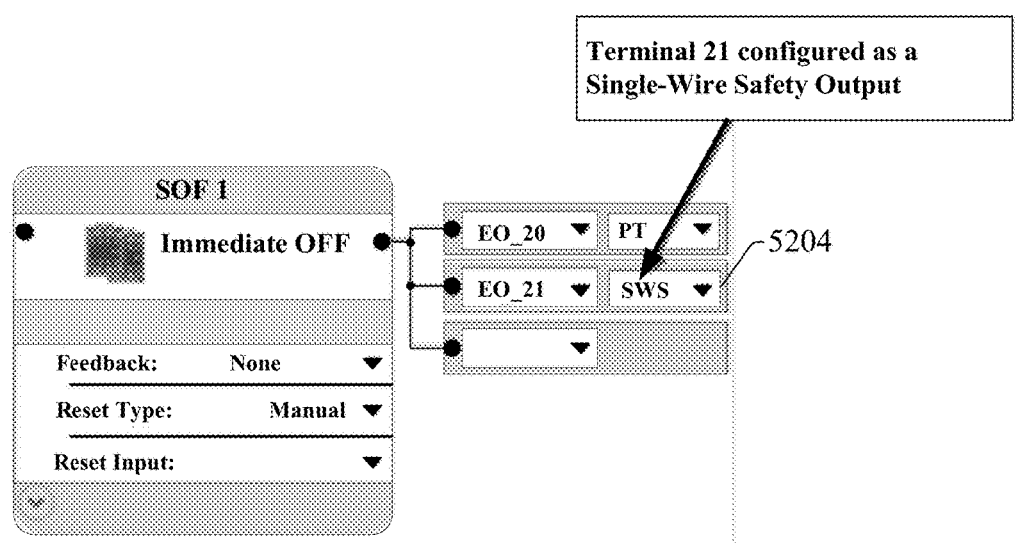
FIG. 52b illustrates configuration of a multi-purpose output terminal as a single-wire safety output.

Similarly, the system can also support multi-purpose output terminals capable of acting as safety-rated outputs or single-wire safety outputs depending on the hardware configuration selected for the output terminal on the function block. For example, in FIG. 52a, output terminal EO_21 is configured as a safety output with pulse testing, based on selection of "PT" in corresponding combo box 5204. If combo box 5204 is alternatively set to "SWS," as illustrated in FIG. 52b, output terminal EO_21 is configured as a single-wire safety output.

Figure 53A:
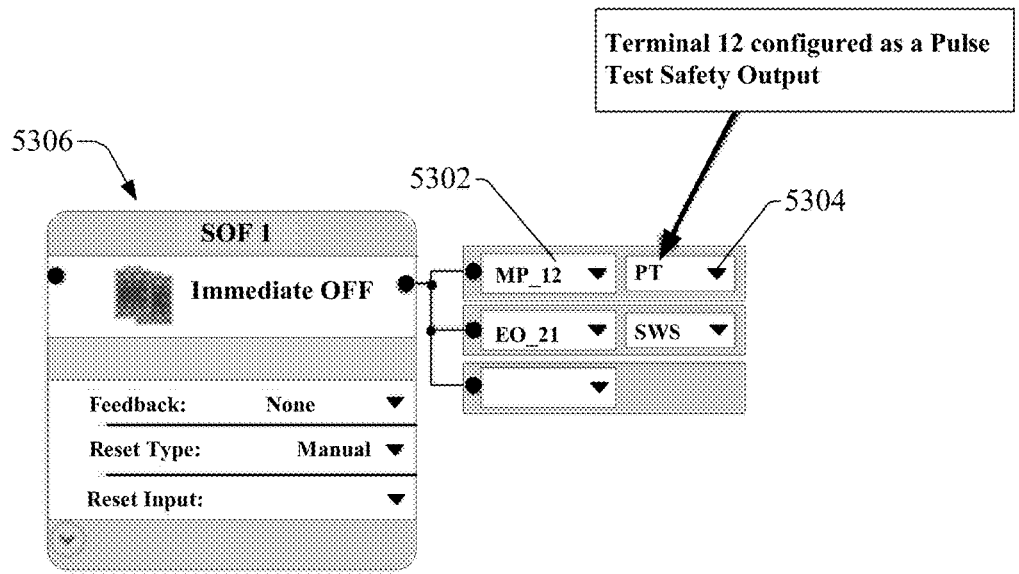
FIG. 53a illustrates configuration of a multi-purpose terminal as a safety output with pulse testing.
Figure 53B:
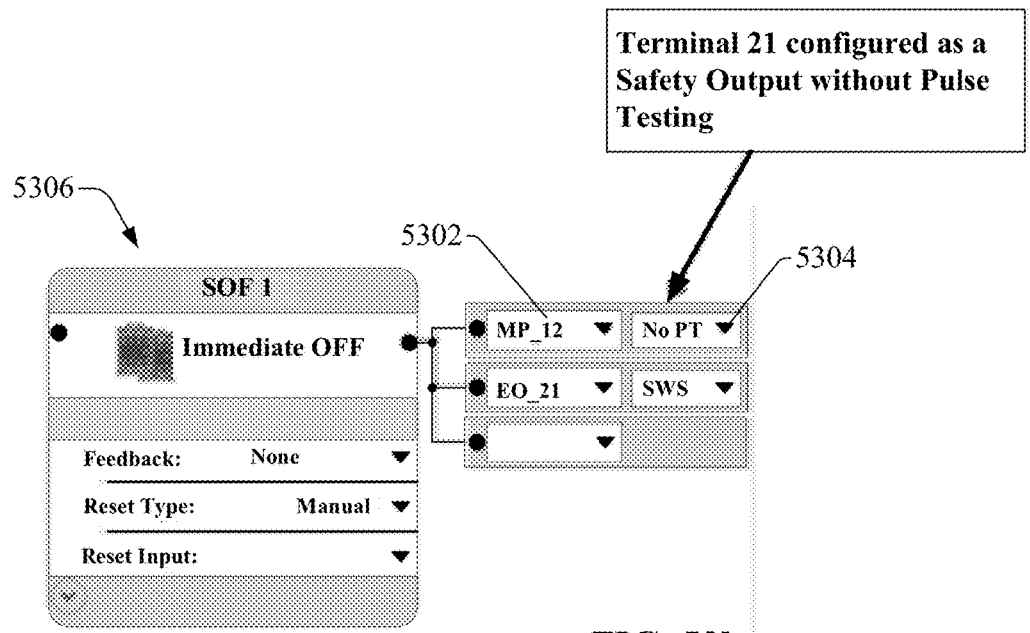
FIG. 53b illustrates configuration of a multi-purpose terminal as a safety output without pulse testing.

In another example, a multi-purpose terminal can be configured to act as either a safety-rated normally-closed input, a safety-rated normally open input, a safety-rated output with pulse testing, a safety-rated output without pulse testing, or as a test pulse terminal depending on either hardware configuration parameters set for the terminal via the function block, or on the particular type of function block to which the multi-purpose terminal is assigned. For example, in FIG. 53a, multi-purpose terminal MP_12 is assigned as an output to a safety output function 5306 by selection of the terminal in output address combo box 5302, and is configured as a safety output with pulse testing by selection of "PT" (pulse test) in hardware configuration combo box 5304. In FIG. 53b, terminal MP_12 is alternatively configured as a safety output without pulse testing by selecting "No PT" in combo box 5304.

Figure 53C:
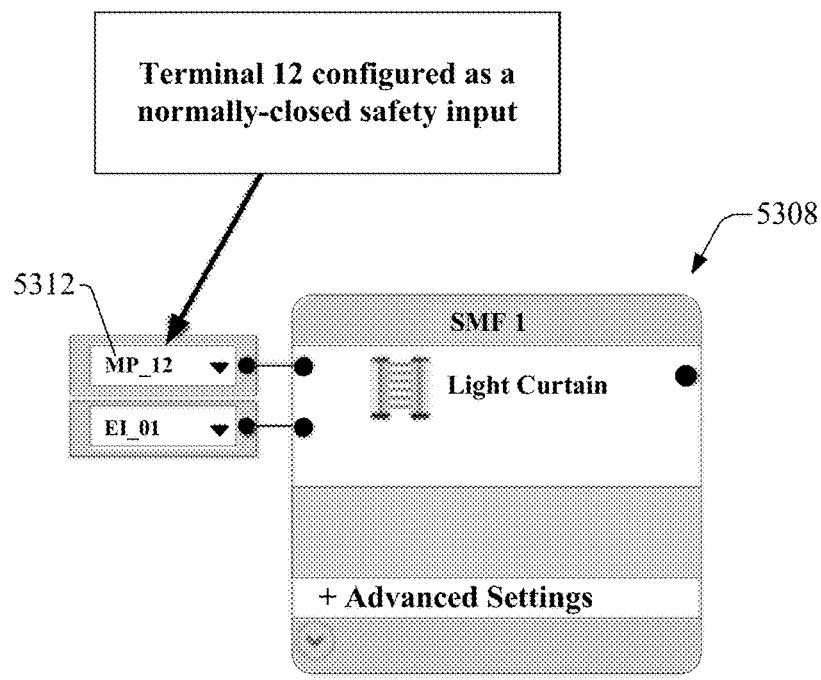
FIG. 53c illustrates configuration of a multi-purpose terminal as a normally-closed safety input.
Figure 53D:
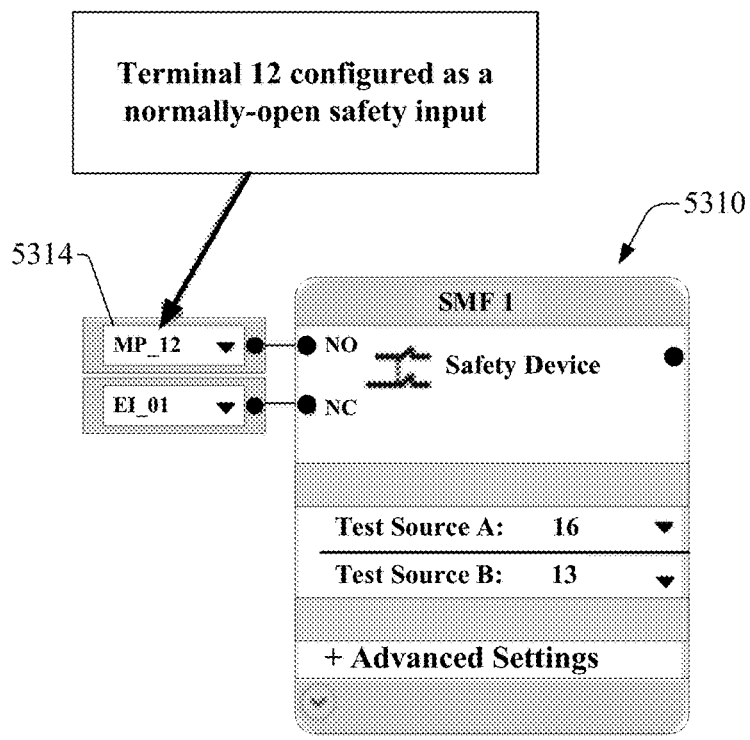
FIG. 53d illustrates configuration of a multi-purpose terminal as a normally-open safety input.
Figure 53E:
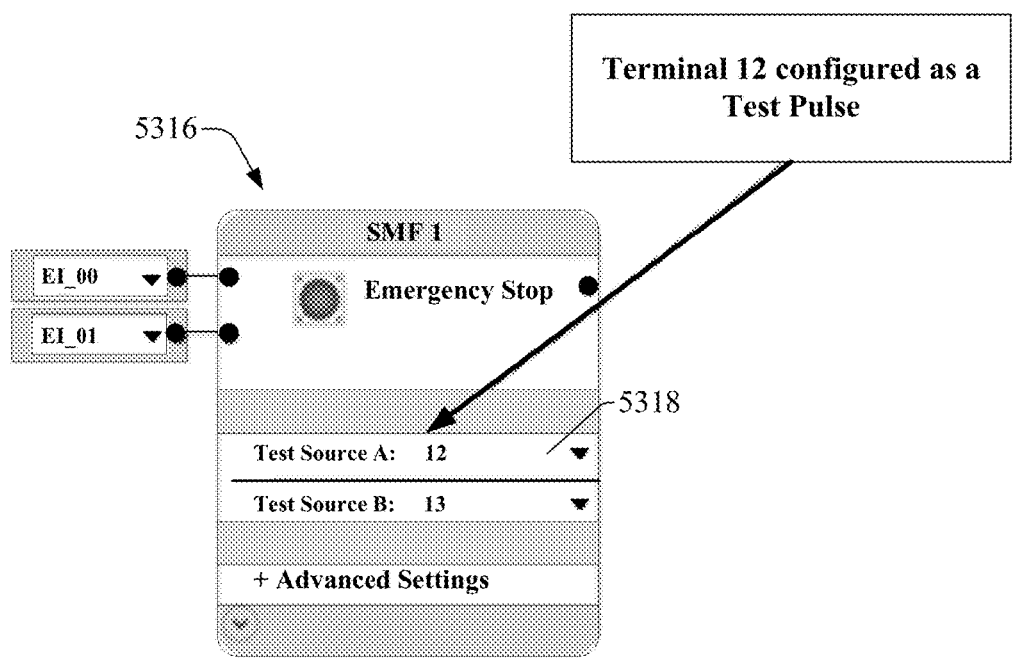
FIG. 53e illustrates configuration of a multi-purpose terminal as a test source.

In FIG. 53c, multi-purpose terminal MP_12 is configured as a normally-closed safety input when the terminal is assigned to an input of a light curtain safety monitoring function block 5308 using input address combo box 5312. In FIG. 53d, terminal MP_12 is configured as a normally-open safety input when the terminal is assigned to a normally open (N.O.) input of a Safety Device safety monitoring function block 5310 using input address combo box 5314. In FIG. 53e, multi-purpose input terminal MP_12 is configured as a test source when the terminal is assigned to Test Source A of safety monitoring function block 5316 using combo box 5318. Thus, the safety relay configuration system allows a multi-purpose terminal of the safety relay to be easily configured to perform one of multiple functions through assignment and/or configuration of the terminal directly on a function block in the editing environment.

Figure 54:
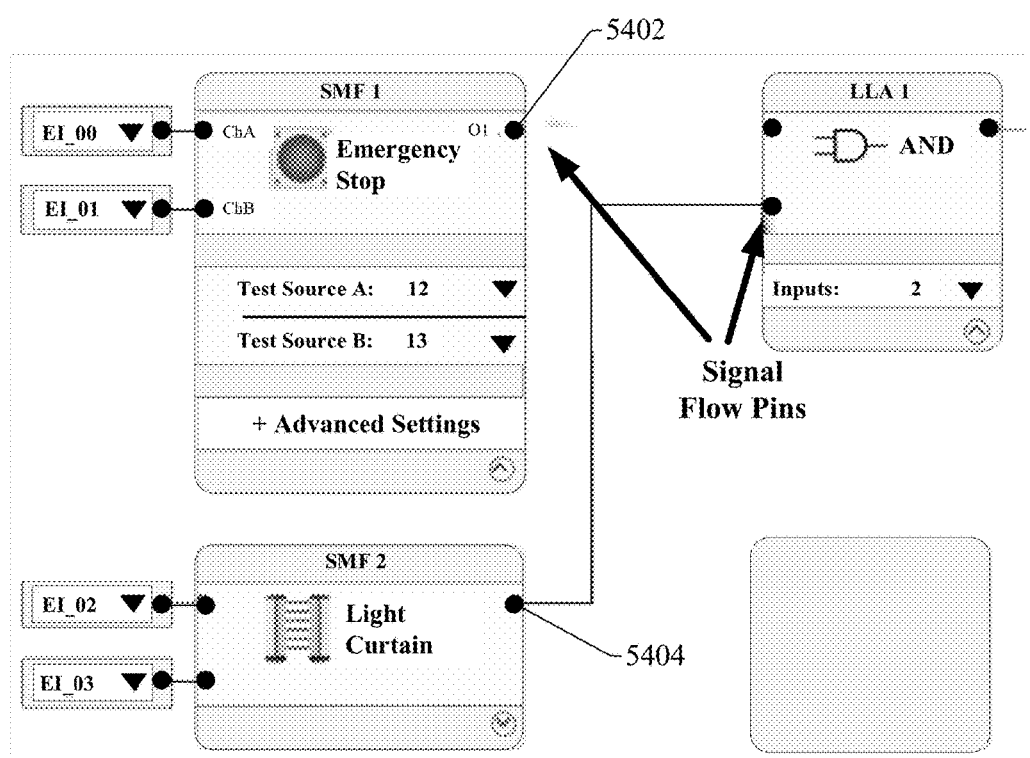
FIG. 54 illustrates function blocks comprising circular signal flow wiring pins.

As illustrated in FIG. 54, each function block can comprise circle-shaped signal flow wiring pins representing input and output points that can be connected on a function block. The circular wiring pins can be inset and located such that the edge of the pin touches the border of the function block. Unassigned pins, such as pin 5402 can be colored differently than pins that have been assigned, such as pin 5404. For example, unassigned pins can be colored blue, while connected pins can be colored grey.

As noted above, some safety relays supported by the safety relay configuration system described herein can support addition of plug-in expansion modules (see FIG. 39) configured with additional input and/or output terminals, thereby increasing the number of available terminals for monitoring or output functions. Accordingly, one or more embodiments of the configuration system can automatically map expansion I/O as available terminals in the function block editing environment. This mitigates the need to perform an additional action to map hardware to memory registers before they can be assigned in a logic editor.

Figure 55A:
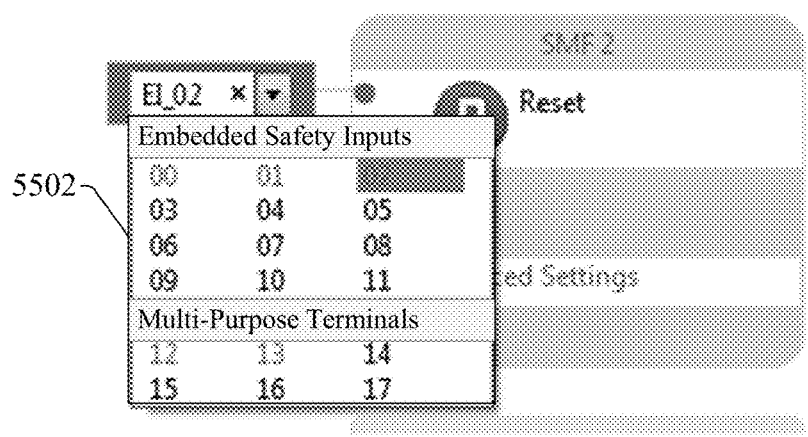
FIG. 55a illustrates an open address selection combo box for a function block when no expansion I/O is configured.
Figure 55B:
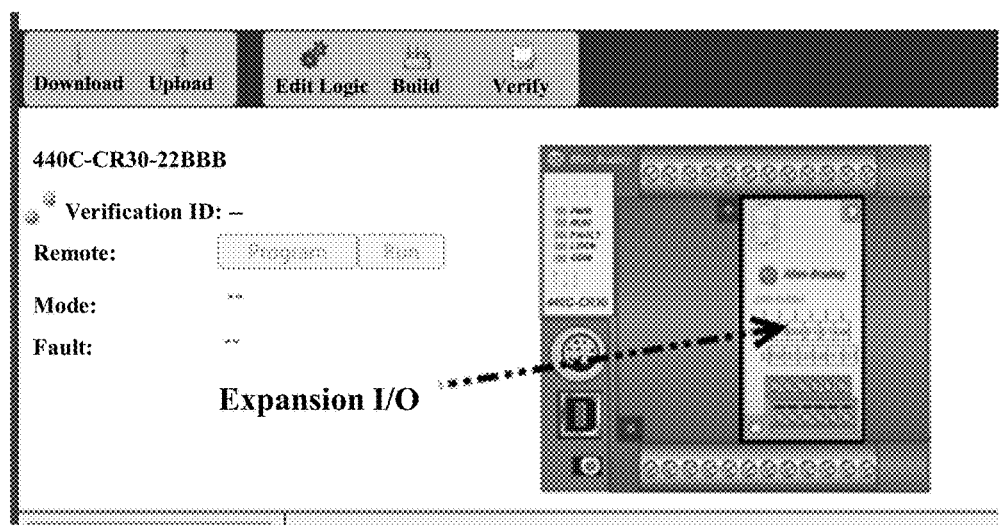
FIG. 55b illustrates addition of expansion I/O to a safety relay using the safety relay configuration system.
Figure 55C:
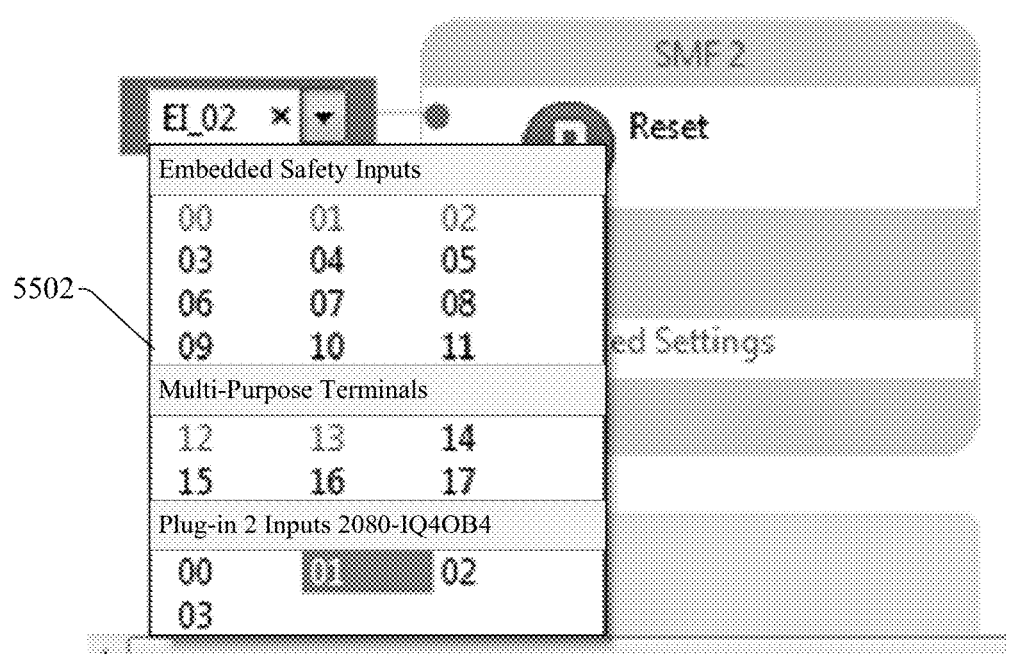
FIG. 55c illustrates addition of plug-in I/O to a terminal selection combo box.

To demonstrate this, FIG. 55a illustrates an open address selection combo box 5502 for a function block when no expansion I/O is configured (i.e., no expansion plug-in module is configured for the project). Since there is no available expansion I/O, only embedded I/O terminals (embedded safety input terminals and multi-purpose terminals) are displayed in the combo box. To configure expansion I/O corresponding to a plug-in module added to the safety relay, the user can add the expansion I/O to the hardware view, as shown in FIG. 55b. Once configured in this manner, the I/O terminals of the plug-in module are made available as valid selections in their own new category in combo box 5502, as shown in FIG. 55c. The act of selecting one of the terminals creates the configuration mapping, as opposed to requiring a separate user action to set up the mapping.

Figure 56:
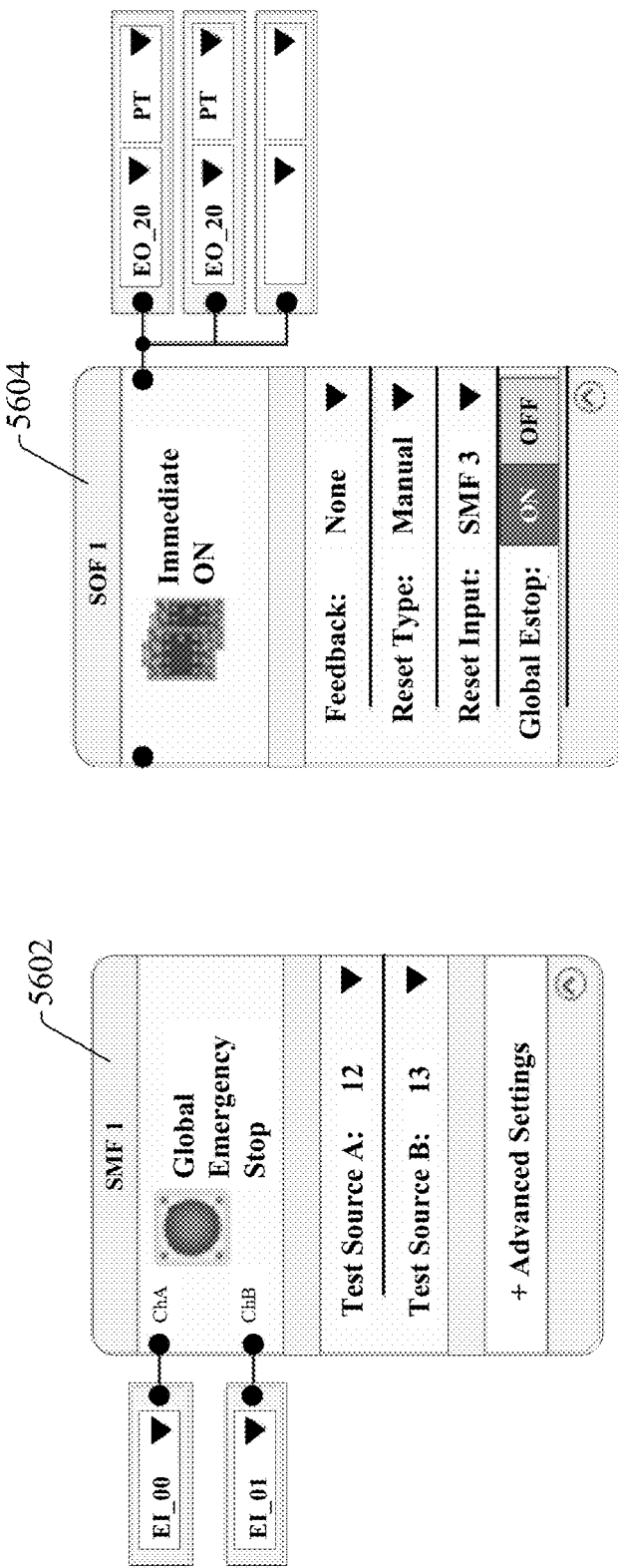
FIG. 56 illustrates a Global Emergency Stop function block.

One or more embodiments of the safety relay configuration system can also support a Global Emergency Stop function block. An example Global Emergency Stop function block 5602 is illustrated in FIG. 56. Any safety output function block—such as function block 5604—that is enabled to monitor Global Emergency Stop function block 5602 will go to the safe state (OFF) in the event the Global Emergency Stop function block 5602 is not Active (ON). Since most safety applications require an emergency stop, this functionality enables the user to eliminate a logical AND of the emergency stop with other monitored input conditions.

Figure 57:
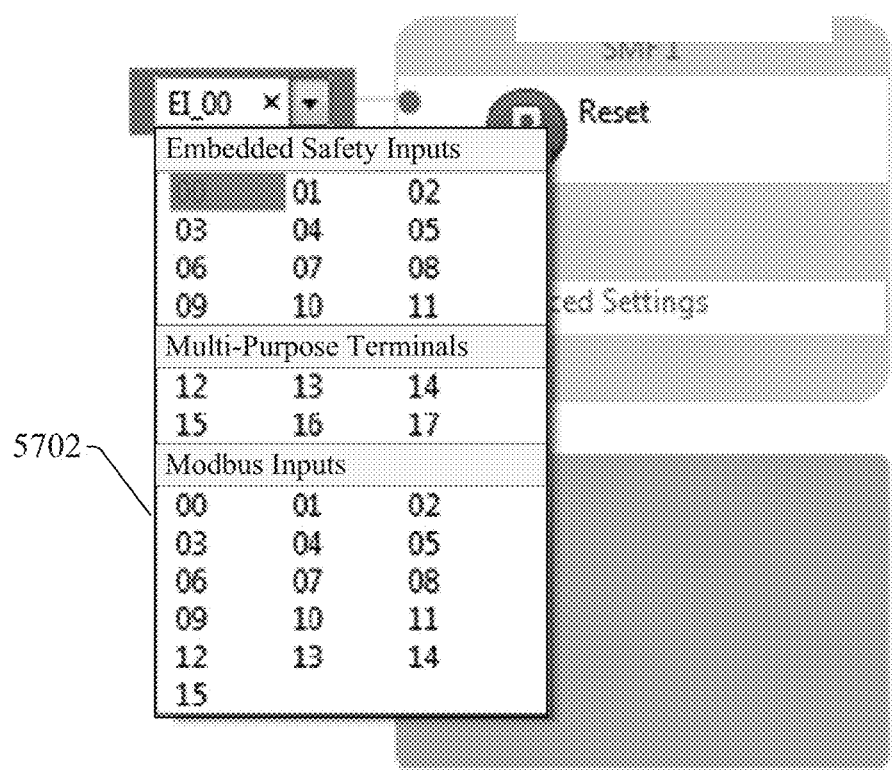
FIG. 57 illustrates an address selection combo box that includes a category for Modbus inputs.

Some embodiments of the safety relay configuration system can also support creation of Modbus input coils that can always be assigned in the safety logic editor. FIG. 57 illustrates an open address selection combo box 5702 that includes a category for Modbus inputs. As a result of this functionality, the user does not have to create the Modbus input registers; rather, the Modbus input registers are always available as selection. The consequence of assigning a coil that is not actually written to by another Modbus device is insignificant, since the coil will always stay at a value of 0, the safe state of the safety relay.

FIG. 58 illustrates pre-mapped registers of status information for all permutations of logic configurable on the safety editor. This is possible because every function block on a safety editor must map to a pre-defined memory location. This memory map is always present in the Modbus map. The consequence of requesting status from a function block register that was never assigned in the editor does not adversely effect the configuration since the function block status will always be off (0).

Figure 59:
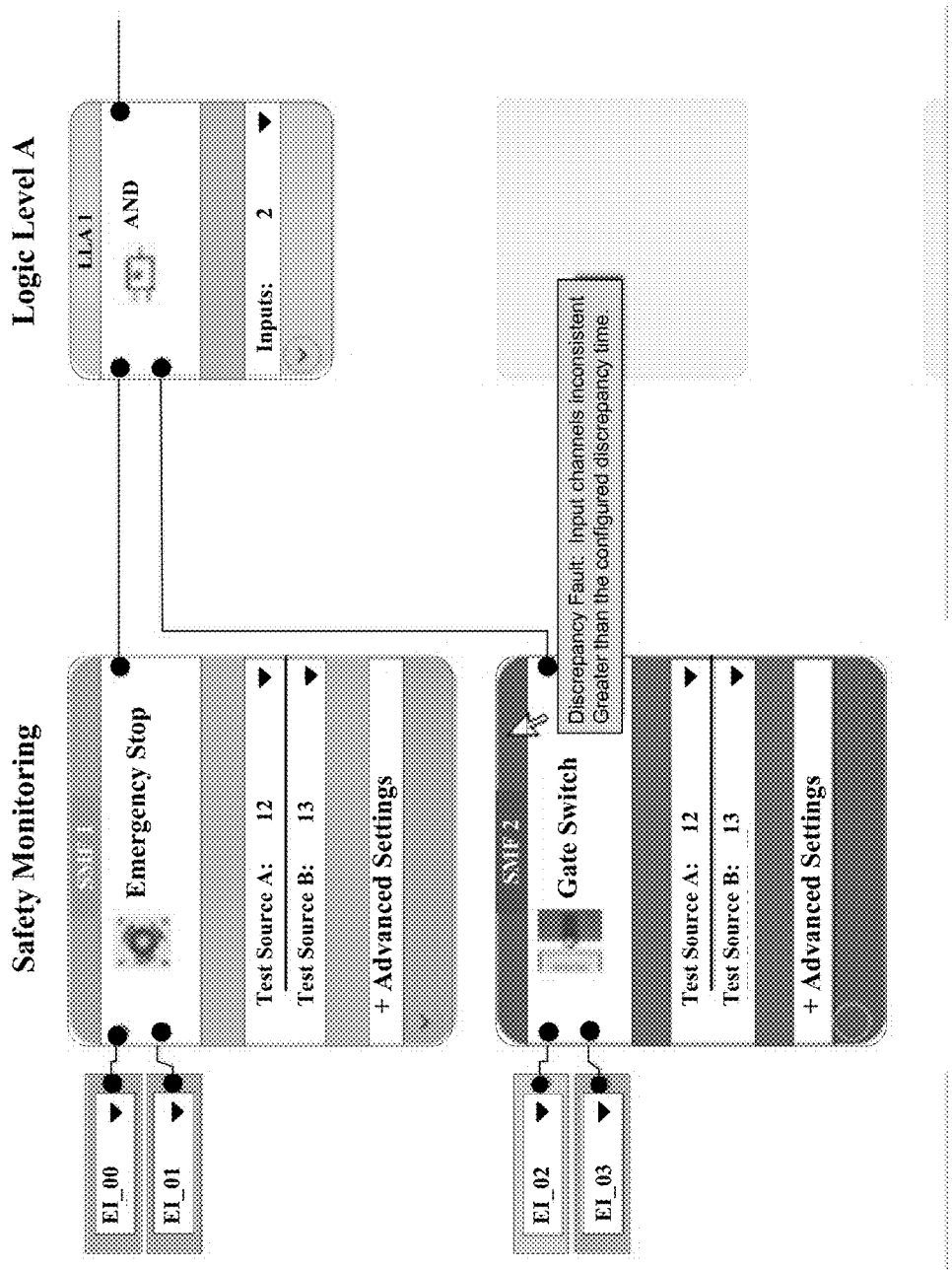
FIG. 59 illustrates display of tooltip information when a cursor is hovered over a function block.
Figure 60:
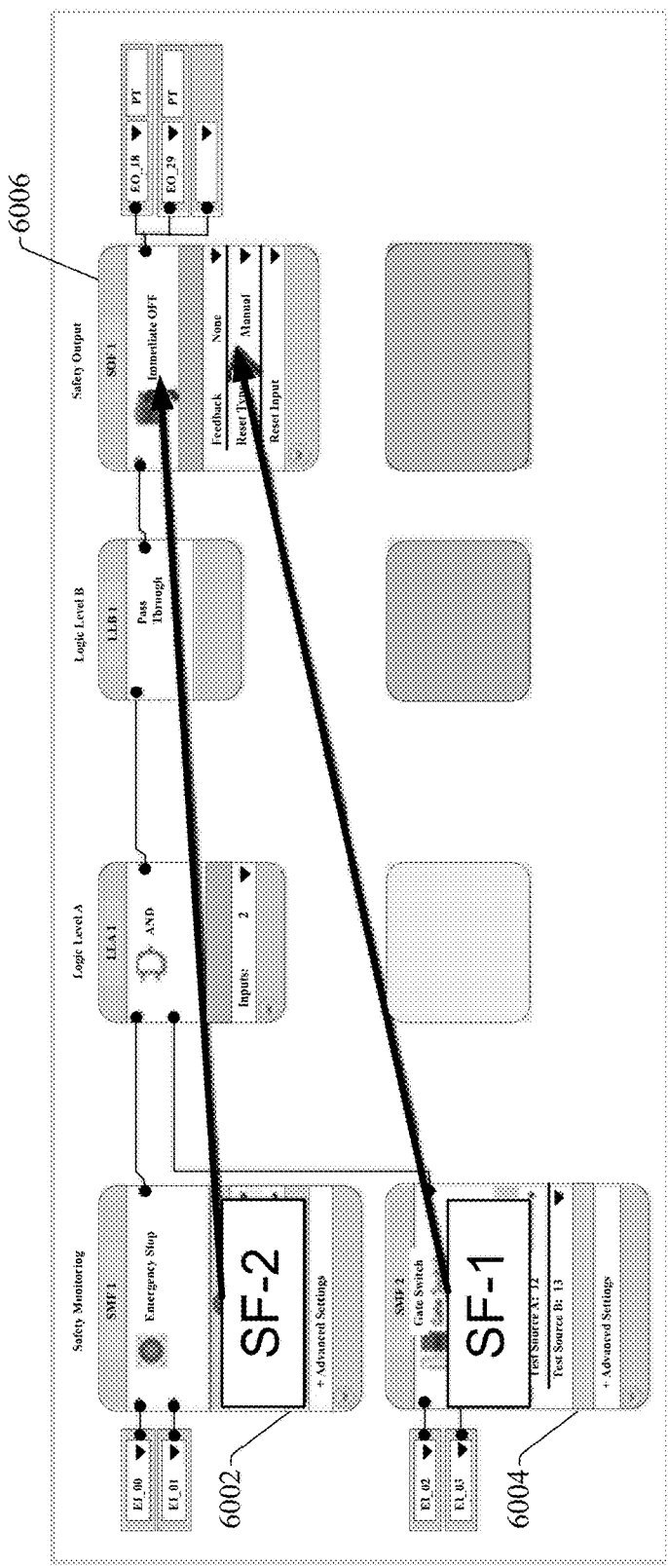
FIG. 60 illustrates tracing of safety monitoring functions to a safety output function.

The safety relay configuration system can also be configured to dynamically change the tooltip that displays when hovering a cursor over a function block based on the state of the function block. For example, information relating to fault conditions associated with a function block while monitoring the safety relay during runtime can be displayed in a tooltip window when the cursor is hovered over the function block, as illustrated in FIG. 59. Function blocks can also be configured to change red in color in response to detection of a fault condition associated with the function blocks. When the function block is not experiencing an alarm condition, the tooltip can instead display a message indicating the function of the function block.

Also, embodiments of the safety relay configuration system can include an export feature that exports safety configuration logic to a safety function list. In this way, a list of safety functions can be derived from a safety logic configuration created in the logic editor. Since each safety monitoring function represents a monitored safety device on a machine, and each safety output function represents the final control element on a machine, each safety function on the machine can be identified by tracing each safety monitoring function (e.g., safety monitoring function blocks 6002 and 6004 of FIG. 60) to each safety output function it acts on in the logic configuration (e.g., safety output function block 6006). The result can be exported by the configuration system, allowing the user to easily document the safety-related functions for their machines. FIG. 61 illustrates a portion of example safety function documentation resulting from the mapping and exporting.

Figure 62A:
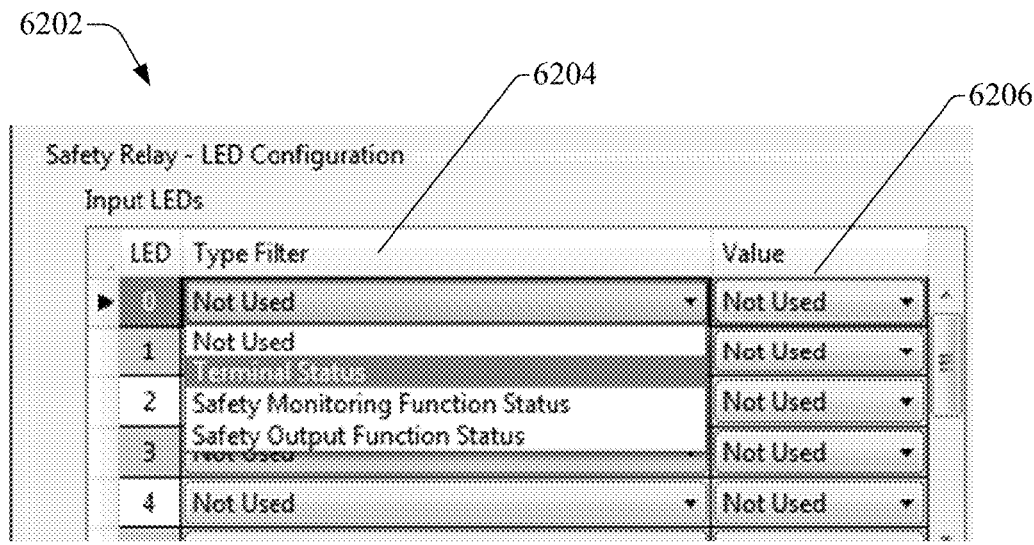
FIG. 62a illustrates an example LED configuration interface that can be invoked within the development environment of the safety relay configuration system.
Figure 62B:
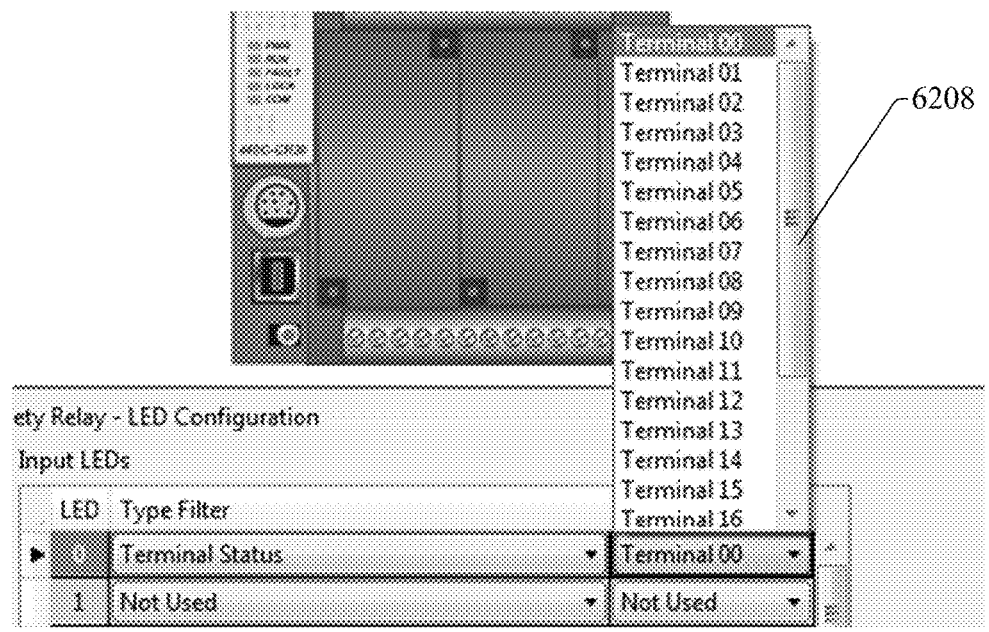
FIG. 62b illustrates filtering of available LED configuration options using a type filter setting.

One or more embodiments of the safety relay configuration system can also support configuration of safety relay LED (light emitting diode) indicators. In this way, users can configure LEDs of the safety relay, via the relay configuration system, to enunciate user-defined status conditions. FIG. 62a illustrates an example LED configuration interface 6202 that can be invoked within the development environment of the safety relay configuration system. Using this LED configuration interface 6202, the user can configure one or more LEDs on the safety relay to reflect a user-defined status. To simplify the LED configuration process, the LED configuration interface 6202 includes a Type Filter column 6104 that allows the user, for a given LED, to first select one of several status groupings (e.g., Terminal Status, Safety Monitoring Function Status, Safety Output Function Status, etc.). After a status grouping is selected, a specific list related to the selected status grouping is presented in the corresponding Value combo box 6206. FIG. 62b illustrates an example scenario in which Terminal Status is selected as the Type Filter for LED 0. Accordingly, when the Value combo box for LED 0 is expanded, a list of terminals 6208 available on the safety relay is displayed. Selection of a terminal from the list of terminals 6208 configures LED 0 to control its state based on the status of the selected terminal. By allowing the user to configure the behavior of individual LEDs on the safety relay, the safety relay configuration system affords a greater degree of flexibility in communicating the status details through the LEDs compared with traditional fixed LED function mapping.

Figure 63A:
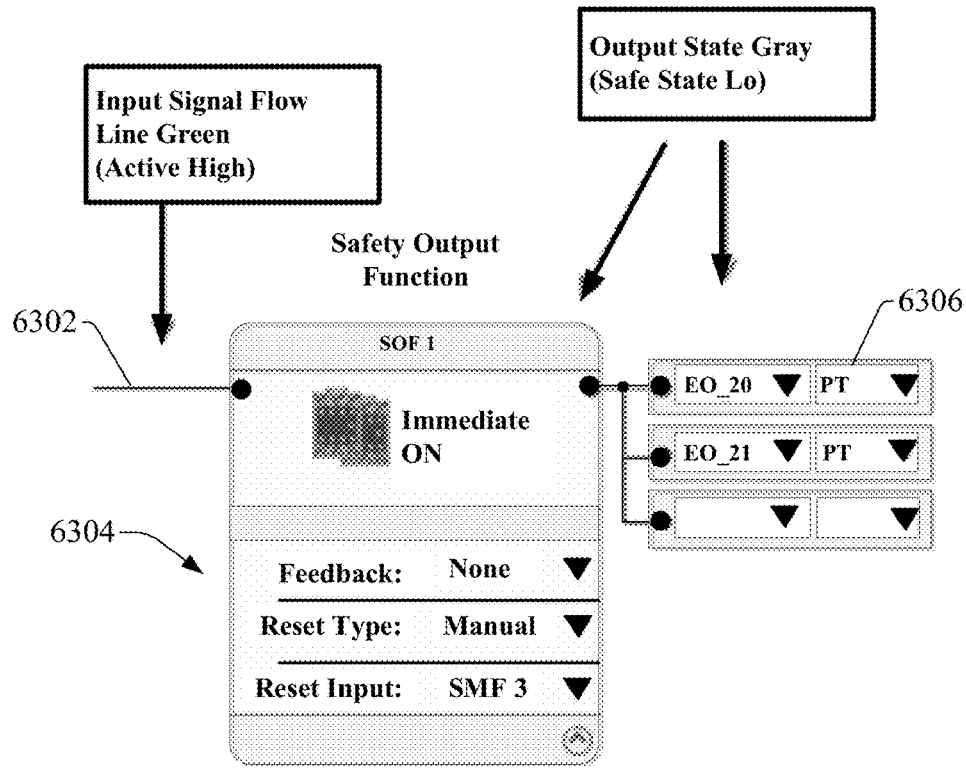
FIG. 63a illustrates color-coding of a signal flow line when all required input conditions for an associated safety output function block are satisfied.
Figure 63B:
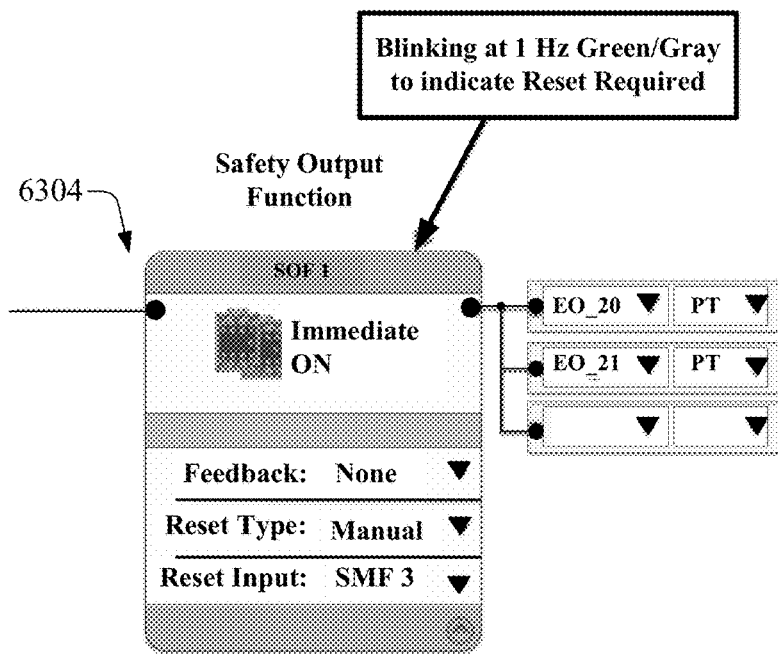
FIG. 63b illustrates blinking of a safety output function block to indicate that the associated safety circuit is ready to be reset.

As noted above, the safety relay configuration system can also be used to monitor the safety relay logic during runtime after the relay logic has been developed and downloaded to the safety relay. The monitoring interface can include a number of graphical features that can help the user to quickly assess the current status of the safety system. For example, during runtime monitoring, the system can cause a safety output function block to blink between two different colors (e.g., gray and green) when the safety circuit associated with the safety output function block is in condition to be reset but is awaiting a reset command. This scenario occurs when all required input conditions for the safety circuit are satisfied, but the reset command has not yet been received from the user. As illustrated in FIG. 63a, the system can cause the input signal flow line 6302 connected to the input of safety output function block 6304 to turn green when all required input conditions for the safety output function block 6304 are satisfied. The outputs 6306 of safety output function block 6304 remain gray (not energized) since the reset signal has not yet been received. To alert the user that the safety circuit associated with safety output function block 6304 is ready to be reset, the system can cause the function block to blink between two colors (e.g., green and gray) to indicate that a reset is required before the outputs 6306 will energize, as illustrated in FIG. 63b.

Embodiments, systems, and components described herein, as well as industrial control systems and industrial automation environments in which various aspects set forth in the subject specification can be carried out, can include computer or network components such as servers, clients, programmable logic controllers (PLCs), communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC as used herein can include functionality that can be shared across multiple components, systems, and/or networks. As an example, one or more PLCs can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC can also communicate to and control various other devices such as I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including Device-Net, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 64:
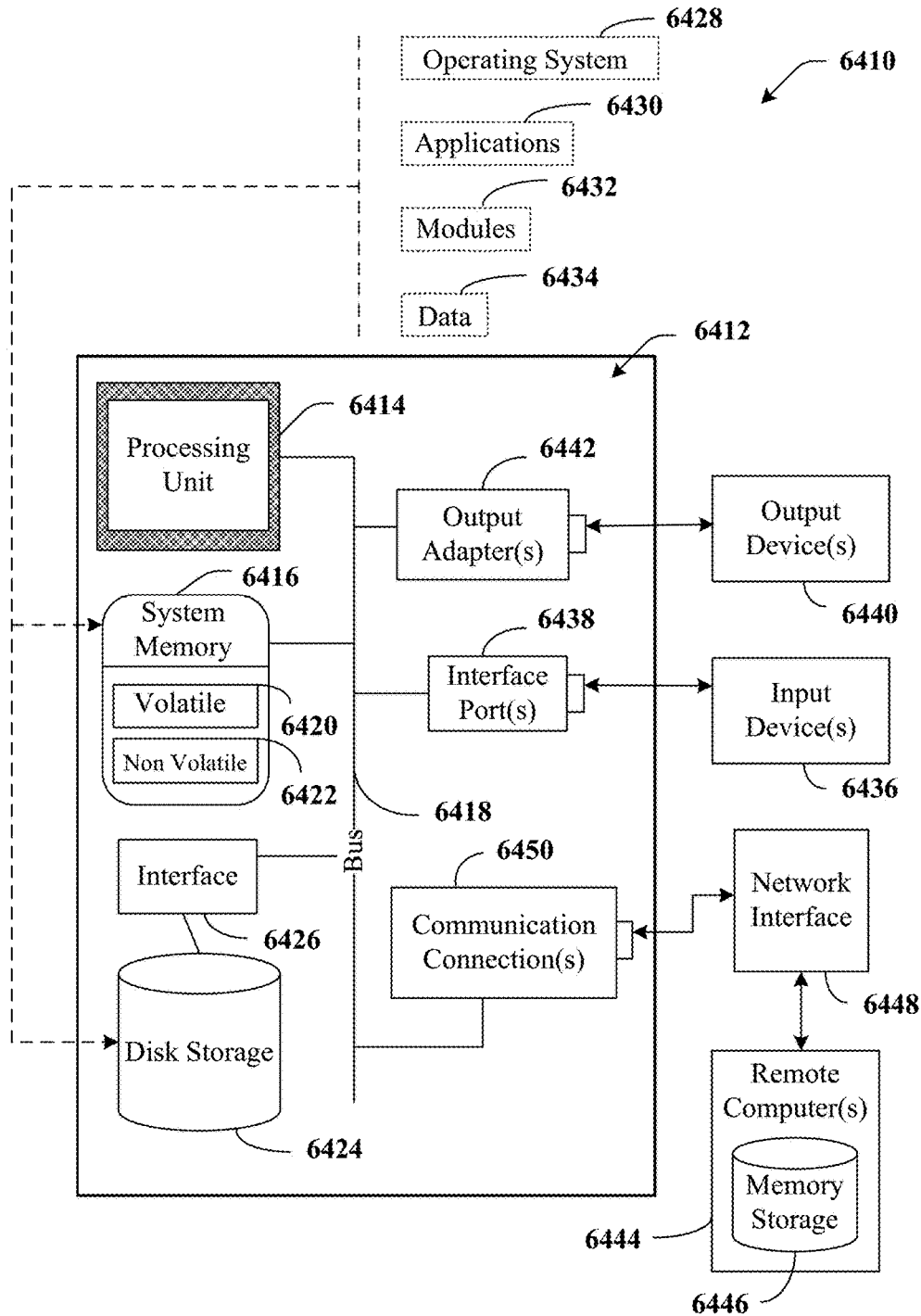
FIG. 64 is an example computing environment.
Figure 65:
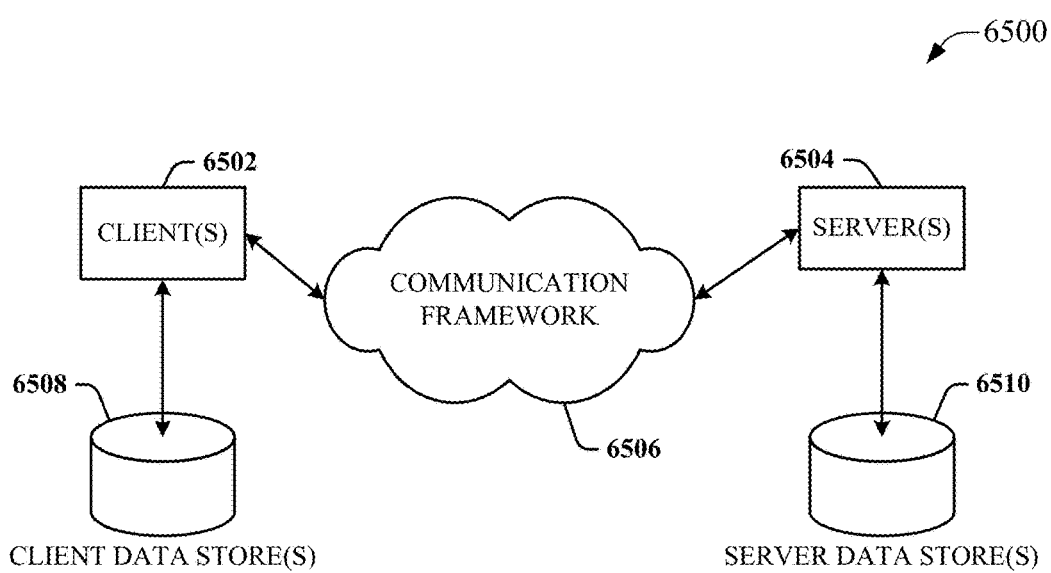
FIG. 65 is an example networking environment.

In order to provide a context for the various aspects of the disclosed subject matter, FIGS. 64 and 65 as well as the following discussion are intended to provide a brief, general description of a suitable environment in which the various aspects of the disclosed subject matter may be implemented.

With reference to FIG. 64, an example environment 6410 for implementing various aspects of the aforementioned subject matter includes a computer 6412. The computer 6412 includes a processing unit 6414, a system memory 6416, and a system bus 6418. The system bus 6418 couples system components including, but not limited to, the system memory 6416 to the processing unit 6414. The processing unit 6414 can be any of various available processors. Dual microprocessors and other multiprocessor architectures also can be employed as the processing unit 6414.

The system bus 6418 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 6416 includes volatile memory 6420 and nonvolatile memory 6422. The basic input/output system (BIOS), containing the basic routines to transfer information between elements within the computer 6412, such as during start-up, is stored in nonvolatile memory 6422. By way of illustration, and not limitation, nonvolatile memory 6422 can include read only memory (ROM), programmable ROM (PROM), electrically programmable ROM (EPROM), electrically erasable PROM (EEPROM), or flash memory. Volatile memory 6420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 6412 also includes removable/non-removable, volatile/nonvolatile computer storage media. FIG. 64 illustrates, for example a disk storage 6424. Disk storage 6424 includes, but is not limited to, devices like a magnetic disk drive, floppy disk drive, tape drive, Jaz drive, Zip drive, LS-100 drive, flash memory card, or memory stick. In addition, disk storage 6424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 6424 to the system bus 6418, a removable or non-removable interface is typically used such as interface 6426.

It is to be appreciated that FIG. 64 describes software that acts as an intermediary between users and the basic computer resources described in suitable operating environment 6410. Such software includes an operating system 6428. Operating system 6428, which can be stored on disk storage 6424, acts to control and allocate resources of the computer 6412. System applications 6430 take advantage of the management of resources by operating system 6428 through program modules 6432 and program data 6434 stored either in system memory 6416 or on disk storage 6424. It is to be appreciated that one or more embodiments of the subject disclosure can be implemented with various operating systems or combinations of operating systems.

A user enters commands or information into the computer 6412 through input device(s) 6436. Input devices 6436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 6414 through the system bus 6418 via interface port(s) 6438. Interface port(s) 6438 include, for example, a serial port, a parallel port, a game port, and a universal serial bus (USB). Output device(s) 6440 use some of the same type of ports as input device(s) 6436. Thus, for example, a USB port may be used to provide input to computer 6412, and to output information from computer 6412 to an output device 6440. Output adapters 6442 are provided to illustrate that there are some output devices 6440 like monitors, speakers, and printers, among other output devices 6440, which require special adapters. The output adapters 6442 include, by way of illustration and not limitation, video and sound cards that provide a means of connection between the output device 6440 and the system bus 6418. It should be noted that other devices and/or systems of devices provide both input and output capabilities such as remote computer(s) 6444.

Computer 6412 can operate in a networked environment using logical connections to one or more remote computers, such as remote computer(s) 6444. The remote computer(s) 6444 can be a personal computer, a server, a router, a network PC, a workstation, a microprocessor based appliance, a peer device or other common network node and the like, and typically includes many or all of the elements described relative to computer 6412. For purposes of brevity, only a memory storage device 6446 is illustrated with remote computer(s) 6444. Remote computer(s) 6444 is logically connected to computer 6412 through a network interface 6448 and then physically connected via communication connection 6450. Network interface 6448 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 6450 refers to the hardware/software employed to connect the network interface 6448 to the system bus 6418. While communication connection 6450 is shown for illustrative clarity inside computer 6412, it can also be external to computer 6412. The hardware/software necessary for connection to the network interface 6448 includes, for exemplary purposes only, internal and external technologies such as, modems including regular telephone grade modems, cable modems and DSL modems, ISDN adapters, and Ethernet cards.

FIG. 65 is a schematic block diagram of a sample-computing environment 6500 with which the disclosed subject matter can interact. The sample-computing environment 6500 includes one or more client(s) 6502. The client(s) 6502 can be hardware and/or software (e.g., threads, processes, computing devices). The sample-computing environment 6500 also includes one or more server(s) 6504. The server(s) 6504 can also be hardware and/or software (e.g., threads, processes, computing devices). The servers 6504 can house threads to perform transformations by employing one or more embodiments as described herein, for example. One possible communication between a client 6502 and servers 6504 can be in the form of a data packet adapted to be transmitted between two or more computer processes. The sample-computing environment 6500 includes a communication framework 6506 that can be employed to facilitate communications between the client(s) 6502 and the server(s) 6504. The client(s) 6502 are operably connected to one or more client data store(s) 6508 that can be employed to store information local to the client(s) 6502. Similarly, the server(s) 6504 are operably connected to one or more server data store(s) 6510 that can be employed to store information local to the servers 6504.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:
1. A system for configuring an industrial safety relay, comprising:
a memory that stores executable components; and
a processor, operatively coupled to the memory, that executes the executable components, the executable components comprising:
a configuration component configured to create a configuration program for a safety relay based on configuration input that adds a safety monitoring function block element to the configuration program, wherein the safety relay monitors an industrial safety system and controls an ability of an industrial system to run based on a status of one or more safety devices of the safety system, and the safety monitoring function block element corresponds to a safety device, of the one or more safety devices, to be monitored via an input terminal of the safety relay and comprises a first graphical parameter setting element that facilitates selection, as part of the configuration input, of a first terminal of the safety relay to be used as a source of a first test pulse conforming to a first test pulse scheme for the input terminal; and
a graphical interface component configured to receive the configuration input and to display the safety monitoring function block element,
wherein
the graphical interface component is further configured to, in response to selection of the first graphical parameter setting element, display a terminal selection window graphic that displays graphical indications of available safety relay terminals of the safety relay,
selection of a first graphical indication, of the graphical indications, corresponding to the first terminal assigns the first test pulse to the first terminal,
the terminal selection window renders a second graphical indication, of the graphical indications, corresponding to a second terminal of the available safety relay terminals as being non-selectable in response to a determination that the second terminal has been assigned to be used as a source of a second test pulse conforming to a second test pulse scheme, and
the executable components further comprise a communication component configured to send the configuration program to the safety relay to facilitate programming of the safety relay, wherein
the programming of the safety relay causes the safety relay to output the first test pulse via the first terminal and to output the second test pulse via the second terminal.

2. The system of claim 1, wherein the configuration component is configured to support at least three test pulse schemes including the first test pulse scheme and the second test pulse scheme.

3. The system of claim 1, wherein the safety monitoring function block element is a first safety monitoring function block element, and the configuration component is further configured to set the first terminal as a default setting for the first test pulse scheme for a second safety monitoring function block element subsequently added to the configuration program based on selection of the first terminal as the source of the first test pulse for the first safety monitoring function block element.

4. The system of claim 1, wherein the configuration component is further configured to, in response to a determination that the safety monitoring function block element corresponds to a safety mat device, set a first unused terminal of the safety relay as a first source of the first test pulse and a second unused terminal of the safety relay as a second source of the second test pulse for the safety monitoring function block element.

5. The system of claim 1, wherein the terminal selection window graphic organizes the graphical indications of the available safety relay terminals into two or more groups corresponding to respective two more terminal categories.

6. The system of claim 5, wherein the two or more terminal categories comprise at least one of embedded safety input terminals, multi-purpose terminal, expansion module input terminals, or networked input terminals.

7. The system of claim 1, wherein
the safety monitoring function block element is a first safety monitoring function block element,
the safety device is a first safety device, and the input terminal is a first input terminal, and
the graphical interface component is further configured to, in response to addition, to the configuration program, of a second safety monitoring function block element corresponding to a second safety device to be monitored via a second input terminal of the safety relay, assign the first terminal to be used as the source of the first test pulse for the second input terminal based on the selection of the first terminal to be used as the source of the first test pulse for the first input terminal.

8. The system of claim 1, wherein the graphical interface component is further configured to, in response to a determination that the safety monitoring function block element corresponds to a safety-rated device, render a first subset of the graphical indications representing non-safety-rated terminals of the available safety relay terminals as being non-selectable on the terminal selection window graphic, and render a second subset of the graphical indications representing safety-rated terminals of the available safety relay terminals selectable on the terminal selection window graphic.

9. A non-transitory computer-readable medium having stored thereon instructions that, in response to execution, cause a system comprising a processor to perform operations, the operations comprising:
receiving first configuration input that associates a safety monitoring function block element with a configuration program for a safety relay device, wherein the safety relay device monitors an industrial safety system and controls an ability of an industrial system to run based on a status of one or more safety devices of the safety system, and the safety monitoring function block element corresponds to a safety device, of the one or more safety devices, to be monitored via an input terminal of the safety relay device;
in response to selection, via interaction with the safety monitoring function block element, of a graphical parameter setting element of the safety monitoring function block element that facilitates selection of a test source terminal to be used as a source of a first test pulse for the input terminal, displaying a terminal selection window graphic that renders graphical indicators representing available safety relay terminals of the safety relay device, wherein the first test pulse conforms to a first test pulse scheme, and the displaying the terminal selection window comprises,
in response to determining that one of the available safety relay terminals of the safety relay device has been assigned to be used as a source of a second test pulse conforming to a second test pulse scheme, rendering one of the graphical indicators corresponding to the one of the available safety relay terminals non-selectable via the terminal selection window graphic;
receiving, via interaction with the terminal selection widow graphic, second configuration input selecting a graphical indicator, of the graphical indicators, representing a safety relay terminal of the available safety relay terminals;
setting the safety relay terminal as the test source terminal for the input terminal based on the second configuration input;
configuring a configuration program for the safety relay device based on the first configuration input and the second configuration input; and
sending the configuration program to the safety relay device to facilitate programming of the safety relay device, wherein the programming of the safety relay device causes the safety relay device to output the first test pulse via the safety relay terminal.

10. The non-transitory computer-readable medium of claim 9, wherein the safety relay device supports at least three test pulse schemes including the first test pulse scheme and the second test pulse scheme.

11. The non-transitory computer-readable medium of claim 9, wherein the operations further comprise:
setting the safety relay terminal as a default setting for the first test pulse scheme for another safety monitoring function block element added to the configuration program based on selection of the safety relay terminal as the test source terminal for the safety monitoring function block element.

12. The non-transitory computer-readable medium of claim 9, further comprising:
in response to determining that the safety monitoring function bock element corresponds to a safety mat device, setting a first unused terminal of the safety relay device and a second unused terminal of the safety relay device as a first source of the first test source pulse scheme and a second source of the second test source pulse scheme, respectively, for the safety monitoring function block element.

13. The non-transitory computer-readable medium of claim 9, wherein the displaying the terminal selection window further comprises:
in response to determining that the safety monitoring function block corresponds to a safety-rated device:
rendering a first subset of the graphical indicators representing non-safety-rated terminals of the available safety relay terminals as being non-selectable on the terminal selection window graphic, and
rendering a second subset of the graphical indicators representing safety-rated terminals of the available safety relay terminals as being selectable on the terminal selection window graphic.

14. A method for configuring an industrial safety relay, comprising:
rendering, by a system comprising at least one processor, a safety monitoring function block representing a safety device of an industrial safety system to be monitored via an input terminal of a safety relay, wherein the safety relay monitors the industrial safety system and controls an ability of an industrial automation system to run based on a status of the safety device, and the safety monitoring function block comprises a graphical parameter setting element that facilitates selection of a test source terminal to be used as a source of a first test pulse for the input terminal, and the first test pulse accords to a first test pulse scheme;
in response to selecting the graphical parameter setting element, displaying, by the system, a terminal selection window graphic that renders graphical icons representing available safety relay terminals of the safety relay, wherein the displaying comprises,
in response to determining that one of the available safety relay terminals of the safety relay has been assigned to be used as a source of a second test pulse according to a second test pulse scheme, rendering one of the graphical icons corresponding to the one of the available safety relay terminals non-selectable on the terminal selection window graphic;
receiving, by the system via interaction with the terminal selection widow graphic, configuration input selecting a graphical icon, of the graphical icons, representing a safety relay terminal of the available safety relay terminals;

assigning, by the system, the safety relay terminal to be the test source terminal based on the configuration input;
generating, by the system, a configuration program for the safety relay based on the configuration input; and
programming, by the system, the safety relay with the configuration program, wherein the programming of the safety relay causes the safety relay to output the first test pulse via the safety relay terminal.

15. The method of claim 14, wherein the safety relay supports three test pulse schemes including the first test pulse scheme and the second test pulse scheme.

16. The method of claim 14, wherein the safety monitoring function block is a first safety monitoring function block, and the method further comprises setting the safety relay terminal as a default setting for the first test pulse scheme for a second safety monitoring function block added to the configuration program based on selection of the safety relay terminal as the source of the first test pulse for the first safety monitoring function block.

17. The method of claim 14, further comprising, in response to determining that the safety monitoring function bock corresponds to a safety mat device, setting a first unused terminal of the safety relay and a second unused terminal of the safety relay as a first source of a first test source pulse scheme and a second source of a second test source pulse scheme, respectively, for the safety monitoring function block.

18. The method of claim 14, wherein the displaying further comprises, in response to determining that the safety monitoring function block represents a safety-rated safety device:
rendering, by the system, a first subset of the graphical icons representing non-safety-rated terminals of the available safety relay terminals as being non-selectable on the terminal selection window graphic, and
rendering, by the system, a second subset of the graphical icons representing safety-rated terminals of the available safety relay terminals as being selectable on the terminal selection window graphic.

19. The method of claim 14, wherein the displaying comprises organizing the graphical icons into two or more groups corresponding to respective two more terminal categories.

20. The method of claim 19, wherein the two or more terminal categories comprise at least one of embedded safety input terminals, multi-purpose terminal, expansion module input terminals, or networked input terminals.

* * * * *